US012646455B2

(12) United States Patent
Guo

(10) Patent No.: US 12,646,455 B2
(45) Date of Patent: Jun. 2, 2026

(54) PIXEL DRIVING CIRCUIT, ARRAY SUBSTRATE, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventor: Yonglin Guo, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 97 days.

(21) Appl. No.: 18/264,060

(22) PCT Filed: Oct. 13, 2022

(86) PCT No.: PCT/CN2022/125006
§ 371 (c)(1),
(2) Date: Aug. 2, 2023

(87) PCT Pub. No.: WO2024/077536
PCT Pub. Date: Apr. 18, 2024

(65) Prior Publication Data
US 2025/0316225 A1 Oct. 9, 2025

(51) Int. Cl.
*G09G 3/32* (2016.01)
*G09G 3/3233* (2016.01)
*H10D 86/40* (2025.01)
*H10D 86/60* (2025.01)

(52) U.S. Cl.
CPC ......... *G09G 3/3233* (2013.01); *H10D 86/441* (2025.01); *H10D 86/481* (2025.01); *G09G 2300/0426* (2013.01); *G09G 2300/0819* (2013.01); *G09G 2300/0842* (2013.01); *G09G 2300/0861* (2013.01); *G09G 2310/08* (2013.01); *H10D 86/60* (2025.01)

(58) Field of Classification Search
CPC ... G09G 2300/0426; G09G 2300/0819; G09G 2300/0842; G09G 2300/0861; G09G 2310/0251; G09G 2310/08; G09G 2320/0233; G09G 2320/041; G09G 2320/045; G09G 3/3233; G09G 3/3258
See application file for complete search history.

(56) References Cited

U.S. PATENT DOCUMENTS

| | | | | |
|---|---|---|---|---|
| 11,348,533 B1 * | 5/2022 | Ono | | G09G 3/3266 |
| 2019/0295467 A1 * | 9/2019 | Lu | | G09G 3/3291 |
| 2019/0304361 A1 * | 10/2019 | Lu | | H10K 59/1216 |

* cited by examiner

*Primary Examiner* — Insa Sadio
(74) *Attorney, Agent, or Firm* — Intellectual Valley Law, P.C.

(57) ABSTRACT

A pixel driving circuit is provided. The pixel driving circuit includes a driving transistor, a storage capacitor; and at least one auxiliary transistor having a gate electrode, a first electrode, and a second electrode. The gate electrode of the at least one auxiliary transistor is configured to receive a gate driving signal turning on the at least one auxiliary transistor during at least a light emitting sub-phase of a frame of image to allow a voltage signal to pass from the first electrode to the second electrode of the at least one auxiliary transistor.

19 Claims, 63 Drawing Sheets rstN

GL em rst(N+1)

Vint1N rstN_B1

GL_N_B1 rst(N+1)_B1 rstN_B2

GL_N_B2 rst(N+1)_B2 rstN_B2

GL_N_B2 rst(N+1)_B2

Vint2N

DL          Vdd

PIXEL DRIVING CIRCUIT, ARRAY SUBSTRATE, AND DISPLAY APPARATUS

CROSS-REFERENCE TO RELATED APPLICATION

This application is a national stage application under 35 U.S.C. § 371 of International Application No. PCT/CN2022/125006, filed Oct. 13, 2022, the contents of which are incorporated by reference in the entirety.

TECHNICAL FIELD

The present invention relates to display technology, more particularly, to a pixel driving circuit, an array substrate, and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a pixel driving circuit, comprising a driving transistor; a storage capacitor; and at least one auxiliary transistor having a gate electrode, a first electrode, and a second electrode; wherein the gate electrode of the at least one auxiliary transistor is configured to receive a gate driving signal turning on the at least one auxiliary transistor during at least a light emitting sub-phase of a frame of image to allow a voltage signal to pass from the first electrode to the second electrode of the at least one auxiliary transistor.

Optionally, the gate electrode of the at least one auxiliary transistor is coupled to a gate electrode of the driving transistor and a first capacitor electrode of the storage capacitor.

Optionally, the at least one auxiliary transistor comprises a first auxiliary transistor having a first electrode configured to receive a first voltage signal during at least the light emitting sub-phase of the frame of image.

Optionally, the first electrode of the first auxiliary transistor is coupled to a first voltage signal line configured to provide the first voltage signal during at least the light emitting sub-phase of the frame of image.

Optionally, the first electrode of the first auxiliary transistor is coupled to a respective gate line of a plurality of gate lines.

Optionally, the at least one auxiliary transistor further comprises a second auxiliary transistor having a first electrode configured to receive a second voltage signal during at least the light emitting sub-phase of the frame of image.

Optionally, the first electrode of the second auxiliary transistor is coupled to a second voltage signal line configured to provide the second voltage signal during at least the light emitting sub-phase of the frame of image.

Optionally, the first electrode of the second auxiliary transistor is coupled to a light emitting control signal line of a plurality of light emitting control signal lines.

Optionally, one of the first voltage signal and the second voltage signal is a high voltage signal, and the other of the first voltage signal and the second voltage signal is a low voltage signal.

Optionally, the pixel driving circuit further comprises a first transistor having a gate electrode configured to receive a reset control signal, a first electrode configured to receive a reset signal, and a second electrode connected to a first capacitor electrode of the storage capacitor and a gate electrode of the driving transistor; a second transistor having a gate electrode connected to a respective gate line of a plurality of gate lines, a first electrode connected to a respective data line of a plurality of data lines, and a second electrode connected to a first electrode of the driving transistor; a third transistor having a gate electrode connected to the respective gate line, a first electrode connected to the first capacitor electrode of the storage capacitor and the gate electrode of the driving transistor, and a second electrode connected to a second electrode of the driving transistor; a fourth transistor having a gate electrode connected to a respective light emitting control signal line of a plurality of light emitting control signal lines, a first electrode connected to a respective voltage supply line of a plurality of voltage supply lines, and a second electrode connected to the first electrode of the driving transistor and the second electrode of the second transistor; a fifth transistor having a gate electrode connected to the respective light emitting control signal line, a first electrode connected to second electrodes of the driving transistor and the third transistor, and a second electrode connected to an anode of a light emitting element; and a sixth transistor having a gate electrode configured to receive a reset control signal, a first electrode configured to receive a reset signal, and a second electrode connected to the second electrode of the fifth transistor and the anode of the light emitting element.

In another aspect, the present disclosure provides an array substrate, comprising the pixel driving circuit described herein, and a light emitting element connected to the pixel driving circuit.

Optionally, the at least one auxiliary transistor comprises a first auxiliary transistor; wherein an orthographic projection of a first capacitor electrode of the storage capacitor on a base substrate at least partially overlaps with an orthographic projection of a second electrode of the first auxiliary transistor on the base substrate.

Optionally, the at least one auxiliary transistor comprises a first auxiliary transistor; and an orthographic projection of a first capacitor electrode of the storage capacitor on a base substrate at least partially overlaps with an orthographic projection of an active layer of the first auxiliary transistor on the base substrate.

Optionally, the at least one auxiliary transistor comprises a first auxiliary transistor; and an orthographic projection of a first capacitor electrode of the storage capacitor on a base substrate at least partially overlaps with an orthographic projection of an active layer of the driving transistor on the base substrate and at least partially overlaps with an orthographic projection of a second electrode of the first auxiliary transistor on the base substrate.

Optionally, the at least one auxiliary transistor comprises a second auxiliary transistor; and an orthographic projection of a first capacitor electrode of the storage capacitor on a base substrate at least partially overlaps with an orthographic projection of a second electrode of the second auxiliary transistor on the base substrate.

Optionally, the at least one auxiliary transistor comprises a second auxiliary transistor; and an orthographic projection of a first capacitor electrode of the storage capacitor on a base substrate at least partially overlaps with an orthographic projection of an active layer of the second auxiliary transistor on the base substrate.

Optionally, the at least one auxiliary transistor comprises a second auxiliary transistor; and an orthographic projection of a first capacitor electrode of the storage capacitor on a base substrate at least partially overlaps with an orthographic projection of an active layer of the driving transistor on the base substrate and at least partially overlaps with an orthographic projection of a second electrode of the second auxiliary transistor on the base substrate.

Optionally, the array substrate further comprises a plurality of gate lines and a first connecting line in a layer different from a layer comprising the plurality of gate lines; wherein the at least one auxiliary transistor comprises a first auxiliary transistor; a respective gate line of the plurality of gate lines comprises a first main portion extending along an extension direction of the respective gate line, and a first connecting pad protruding away from the first main portion; and the first connecting line is connected to the first connecting pad through a ninth via, and connected to a first electrode of the first auxiliary transistor through a tenth via.

Optionally, the array substrate further comprises a plurality of light emitting control signal lines and a second connecting line in a layer different from a layer comprising the plurality of light emitting control signal lines; wherein the at least one auxiliary transistor comprises a second auxiliary transistor; a respective light emitting control signal line of a plurality of light emitting control signal lines comprises a second main portion extending along an extension direction of the respective light emitting control signal line, and a second connecting pad protruding away from the second main portion; and the second connecting line is connected to the second connecting pad through an eleventh via, and connected to a first electrode of the second auxiliary transistor through a twelfth via.

In another aspect, the present disclosure provides a display apparatus, comprising the array substrate described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a pixel driving circuit, an array substrate, and a display apparatus that substantially obviate one or more of the problems due to limitations and disadvantages of the related art. In one aspect, the present disclosure provides a pixel driving circuit. In some embodiments, the pixel driving circuit includes a driving transistor; a storage capacitor; and at least one auxiliary transistor having a gate electrode, a first electrode, and a second electrode. Optionally, the gate electrode of the at least one auxiliary transistor is configured to receive a gate driving signal turning on the at least one auxiliary transistor during at least a light emitting sub-phase of a frame of image to allow a voltage signal to pass from the first electrode to the second electrode of the at least one auxiliary transistor.

Figure 1:
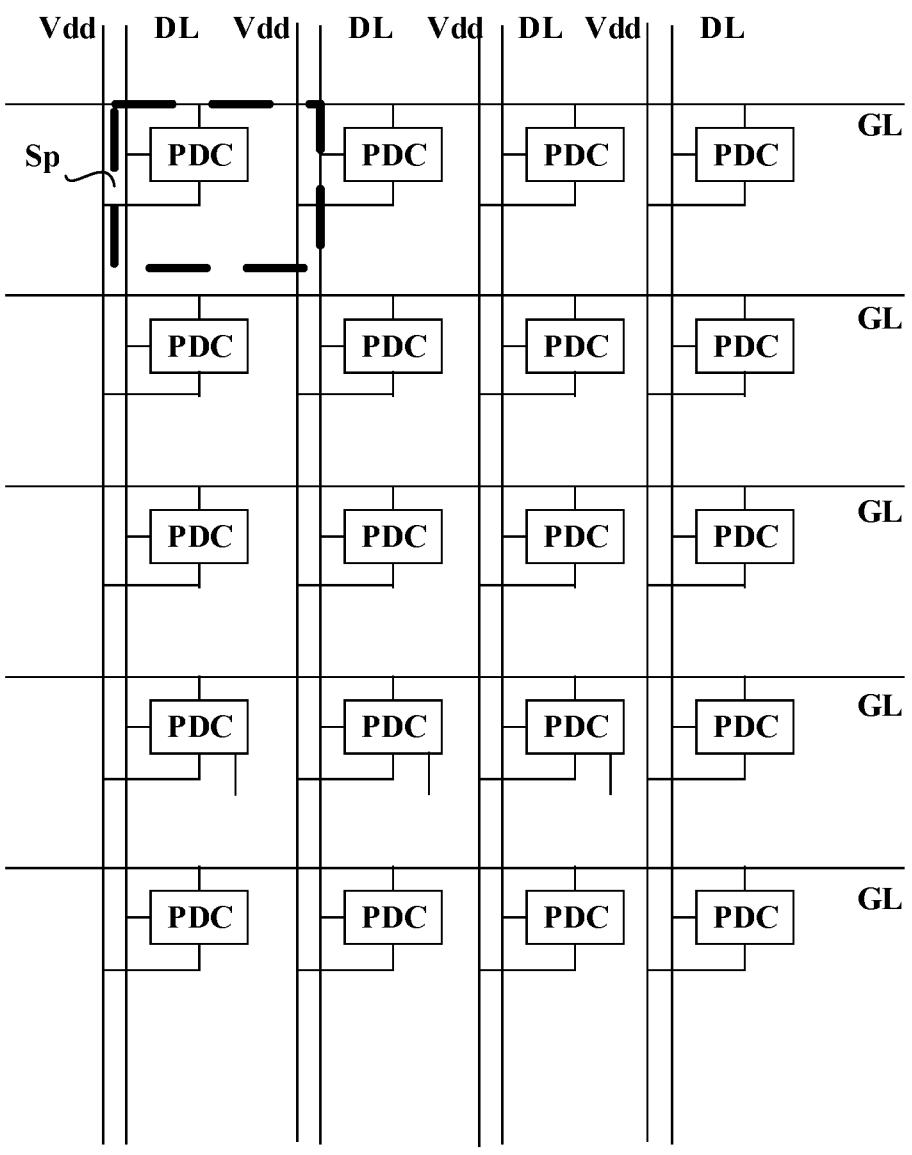
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of voltage supply lines Vdd. Light emission in a respective subpixel is driven by a respective pixel driving circuit PDC. In one example, a high voltage signal is input, through a respective one of the plurality of voltage supply lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The present disclosure may be implemented with various appropriate pixel driving circuits. Examples of appropriate driving circuits include 3T1C, 2T1C, 4T1C, 4T2C, 5T2C, 6T1C, 7T1C, 7T2C, 8T1C, and 8T2C. In some embodiments, the pixel driving circuit is a 9T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is an R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes a first transistor T1, a second transistor T2, a third transistor T3, a fourth transistor T4, a fifth transistor T5, a sixth transistor T6, a first auxiliary transistor T7, a second auxiliary transistor T8, and a driving transistor Td.

Figure 2A:
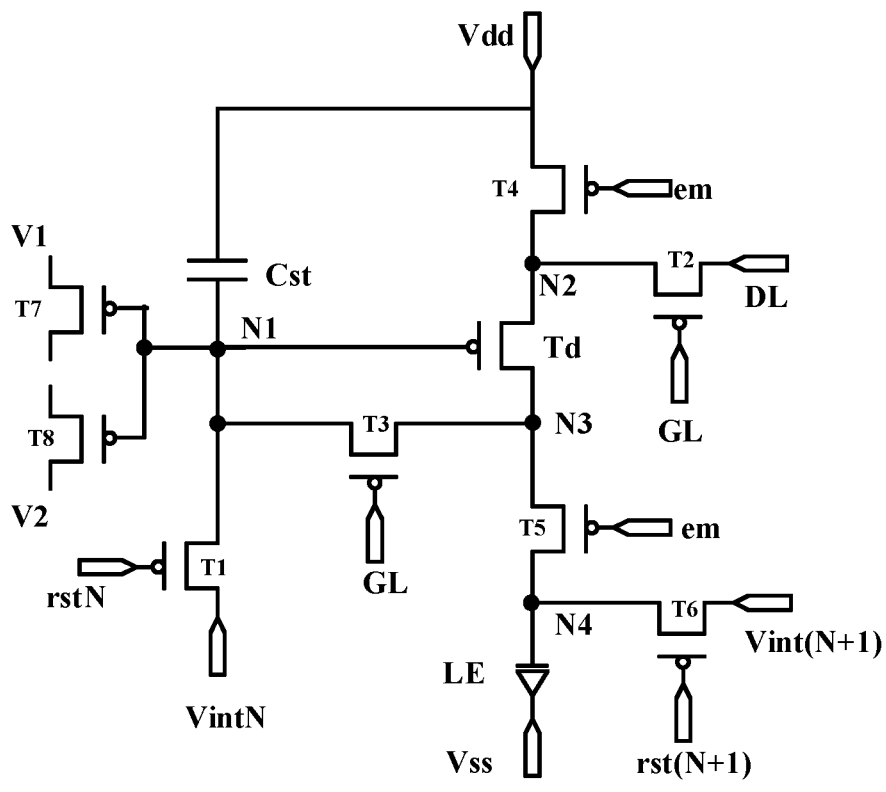
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the respective pixel driving circuit includes a driving transistor Td; a storage capacitor Cst having a first capacitor electrode Ce1 and a second capacitor electrode Ce2; at least one auxiliary transistor configured to protect a channel part of an active layer of the driving transistor Td. In some embodiments, an orthographic projection of the first capacitor electrode Ce1 on a base substrate at least partially overlaps with an orthographic projection of a second electrode of the at least one auxiliary transistor on a base substrate. In some embodiments, the orthographic projection of the first capacitor electrode Ce1 on a base substrate at least partially overlaps with an orthographic projection of an active layer of the driving transistor Td on the base substrate. In some embodiments, an orthographic projection of the first capacitor electrode Ce1 on a base substrate at least partially overlaps with an orthographic projection of a second electrode of the at least one auxiliary transistor on a base substrate, and overlaps with an orthographic projection of an active layer of the driving transistor Td on a base substrate. In some embodiments, an orthographic projection of the first capacitor electrode Ce1 on a base substrate at least partially overlaps with an orthographic projection of an active layer of the at least one auxiliary transistor on a base substrate, and overlaps with an orthographic projection of an active layer of the driving transistor Td on a base substrate. Optionally, an orthographic projection of the first capacitor electrode Ce1 on a base substrate overlaps with an orthographic projection of an active layer of the at least one auxiliary transistor on a base substrate, and overlaps with an orthographic projection of an active layer of the driving transistor Td on a base substrate. Optionally, a gate electrode of the at least one auxiliary transistor is coupled to a gate electrode of the driving transistor Td. Optionally, the active layer of the at least one auxiliary transistor and the active layer of the driving transistor Td are in a same layer.

In some embodiments, the respective pixel driving circuit includes a first auxiliary transistor T7. A gate electrode of the first auxiliary transistor T7 is coupled to the gate electrode of the driving transistor Td. Optionally, at least a portion of the first capacitor electrode Ce1 is the gate electrode of the first auxiliary transistor T7, and at least another portion of the first capacitor electrode Ce1 is the gate electrode of the driving transistor Td. A first electrode of the first auxiliary transistor T7 is coupled to a first voltage signal line V1. Optionally, a second electrode of the first auxiliary transistor T7 is floating. In one example, the first voltage signal line V1 is configured to provide a first level voltage signal (e.g., a low level voltage signal) during at least a light emitting sub-phase of one frame of image. In another example, the first voltage signal line V1 is configured to provide a second level voltage signal (e.g., a high level voltage signal) during at least a light emitting sub-phase of one frame of image.

In some embodiments, an orthographic projection of the first capacitor electrode Ce1 on a base substrate at least partially overlaps with an orthographic projection of a second electrode of the first auxiliary transistor T7 on a base substrate, and overlaps with an orthographic projection of an active layer of the driving transistor Td on a base substrate. In some embodiments, an orthographic projection of the first capacitor electrode Ce1 on a base substrate at least partially overlaps with an orthographic projection of an active layer of the first auxiliary transistor T7 on a base substrate, and overlaps with an orthographic projection of an active layer of the driving transistor Td on a base substrate. In one example, the gate electrode of the first auxiliary transistor T7 is coupled to the gate electrode of the driving transistor Td and/or the first capacitor electrode Ce1. In another example, the gate electrode of the first auxiliary transistor T7 is independently provided, for example, the gate electrode of the first auxiliary transistor T7 is electrically separated from the gate electrode of the driving transistor Td and/or the first capacitor electrode Ce1.

In some embodiments, the respective pixel driving circuit includes a second auxiliary transistor T8. A gate electrode of the second auxiliary transistor T8 is coupled to the gate electrode of the driving transistor Td. Optionally, at least a portion of the first capacitor electrode Ce1 is the gate electrode of the second auxiliary transistor T8, and at least another portion of the first capacitor electrode Ce1 is the gate electrode of the driving transistor Td. A first electrode of the second auxiliary transistor T8 is coupled to a second voltage signal line V2. Optionally, a second electrode of the second auxiliary transistor T8 is floating. In one example, the second voltage signal line V2 is configured to provide a second level voltage signal (e.g., a high level voltage signal) during at least a light emitting sub-phase of one frame of image. In one example, the second voltage signal line V2 is configured to provide a first level voltage signal (e.g., a low level voltage signal) during at least a light emitting sub-phase of one frame of image.

In some embodiments, an orthographic projection of the first capacitor electrode Ce1 on a base substrate at least partially overlaps with an orthographic projection of a second electrode of the second auxiliary transistor T8 on a base substrate, and overlaps with an orthographic projection of an active layer of the driving transistor Td on a base substrate. In some embodiments, an orthographic projection of the first capacitor electrode Ce1 on a base substrate at least partially overlaps with an orthographic projection of an active layer of the second auxiliary transistor T8 on a base substrate, and overlaps with an orthographic projection of an active layer of the driving transistor Td on a base substrate. In one example, the gate electrode of the second auxiliary transistor T8 is coupled to the gate electrode of the driving transistor Td and/or the first capacitor electrode Ce1. In another example, the gate electrode of the second auxiliary transistor T8 is independently provided, for example, the gate electrode of the second auxiliary transistor T8 is electrically separated from the gate electrode of the driving transistor Td and/or the first capacitor electrode Ce1.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. FIG. 2A illustrates an example in which the transistors are p-type transistors. However, the present disclosure may be implemented in pixel driving circuit having transistors of n-type transistors.

In one example, a transistor is an n-type transistor. A gate-on voltage of the n-type transistor may be set to a high level, and a gate-off voltage of the n-type transistor may be set to a low level.

In another example, a transistor is a p-type transistor. A gate-on voltage of the p-type transistor may be set to a low level, and a gate-off voltage of the p-type transistor may be set to a high level.

Referring to FIG. 2A, the respective pixel driving circuit in some embodiments further includes a first transistor T1 having a gate electrode connected to a respective reset control signal line rstN of a present stage (or a present row) of a plurality of reset control signal lines, a first electrode connected to a respective reset signal line VintN of a present stage (or a present row) of a plurality of reset signal lines, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to a respective reset control signal line rst(N+1) of a next adjacent stage (or a next adjacent row) of a plurality of reset control signal lines, a first electrode connected to a respective reset signal line Vint(N+1) of a next adjacent stage (or a next adjacent row) of a plurality of reset signal lines, and a second electrode connected to the second electrode of the fifth transistor and the anode of the light emitting element LE. The second capacitor electrode Ce2 is connected to the respective voltage supply line and the first electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6, and the anode of the light emitting element LE.

Figure 2B:
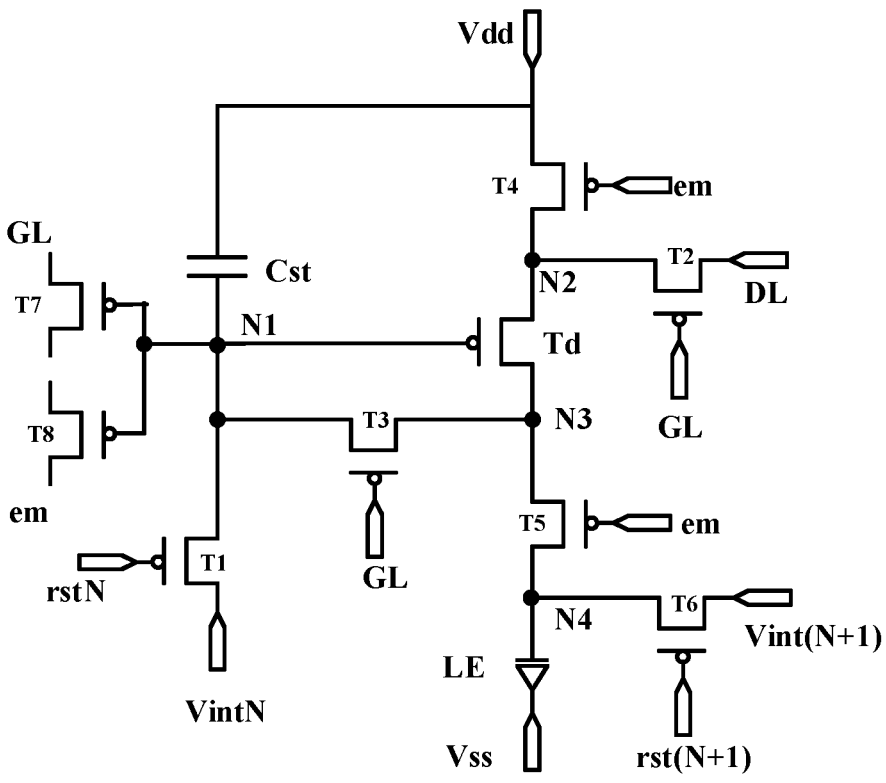
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the first voltage signal line is a respective gate line of a plurality of gate lines GL, and the second voltage signal line is a respective light emitting control signal line of a plurality of light emitting control signal lines em. During at least a light emitting sub-phase of one frame of image, the respective gate line is configured to provide a first level voltage signal (e.g., a low level voltage signal), and the respective light emitting control signal line is configured to provide a second level voltage signal (e.g., a high level voltage signal).

The present disclosure may be implemented with various appropriate first voltage signal lines and second voltage signal lines. In another example, the first voltage signal line is a first reference voltage signal line configured to provide a first reference voltage signal having a first level (e.g., a low level), and the second voltage signal line is a second reference voltage signal line configured to provide a second reference voltage signal having a second level (e.g., a high level).

The inventors of the present disclosure discover that one of the reasons for the occurrence of hysteresis of the driving transistor is the effect of electric charges accumulated in the base substrate (e.g., a polyimide base substrate) on a channel part of the driving transistor. For example, during coating and/or drying process of fabricating the polyimide base substrate, electric charges may be introduced. Moreover, electric charges may be introduced in subsequent fabrication processes such as deposition processes of one or more inorganic material layers, and/or one or more metallic material layers, which are typically performed under a plasma environment. These electric charges accumulate on the polyimide base substrate. The inventors of the present disclosure discover that, surprisingly and unexpectedly, having at least one auxiliary transistor according to the present disclosure can effectively protect the channel part of the driving transistor against the electric charges from the base substrate, thereby reducing hysteresis effects. In one example, the at least one auxiliary transistor includes a first auxiliary transistor for neutralizing positive charges from the base substrate, the first voltage signal line is configured to provide a low voltage signal during at least a light emitting sub-phase of one frame of image. In another example, the at least one auxiliary transistor includes a second auxiliary transistor for neutralizing negative charges from the base substrate, the second voltage signal line is configured to provide a high voltage signal during at least a light emitting sub-phase of one frame of image.

In another example, the at least one auxiliary transistor includes a first auxiliary transistor and a second auxiliary transistor; wherein the first auxiliary transistor is configured to neutralize positive charges from the base substrate, the first voltage signal line is configured to provide a low voltage signal during at least a light emitting sub-phase of one frame of image; the second auxiliary transistor is configured to neutralize negative charges from the base substrate, the second voltage signal line is configured to provide a high voltage signal during at least a light emitting sub-phase of one frame of image. The inventors of the present disclosure discover that a synergistic effect can be achieved by having both the first auxiliary transistor and the second auxiliary transistor, unexpectedly reducing, or eliminating the hysteresis of the driving transistor to a minimum.

Figure 2C:
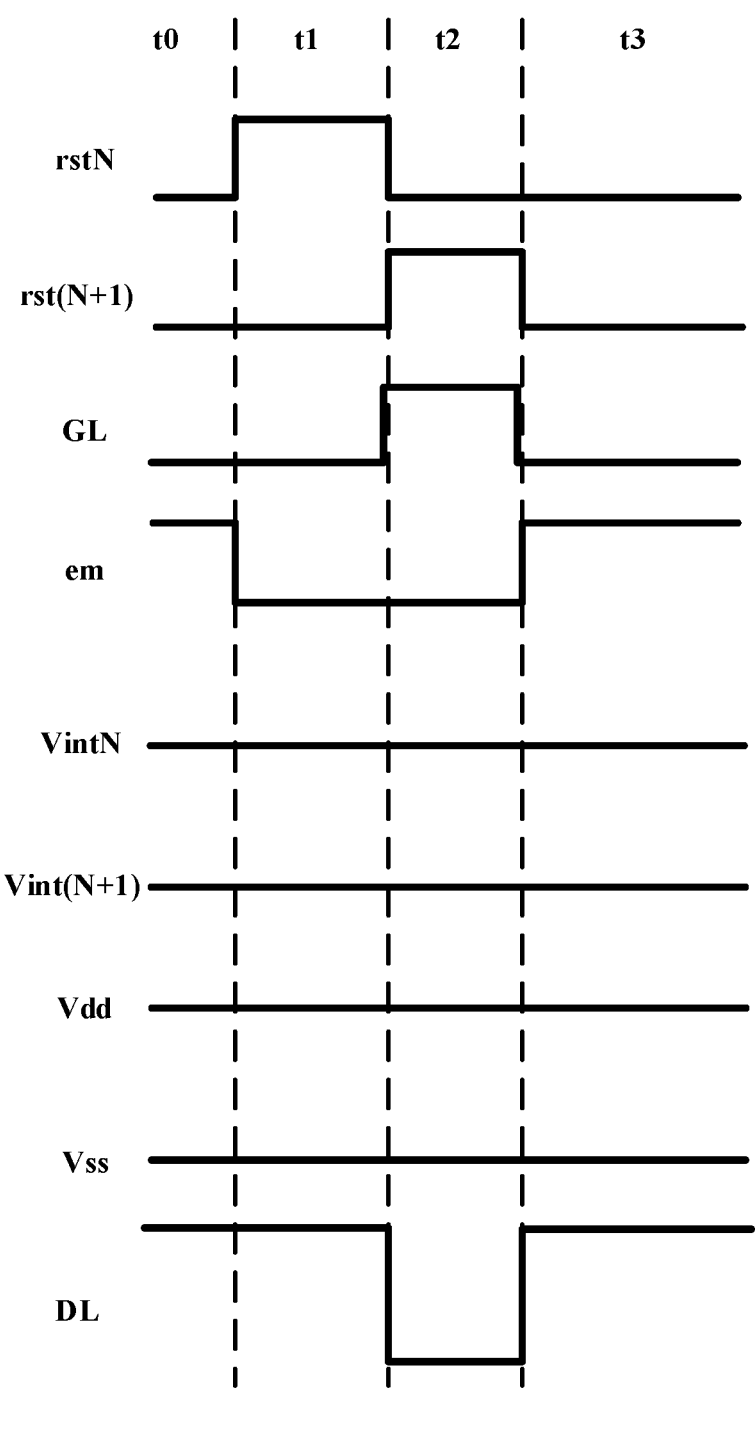
FIG. 2C is a timing diagram illustrating the operation of a pixel driving circuit in some embodiments according to the present disclosure.

FIG. 2C is a timing diagram illustrating the operation of a pixel driving circuit in some embodiments according to the present disclosure. Referring to FIG. 2A, FIG. 2B, and FIG. 2C, during one frame of image, the operation of the pixel driving circuit includes an initial sub-phase t0, a reset sub-phase t1, a data write sub-phase t2, and a light emitting sub-phase t3. In the initial sub-phase t0, a turning-off reset control signal is provided through the respective reset control signal line rstN of a present stage (or a present row) of a plurality of reset control signal lines to the gate electrode of the first transistor T1 to turn off the first transistor T1. In the initial sub-phase t0, the respective gate line of a plurality of gate lines GL is provided with a turning-off signal, thus the second transistor T2 and the third transistor T3 are turned off.

In the reset sub-phase t1, a turning-on reset control signal is provided through the reset control signal line of the present stage rstN to the gate electrode of the first transistor T1 to turn on the first transistor T1; allowing an initialization voltage signal from the respective reset signal line VintN of a present stage (or a present row) of a plurality of reset signal lines to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line of the plurality of voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a low voltage signal to turn off the fourth transistor T4 and the fifth transistor T5.

In the data write sub-phase t2, the turning-off reset control signal is again provided through the reset control signal line of the present stage rstN to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 gradually change to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a low voltage signal to turn off the fourth transistor T4 and the fifth transistor T5.

In the data write sub-phase t2, a turning-on reset control signal is provided through the respective reset control signal line rst(N+1) of a next adjacent stage (or a next adjacent row) of a plurality of reset control signal lines to the gate electrode of the sixth transistor T6 to turn on the sixth transistor T6; allowing an initialization voltage signal from the respective second reset signal line of a next adjacent stage Vint(N+1) to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the reset control signal line of a present stage rstN to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a high voltage signal to turn on the fourth transistor T4 and the fifth transistor T5.

The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

In the light emitting sub-phase t3, the respective gate line of a plurality of gate lines GL is provided with a low voltage signal, and the respective light emitting control signal line of the plurality of light emitting control signal lines em is provided with a high voltage signal. The first electrode of the first auxiliary transistor T7 is provided with a low voltage signal, the first electrode of the second auxiliary transistor T8 is provided with a high voltage signal. During the light emitting sub-phase t3, the first electrode of the first auxiliary transistor T7 and the first electrode of the second auxiliary transistor T8 are turned on by a voltage signal at the N1 node. The low voltage signal passes from the first electrode of the first auxiliary transistor T7 to the second electrode of the first auxiliary transistor T7, thereby neutralizing positive charges that may adversely affect the channel part of the driving transistor Td. The high voltage signal passes from the first electrode of the second auxiliary transistor T8 to the second electrode of the second auxiliary transistor T8, thereby neutralizing negative charges that may adversely affect the channel part of the driving transistor Td.

Figure 2D:
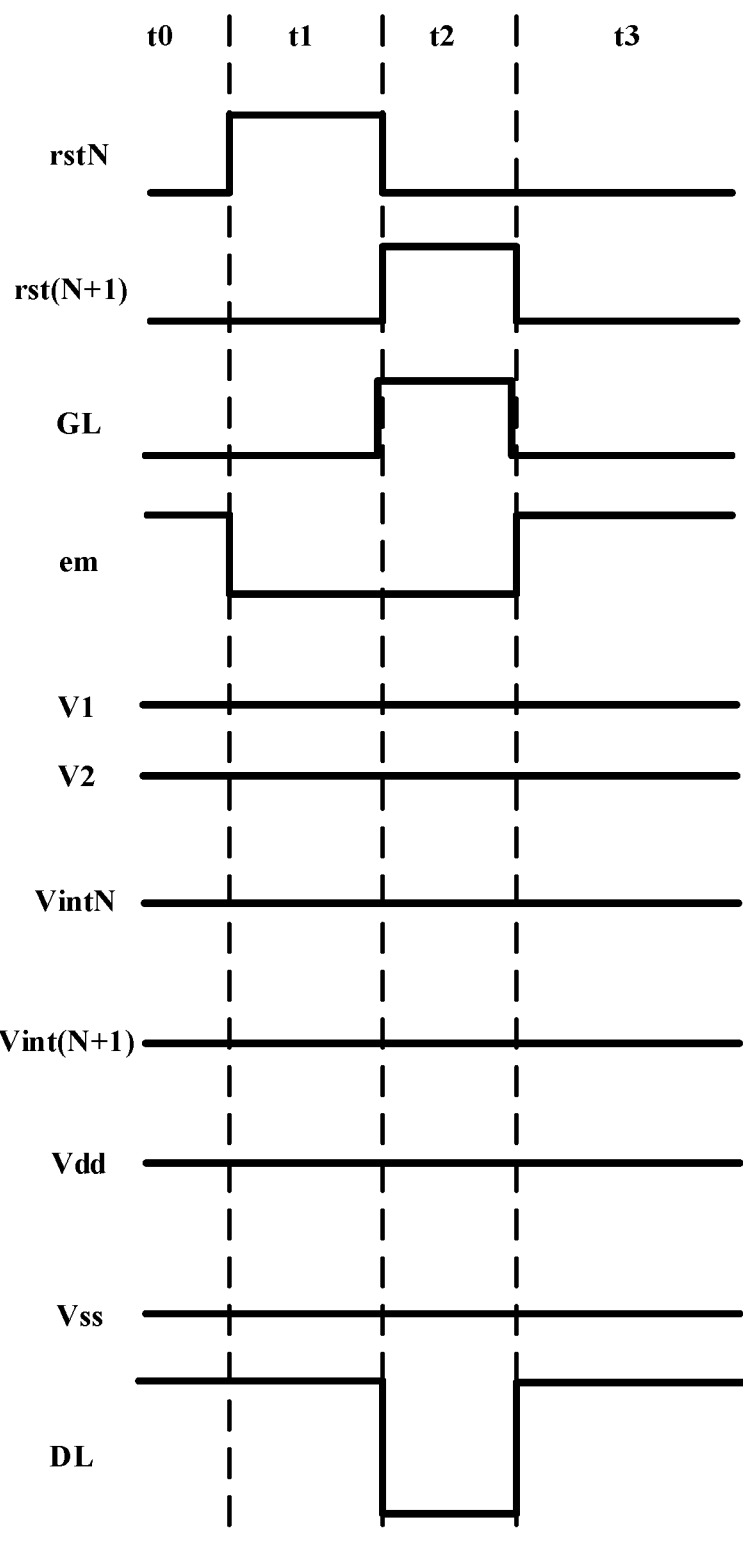
FIG. 2D is a timing diagram illustrating the operation of a pixel driving circuit in some embodiments according to the present disclosure.

FIG. 2D is a timing diagram illustrating the operation of a pixel driving circuit in some embodiments according to the present disclosure. Referring to FIG. 2A and FIG. 2D, in some embodiments, the first voltage signal line V1 is independent of the respective gate line of the plurality of gate lines GL, and the second voltage signal line V2 is independent of the respective light emitting control signal line of the plurality of light emitting control signal lines em. In one example as depicted in FIG. 2D, the first voltage signal line V1 is configured to provide a low voltage signal in at least the light emitting sub-phase t3, and the second voltage signal line V2 is configured to provide a high voltage signal in at least the light emitting sub-phase t3.

Figure 2E:
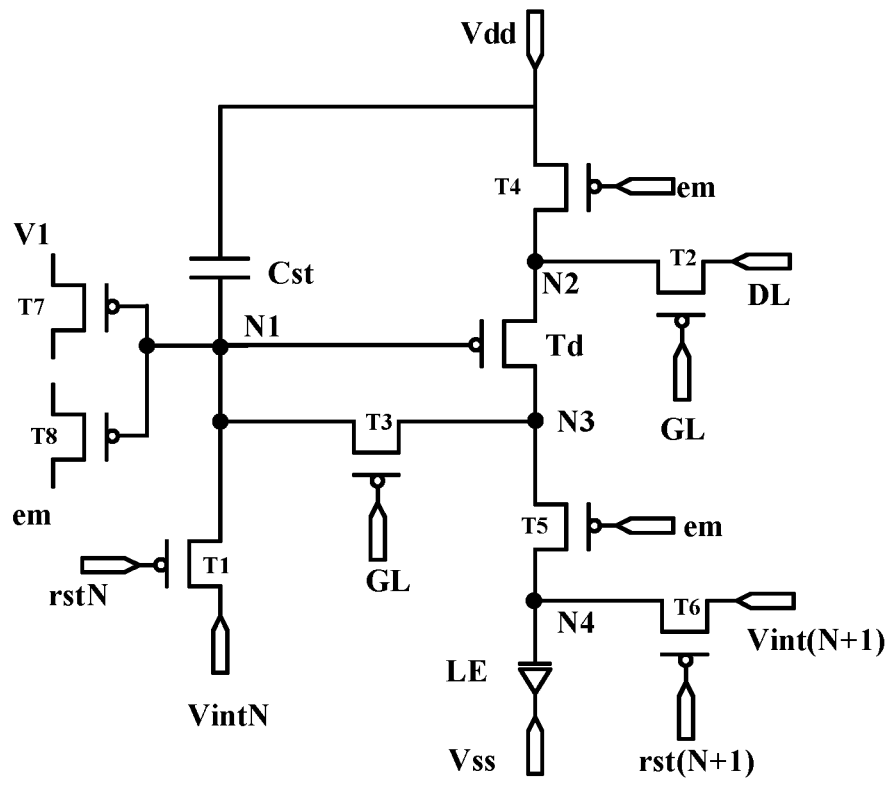
FIG. 2E is a circuit diagram illustrating the structure of a pixel driving circuit in some embodiments according to the present disclosure.

Various appropriate combinations and permutations of embodiments may be implemented. FIG. 2E is a circuit diagram illustrating the structure of a pixel driving circuit in some embodiments according to the present disclosure. Referring to FIG. 2E, in some embodiments, the first electrode of the first auxiliary transistor T7 is coupled to a first voltage signal line V1, and the first electrode of the second auxiliary transistor T8 is coupled to a respective light emitting control signal line of a plurality of light emitting control signal lines em. The first voltage signal line V1 is independent of the respective gate line of the plurality of gate lines GL.

Figure 2F:
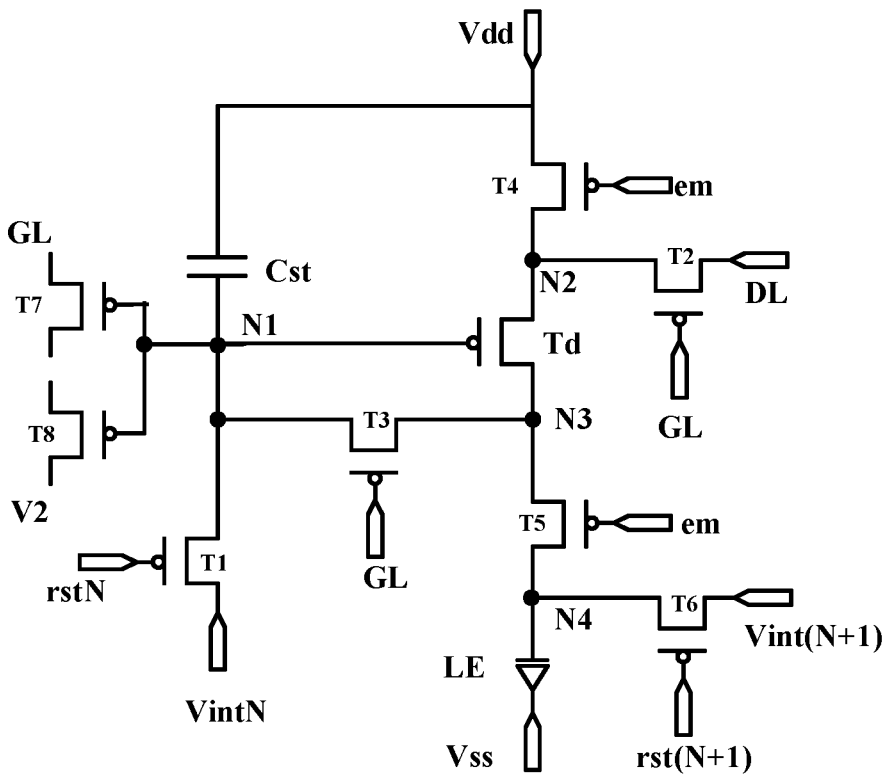
FIG. 2F is a circuit diagram illustrating the structure of a pixel driving circuit in some embodiments according to the present disclosure.

FIG. 2F is a circuit diagram illustrating the structure of a pixel driving circuit in some embodiments according to the present disclosure. Referring to FIG. 2F, in some embodiments, the first electrode of the first auxiliary transistor T7 is coupled to a respective gate line of the plurality of gate lines GL, and the first electrode of the second auxiliary transistor T8 is coupled to a second voltage signal line V2. The second voltage signal line V2 is independent of the respective light emitting control signal line of the plurality of light emitting control signal lines em.

Figure 3A:
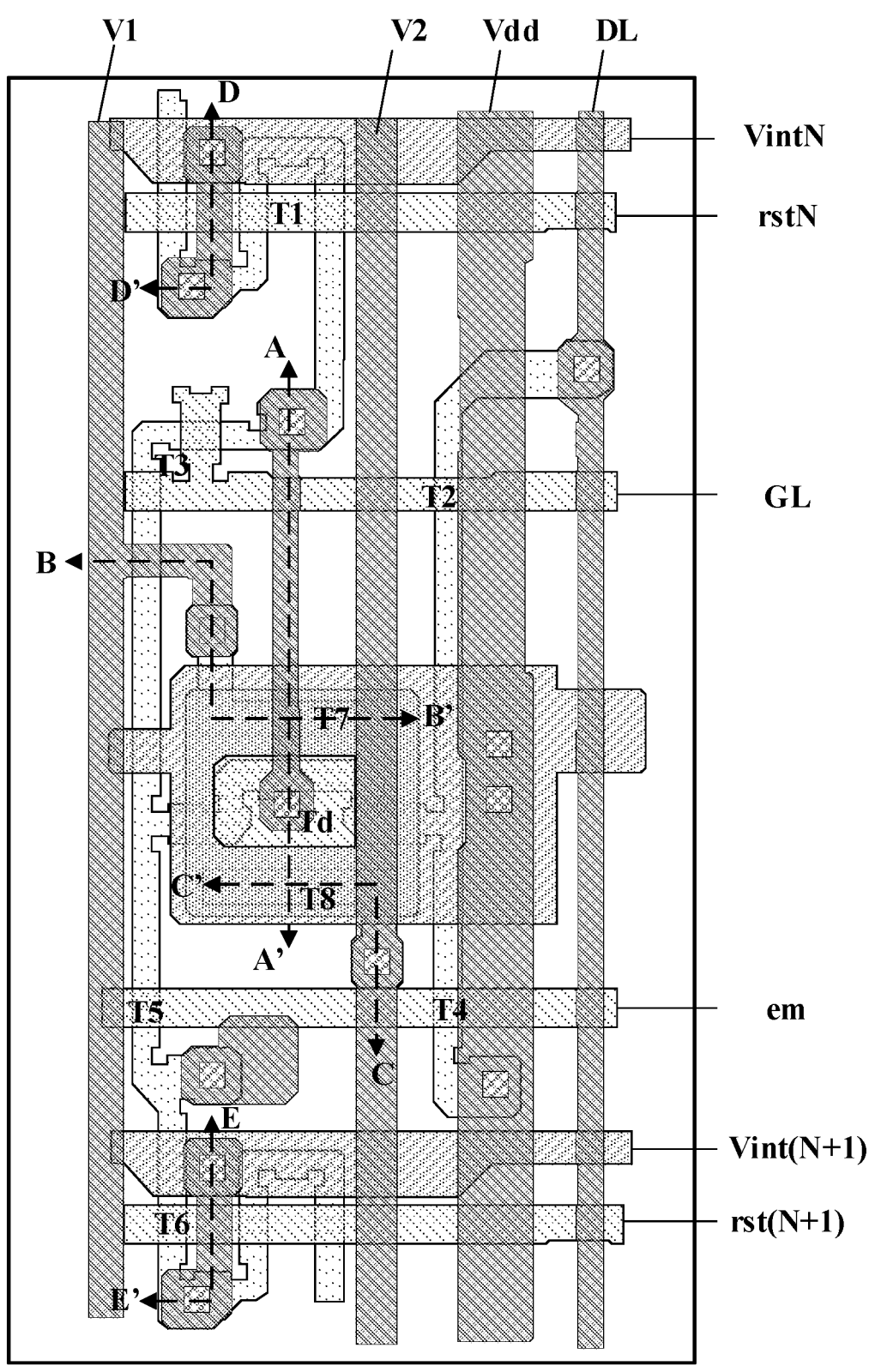
FIG. 3A is a diagram illustrating the structure of an array substrate in some embodiments according to the present disclosure.
Figure 3B:
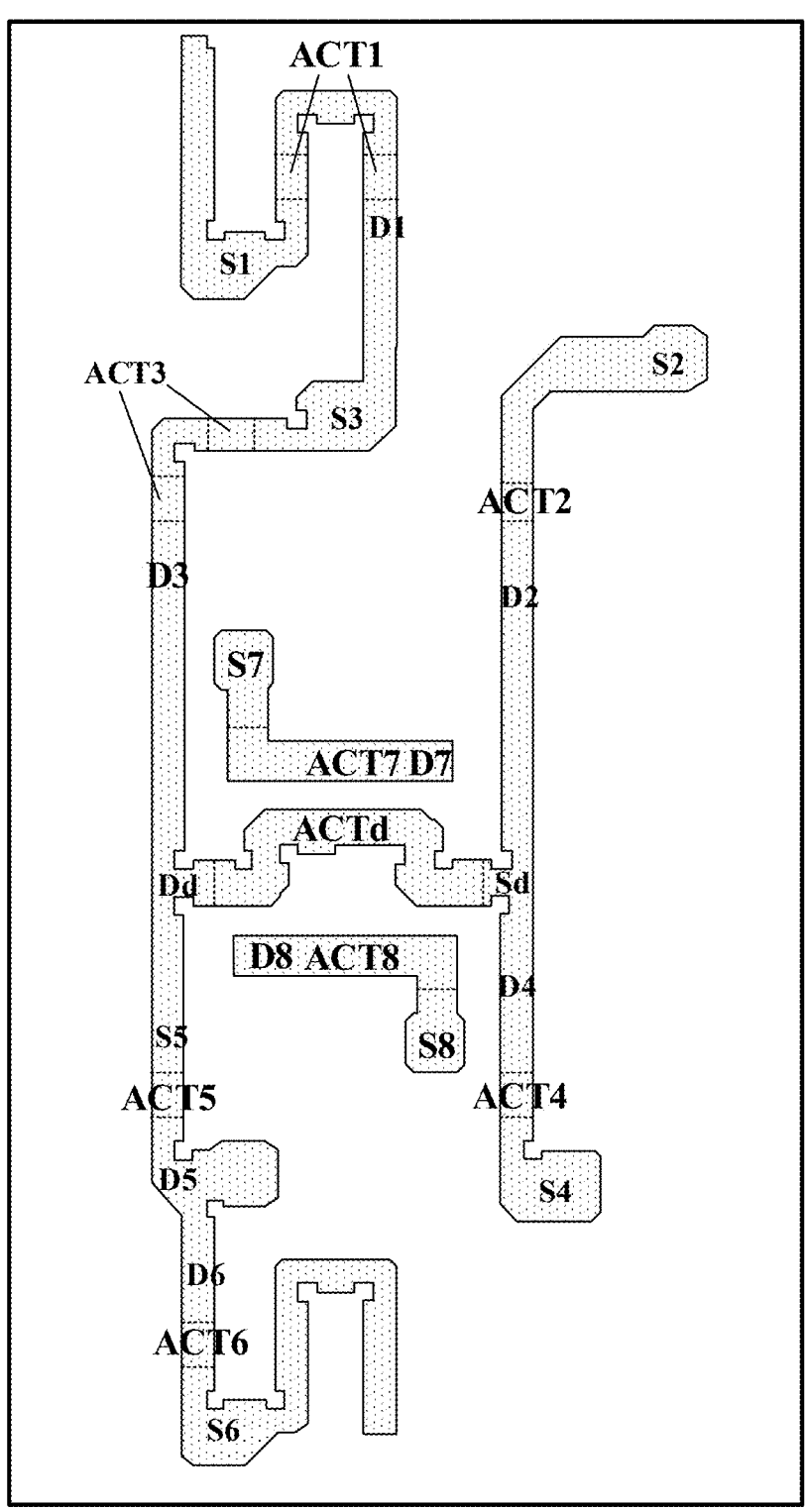
FIG. 3B is a diagram illustrating the structure of a semiconductor material layer in an array substrate depicted in FIG. 3A.
Figure 3C:
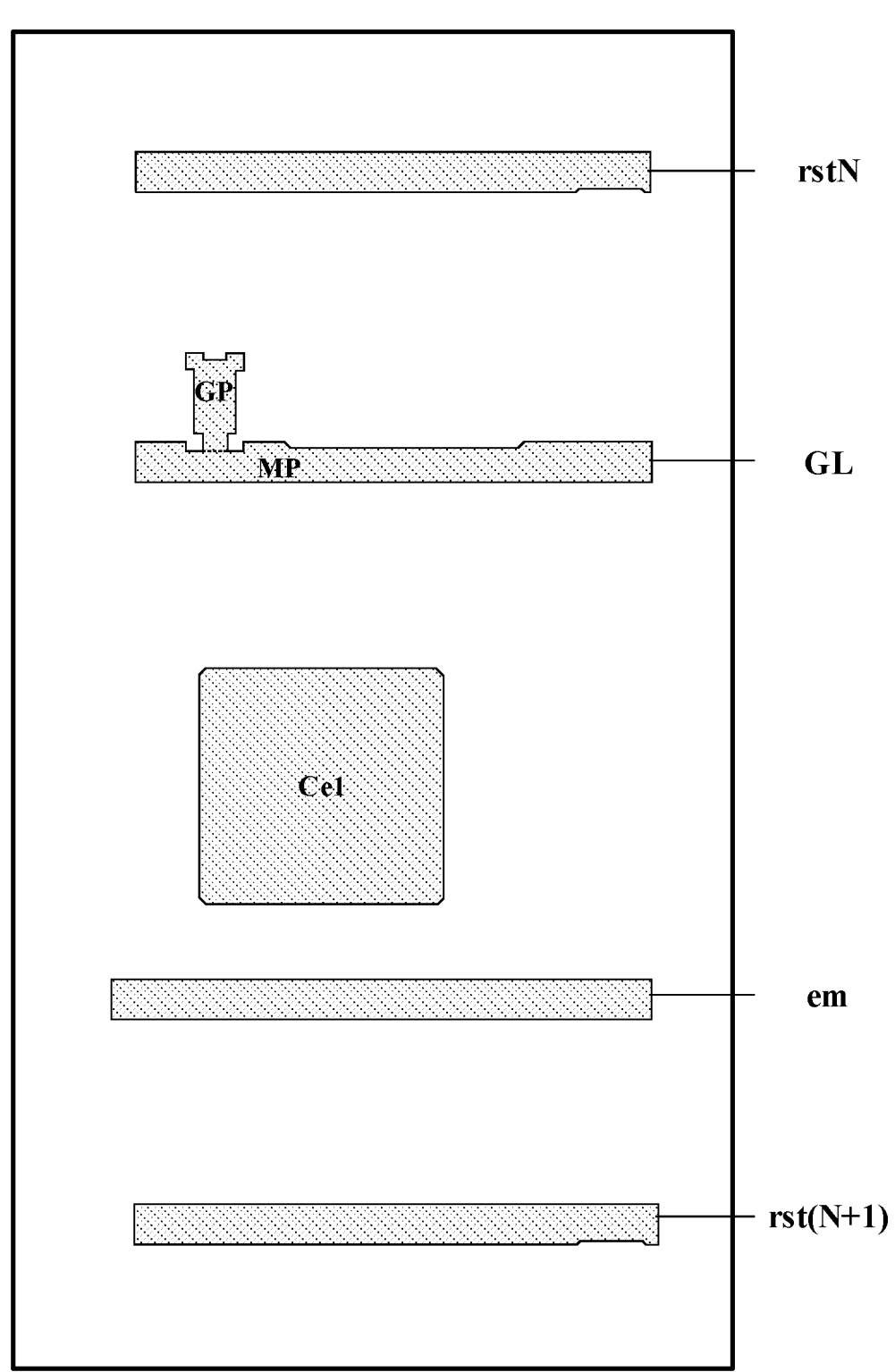
FIG. 3C is a diagram illustrating the structure of a first conductive layer in an array substrate depicted in FIG. 3A.
Figure 3D:
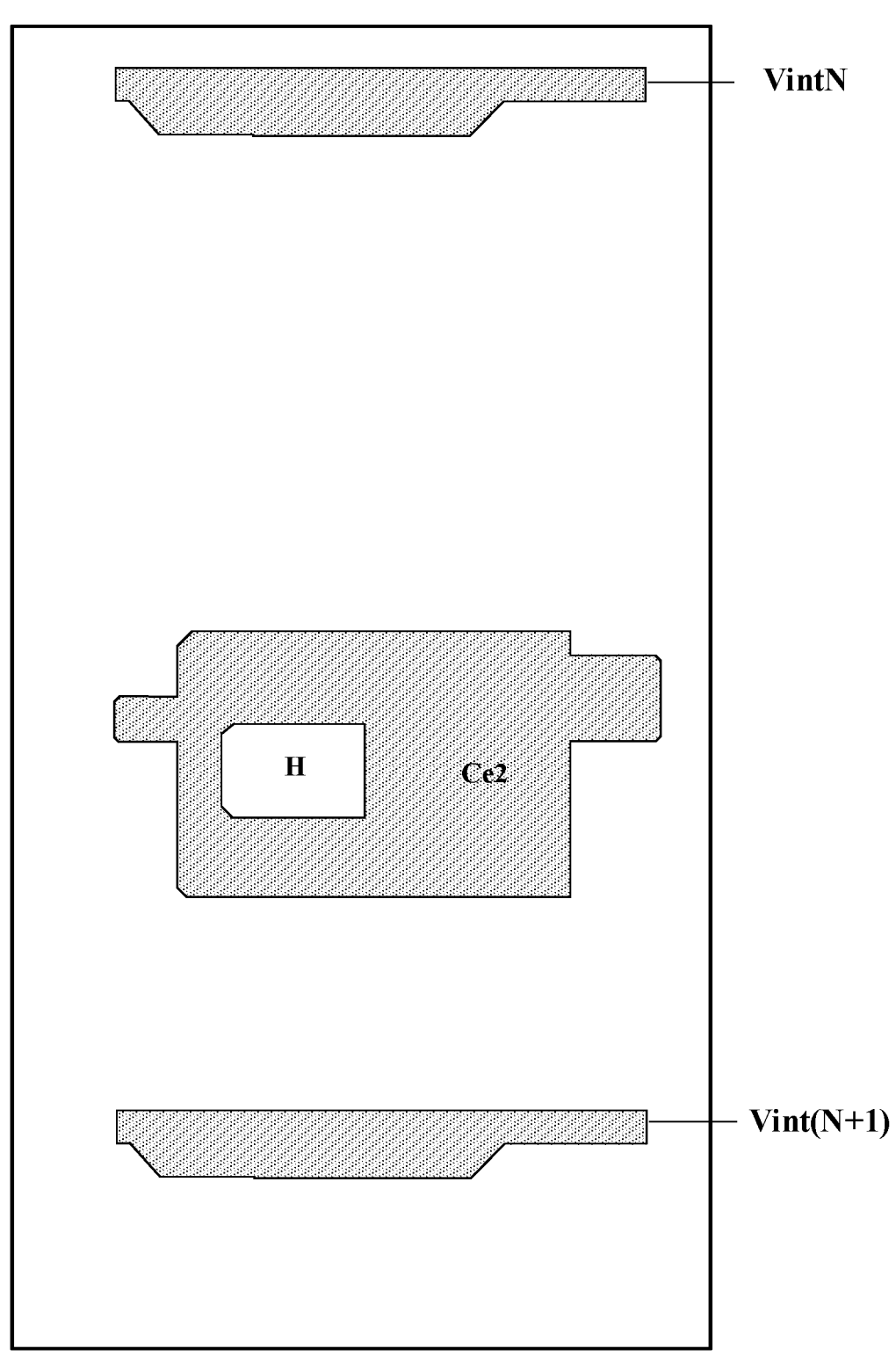
FIG. 3D is a diagram illustrating the structure of a second conductive layer in an array substrate depicted in FIG. 3A.
Figure 3E:
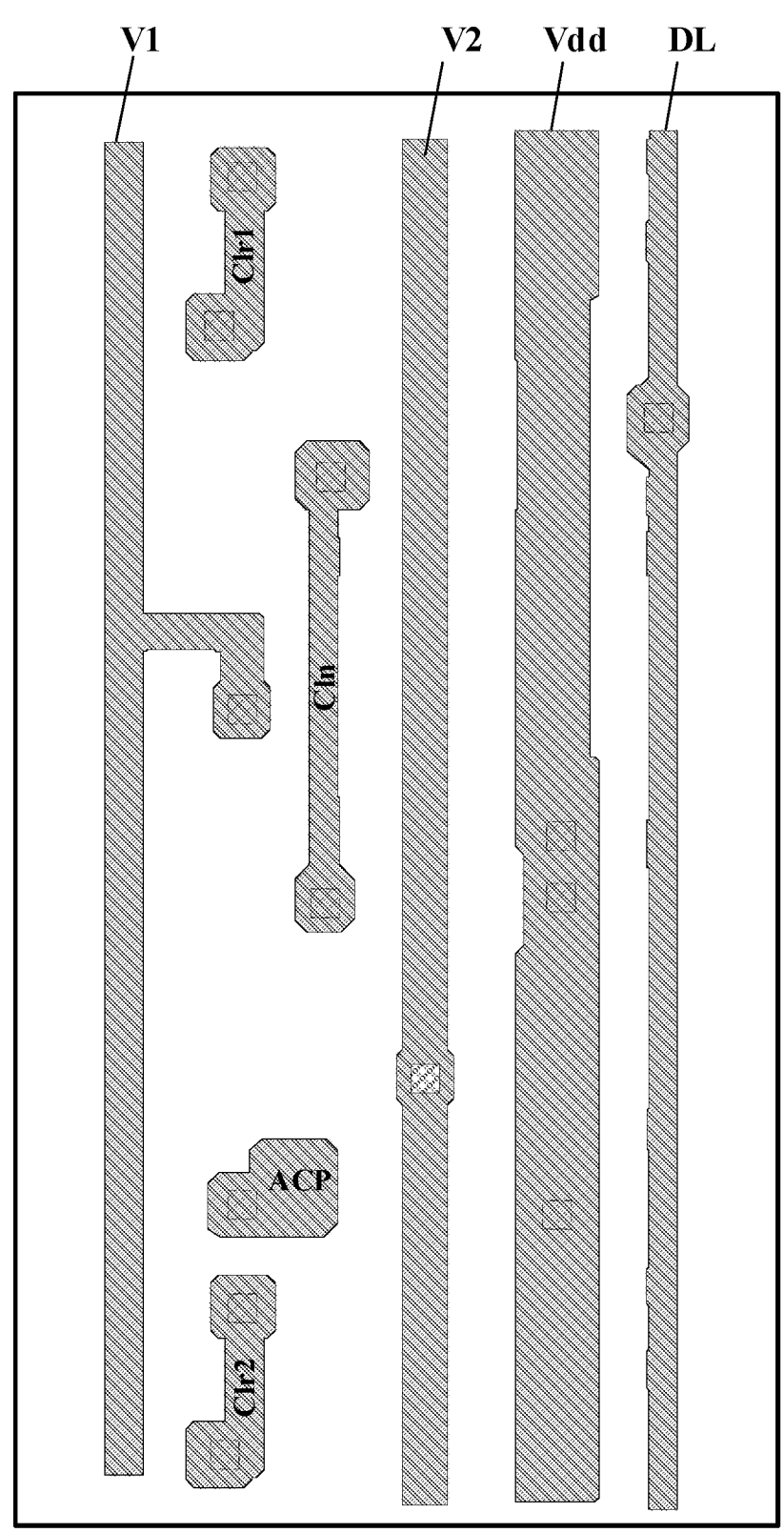
FIG. 3E is a diagram illustrating the structure of a first signal line layer in an array substrate depicted in FIG. 3A.
Figure 4A:
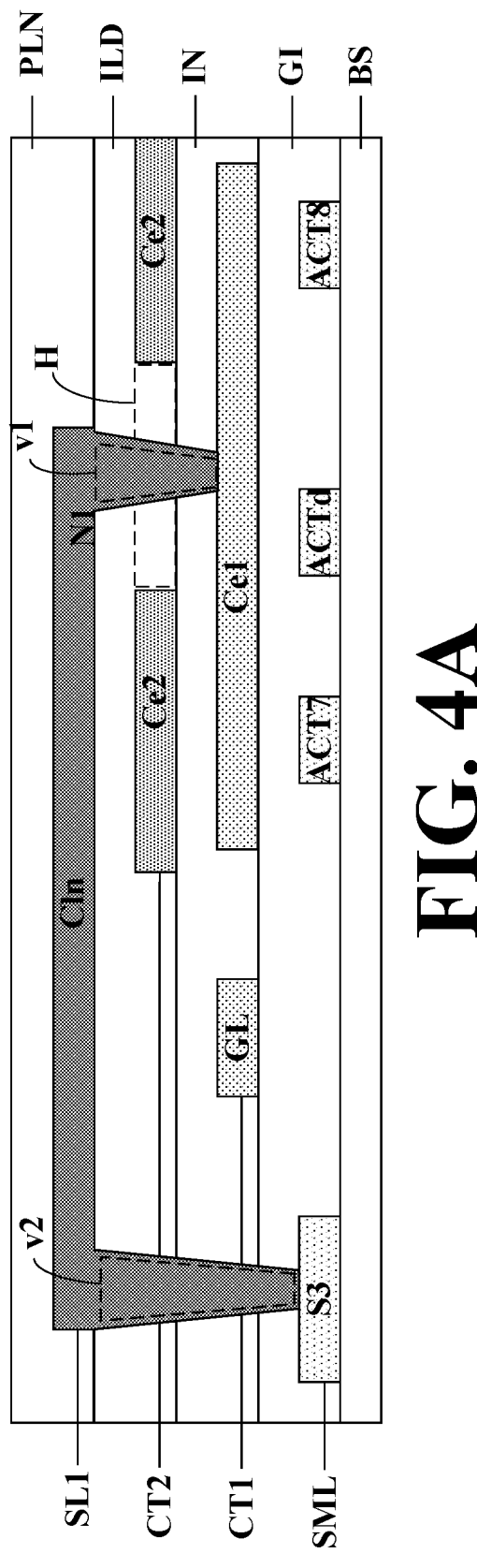
FIG. 4A is a cross-sectional view along an A-A' line in FIG. 3A.
Figure 4B:
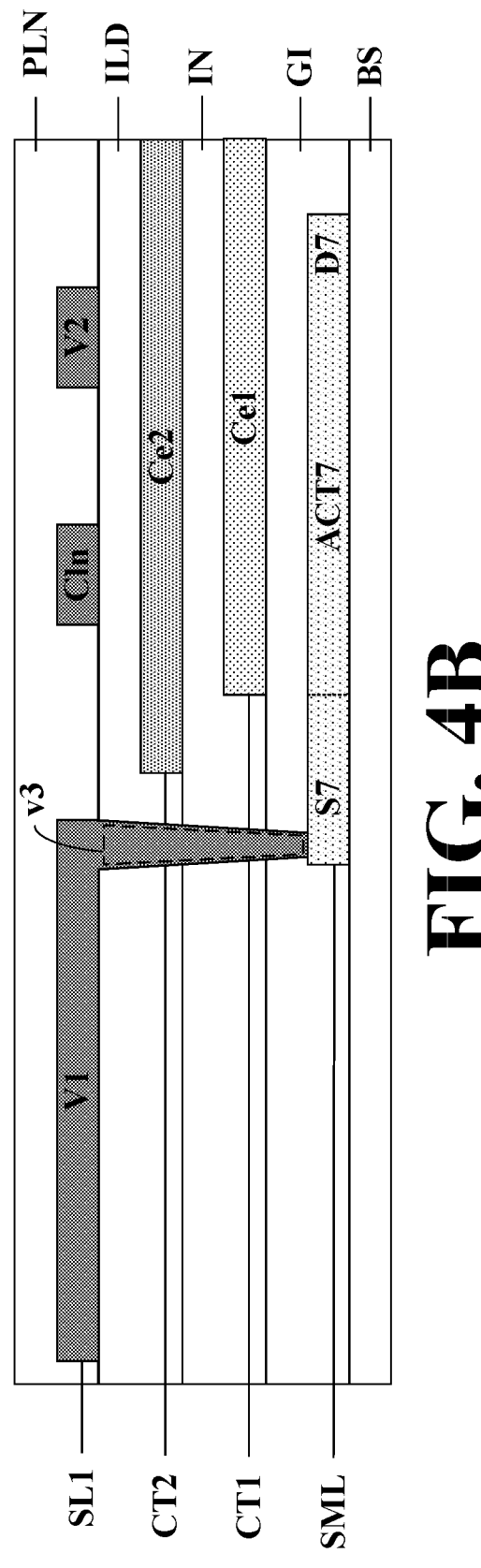
FIG. 4B is a cross-sectional view along a B-B' line in FIG. 3A.
Figure 4C:
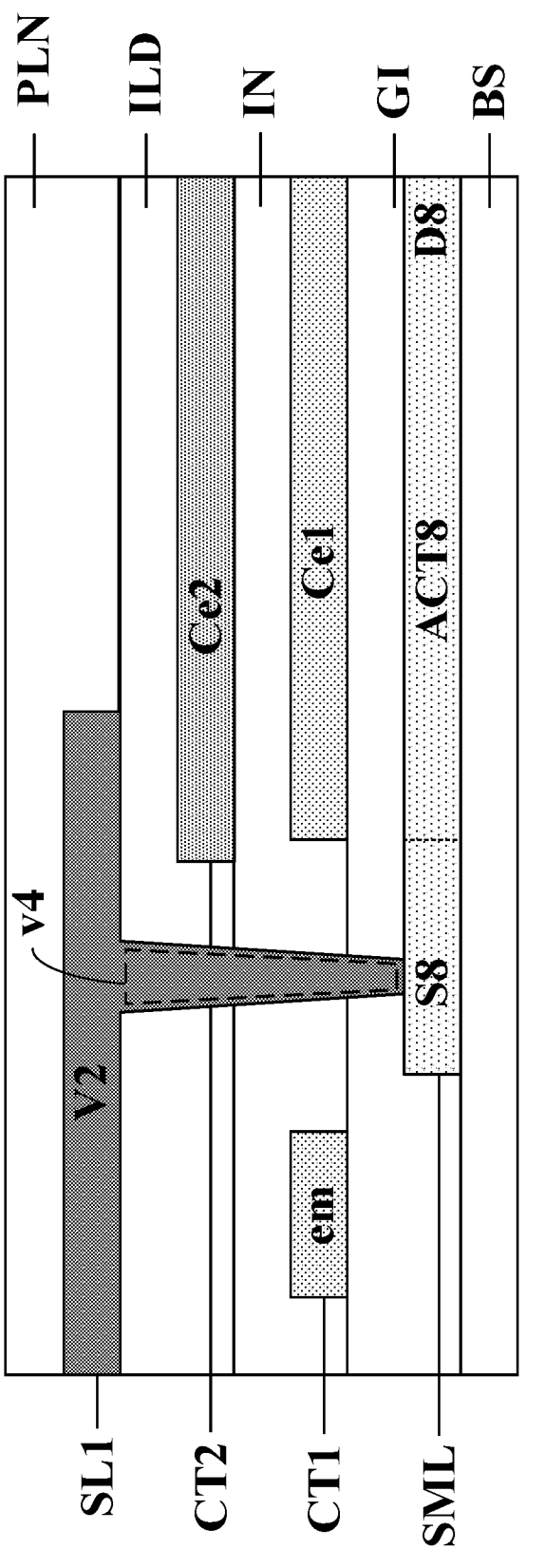
FIG. 4C is a cross-sectional view along a C-C' line in FIG. 3A.
Figure 4D:
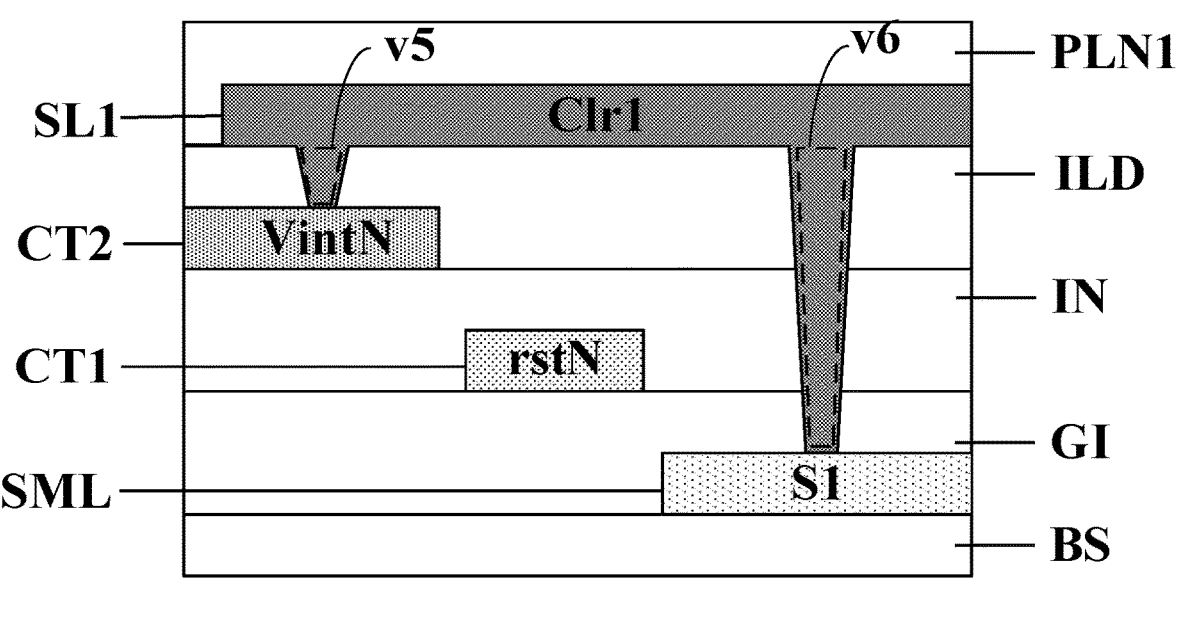
FIG. 4D is a cross-sectional view along a D-D' line in FIG. 3A.
Figure 4E:
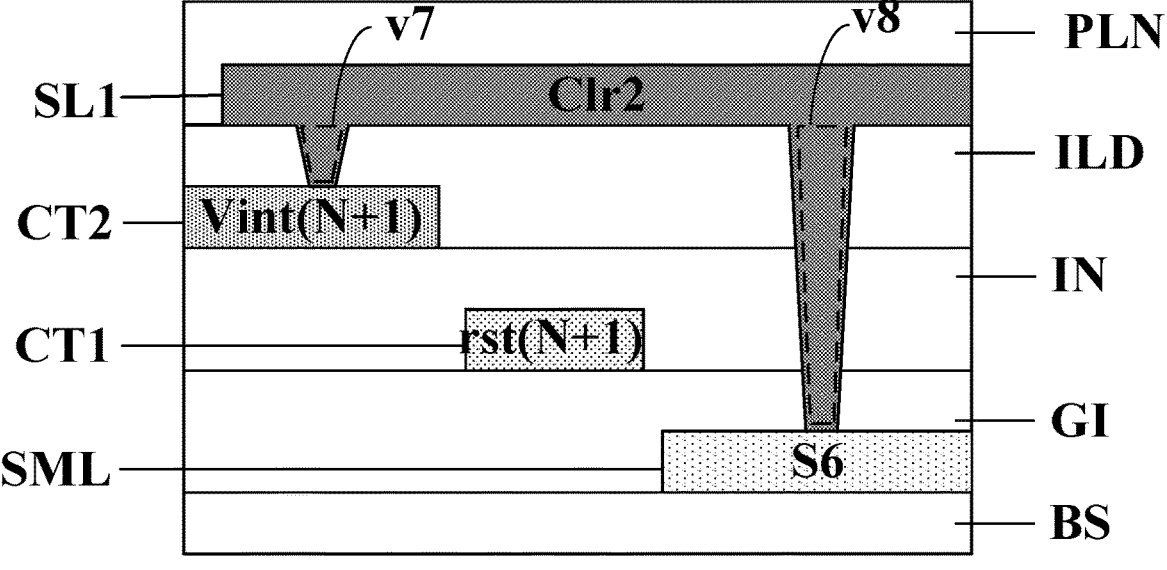
FIG. 4E is a cross-sectional view along a E-E' line in FIG. 3A.

FIG. 3A is a diagram illustrating the structure of an array substrate in some embodiments according to the present disclosure. FIG. 3B is a diagram illustrating the structure of a semiconductor material layer in an array substrate depicted in FIG. 3A. FIG. 3C is a diagram illustrating the structure of a first conductive layer in an array substrate depicted in FIG. 3A. FIG. 3D is a diagram illustrating the structure of a second conductive layer in an array substrate depicted in FIG. 3A. FIG. 3E is a diagram illustrating the structure of a first signal line layer in an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A. The array substrate depicted in FIG. 3A to FIG. 3E, and FIG. 4A to FIG. 4E includes a pixel driving circuit corresponding to the pixel driving circuit depicted in FIG. 2A.

Referring to FIG. 3A to FIG. 3E, and FIG. 4A to FIG. 4E, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, and a planarization layer PLN on a side of the first signal line layer SL1 away from the inter-layer dielectric layer ILD.

Referring to FIG. 2A, FIG. 3A, and FIG. 3B, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, the first auxiliary transistor T7, the second auxiliary transistor T8, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The first auxiliary transistor T7 includes an active layer ACT7, a first electrode S7, and a second electrode D7. The second auxiliary transistor T8 includes an active layer ACT8, a first electrode S8, and a second electrode D8. The driving transistor Td includes an active layer ACTd, a first electrode Sd, and a second electrode Dd. In one example, the active layers ACT1, ACT2, ACT3, ACT4, ACT5, ACT6, and ACTd of the transistors T1, T2, T3, T4, T5, T6, and Td in the respective pixel driving circuit are parts of a unitary structure. In another example, the active layers ACT1, ACT2, ACT3, ACT4, ACT5, ACT6, and ACTd, the first electrodes S1, S2, S3, S4, S5, S6, and Sd, and the second electrodes D1, D2, D3, D4, D5, D6, and Dd of the transistors T1, T2, T3, T4, T5, T6, and Td in the respective pixel driving circuit are parts of a unitary structure. In another example, the active layers ACT1, ACT2, ACT3, ACT4, ACT5, ACT6, and ACTd of the transistors T1, T2, T3, T4, T5, T6, and Td are in a same layer. In another example, the active layers ACT1, ACT2, ACT3, ACT4, ACT5, ACT6, and ACTd, the first electrodes S1, S2, S3, S4, S5, S6, and Sd, and the second electrodes D1, D2, D3, D4, D5, D6, and Dd of the transistors T1, T2, T3, T4, T5, T6, and Td are in a same layer.

As used herein, the active layer refers to a component of the transistor comprising at least a portion of the semiconductor material layer whose orthographic projection on the base substrate overlaps with an orthographic projection of a gate electrode on the base substrate. As used herein, a first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 2A, FIG. 3A, and FIG. 3C, the first conductive layer in some embodiments includes a plurality of gate lines GL, a plurality of reset control signal lines (including a respective reset control signal line of a present stage rstN and a reset control signal line of a next stage rst(N+1)), a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 3A, and FIG. 3D, the second conductive layer in some embodiments includes a plurality of reset signal lines (including a respective reset signal line of a present stage VintN and a respective reset signal line of a next adjacent stage Vinit(N+1)), and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of reset signal lines, and the second capacitor electrode Ce2 are in a same layer.

Referring to FIG. 2A, FIG. 3A, and FIG. 3E, the first signal line layer in some embodiments includes a node connecting line Cln, a first reset signal connecting line Clr1, a second reset signal connecting line Clr2, a plurality of data line DL, a plurality of voltage supply lines Vdd, a first voltage signal line V1, a second voltage signal line V2, and an anode contact pad ACP. The node connecting line Cln connects the first capacitor electrode Ce1 and the first electrode of the third transistor T3 in a respective pixel driving circuit together. The first reset signal connecting line Clr1 connects a respective reset signal line of a present stage VintN to the first electrode of the first transistor T1. The second reset signal connecting line Clr2 connects a respective reset signal line of a next adjacent stage Vint(N+1) to the first electrode of the sixth transistor T6.

Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the node connecting line Cln, the first reset signal connecting line Clr1, the second reset signal connecting line Clr2, the plurality of data line DL, the plurality of voltage supply lines Vdd, the first voltage signal line V1, the second voltage signal line V2, and the anode contact pad ACP are in a same layer.

Referring to FIG. 2A, FIG. 3A to FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line CIn on a side of the inter-layer dielectric layer ILD away from the second capacitor electrode Ce2.

In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line CIn is connected to the first capacitor electrode Ce1 through the first via v1, and the node connecting line CIn is connected to the semiconductor material layer SML through the second via v2. Optionally, the node connecting line CIn is connected to the first electrode S3 of third transistor, as depicted in FIG. 4A.

Referring to FIG. 2A, FIG. 3A to FIG. 3E, and FIG. 4B to FIG. 4C, in some embodiments, the array substrate further includes a third via v3 and a fourth via v4. The third via v3 extends through the inter-layer dielectric layer ILD, the insulating layer IN, and the gate insulating layer GI. The fourth via v4 extends through the inter-layer dielectric layer ILD, the insulating layer IN, and the gate insulating layer GI. The first voltage signal line V1 is connected to the first electrode S7 of the first auxiliary transistor T7. The second voltage signal line V2 is connected to the first electrode S8 of the second auxiliary transistor T8.

Referring to FIG. 2A, FIG. 3A to FIG. 3E, and FIG. 4D, in some embodiments, the array substrate further includes a fifth via v5 and a sixth via v6. The fifth via v5 extends through the inter-layer dielectric layer ILD. The sixth via v6 extends through the inter-layer dielectric layer ILD, the insulating layer IN, and the gate insulating layer GI. The first reset signal connecting line Clr1 is connected to a respective reset signal line of a present stage VintN through the fifth via v5, and the first reset signal connecting line Clr1 is connected to the first electrode S1 of the first transistor T1 through the sixth via v6. Optionally, the first reset signal connecting line Clr1 crosses over a respective reset control signal line rstN in a present stage.

Referring to FIG. 2A, FIG. 3A to FIG. 3E, and FIG. 4E, in some embodiments, the array substrate further includes a seventh via v7 and an eighth via v8. The seventh via v7 extends through the inter-layer dielectric layer ILD. The eighth via v8 extends through the inter-layer dielectric layer ILD, the insulating layer IN, and the gate insulating layer GI. The second reset signal connecting line Clr2 is connected to a respective reset signal line of a next adjacent stage Vint(N+1) through the seventh via v7, and the second reset signal connecting line Clr2 is connected to the first electrode S6 of the sixth transistor T6 through the eighth via v8. Optionally, the second reset signal connecting line Clr2 crosses over a respective reset control signal line rst(N+1) of a next adjacent stage.

Referring to FIG. 3A and FIG. 3C, in a respective pixel driving circuit, a respective gate line of the plurality of gate lines GL in some embodiments includes a first main portion MP extending along an extension direction of the respective gate line, and a gate protrusion GP protruding away from the first main portion MP, e.g., along a direction from the respective gate line of the plurality of gate lines GL of a present stage toward the respective reset control signal line rstN in the present stage.

In some embodiments, as discussed above, the third transistor T3 is a double gate transistor. In some embodiments, the gate protrusion GP is one of the double gates in the third transistor T3. In some embodiments, an orthographic projection of the gate protrusion GP on the base substrate BS at least partially overlaps with an orthographic projection of the active layer ACT3 of the third transistor T3 on the base substrate BS.

Figure 5A:
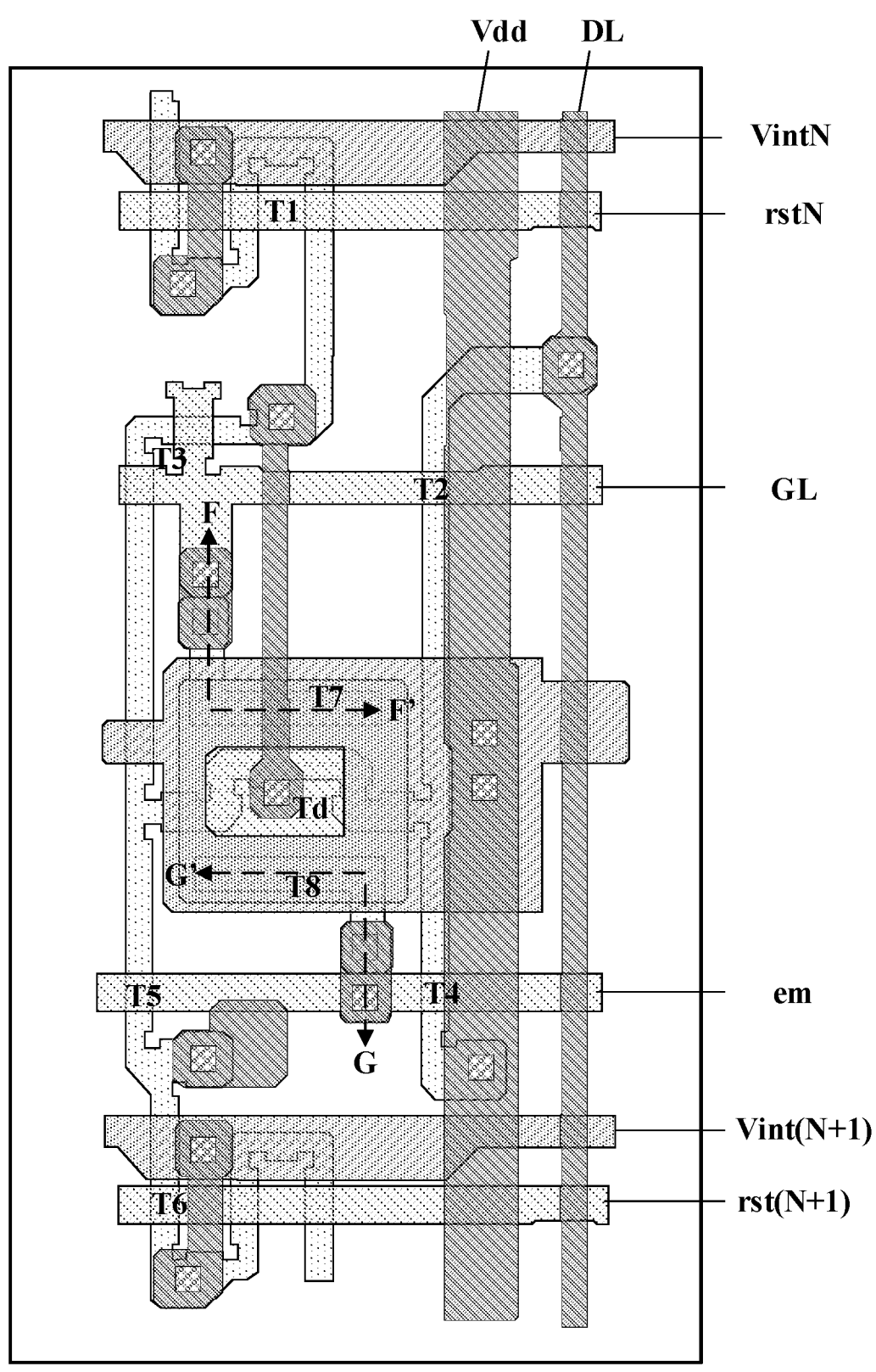
FIG. 5A is a diagram illustrating the structure of an array substrate in some embodiments according to the present disclosure.
Figure 5B:
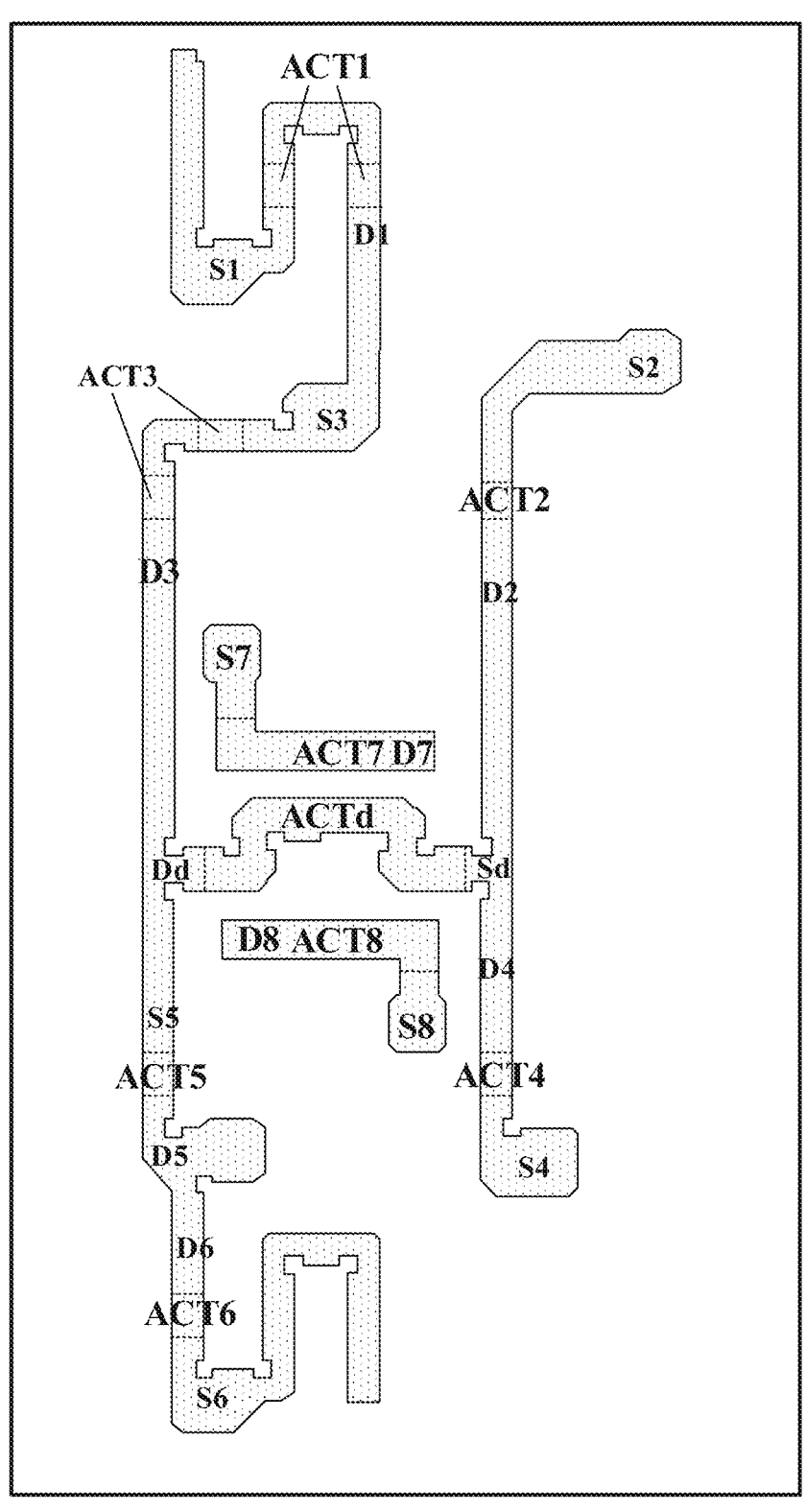
FIG. 5B is a diagram illustrating the structure of a semiconductor material layer in an array substrate depicted in FIG. 5A.
Figure 5C:
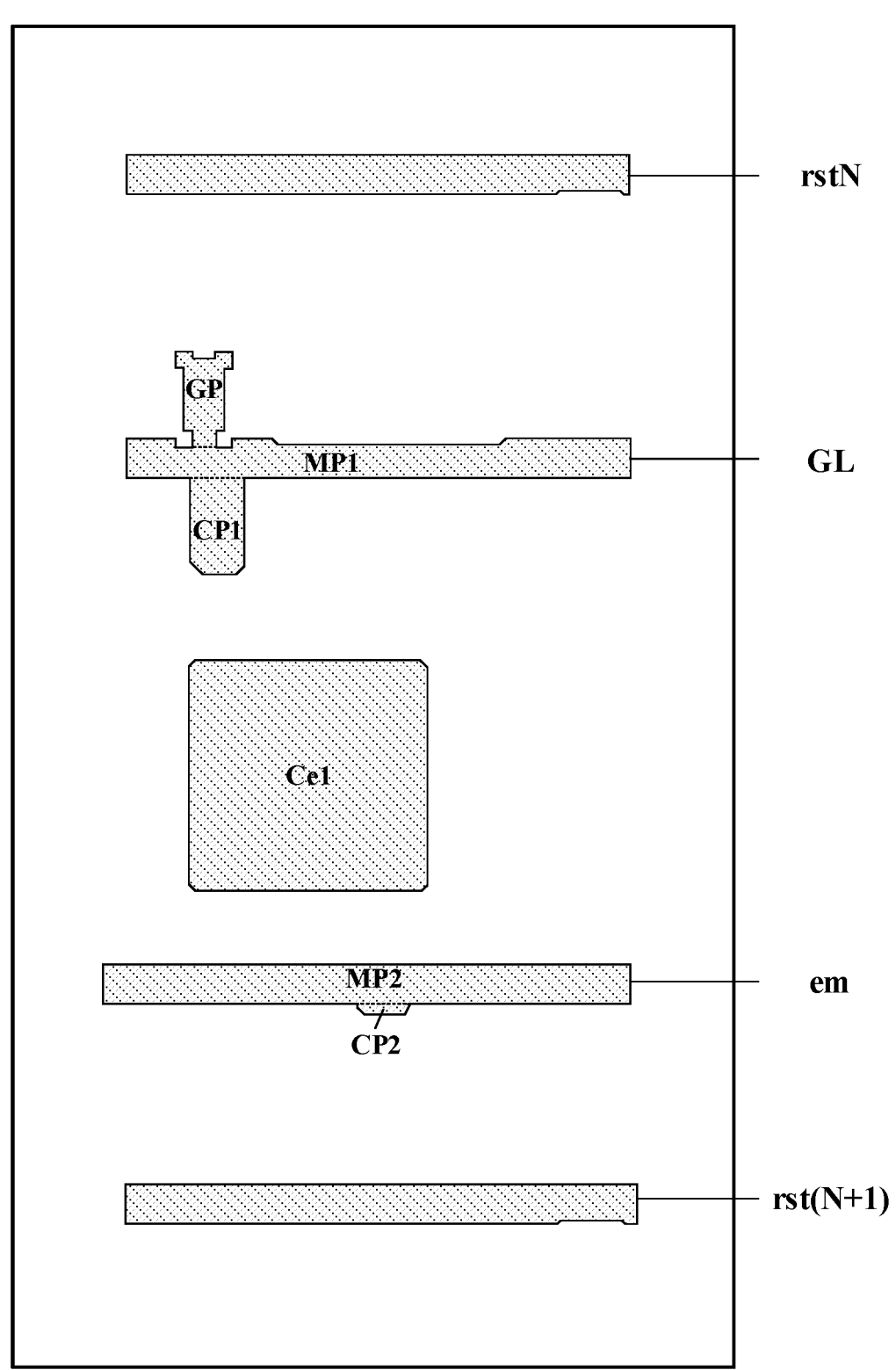
FIG. 5C is a diagram illustrating the structure of a first conductive layer in an array substrate depicted in FIG. 5A.
Figure 5D:
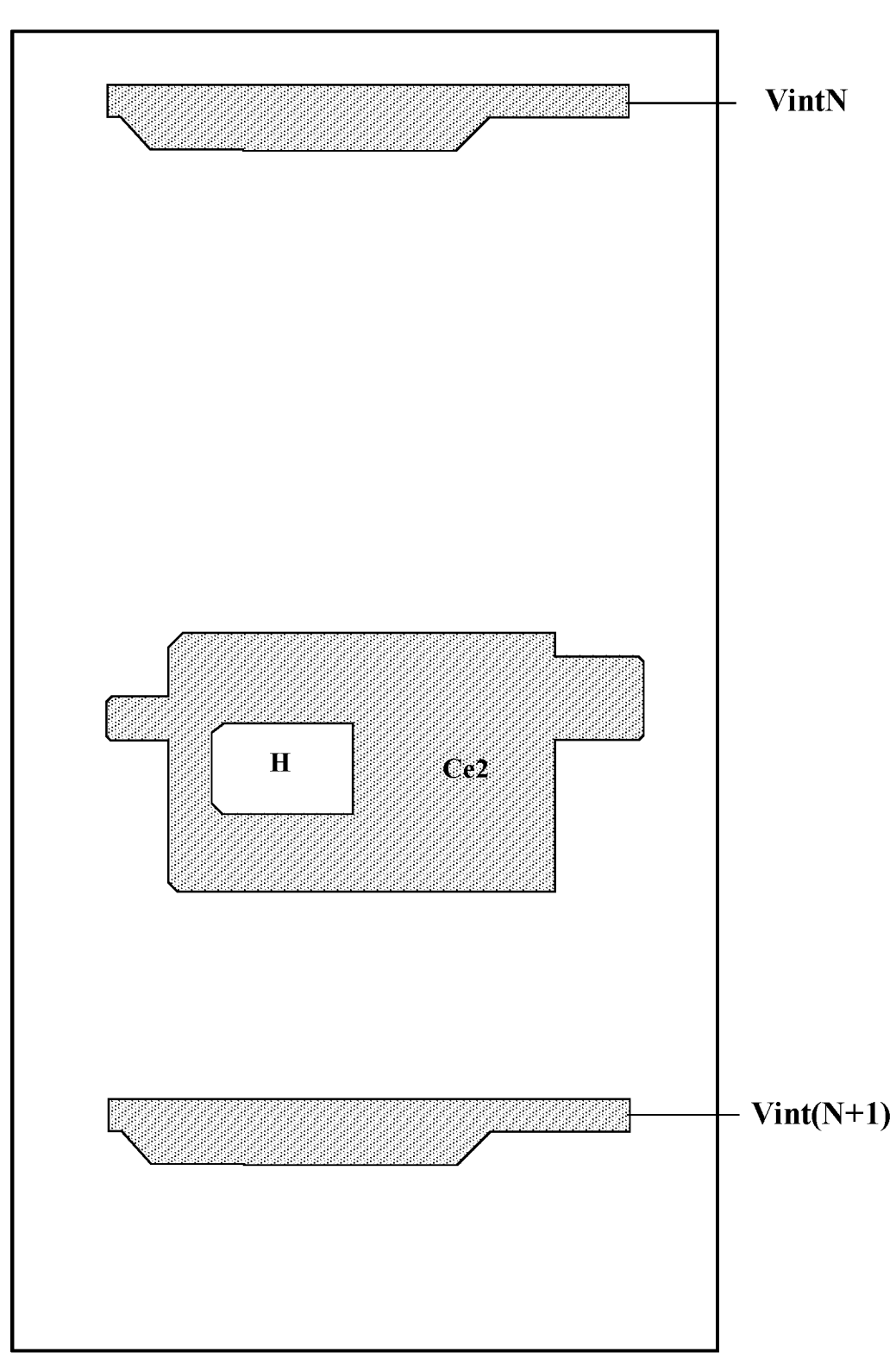
FIG. 5D is a diagram illustrating the structure of a second conductive layer in an array substrate depicted in FIG. 5A.
Figure 5E:
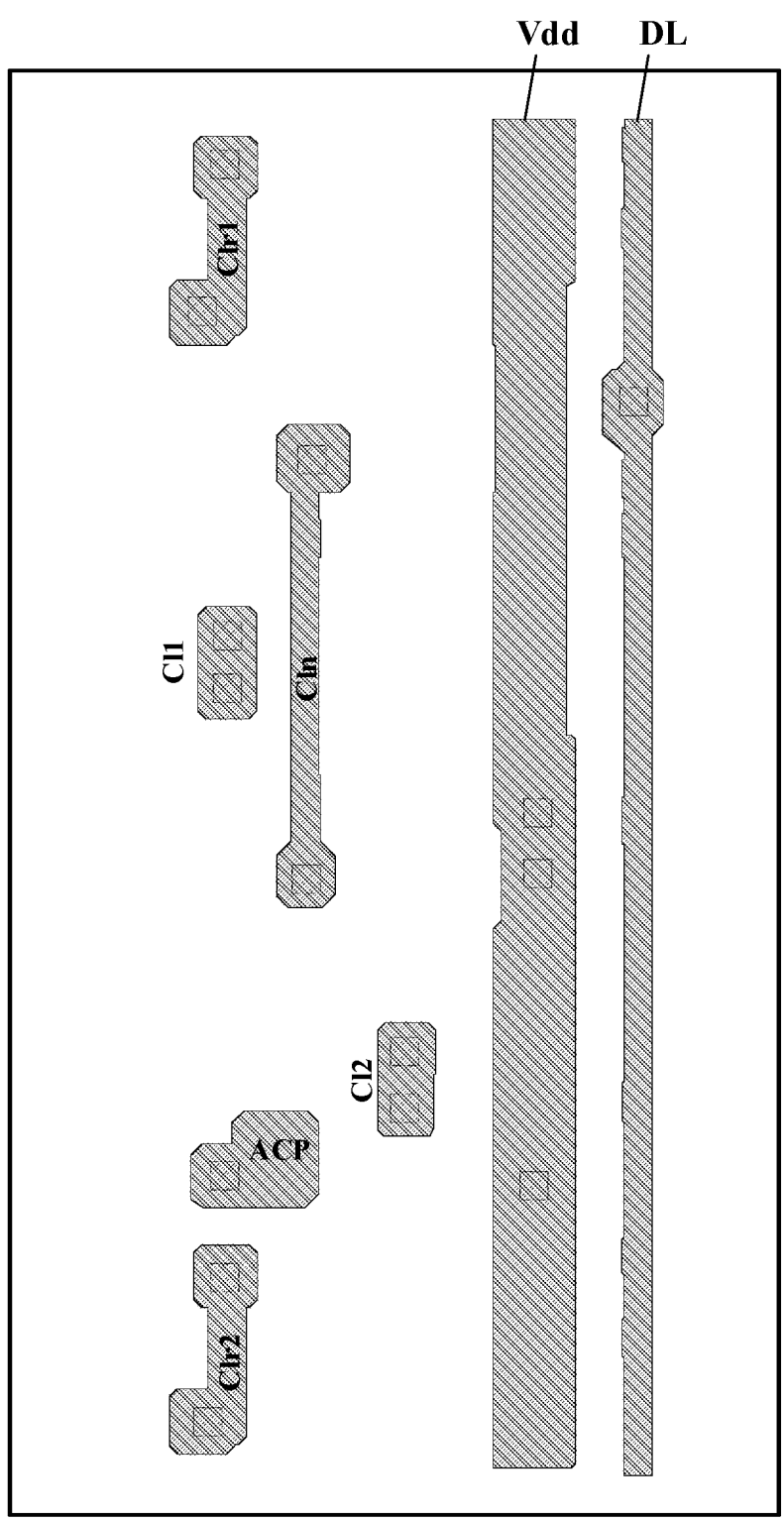
FIG. 5E is a diagram illustrating the structure of a first signal line layer in an array substrate depicted in FIG. 5A.
Figure 6A:
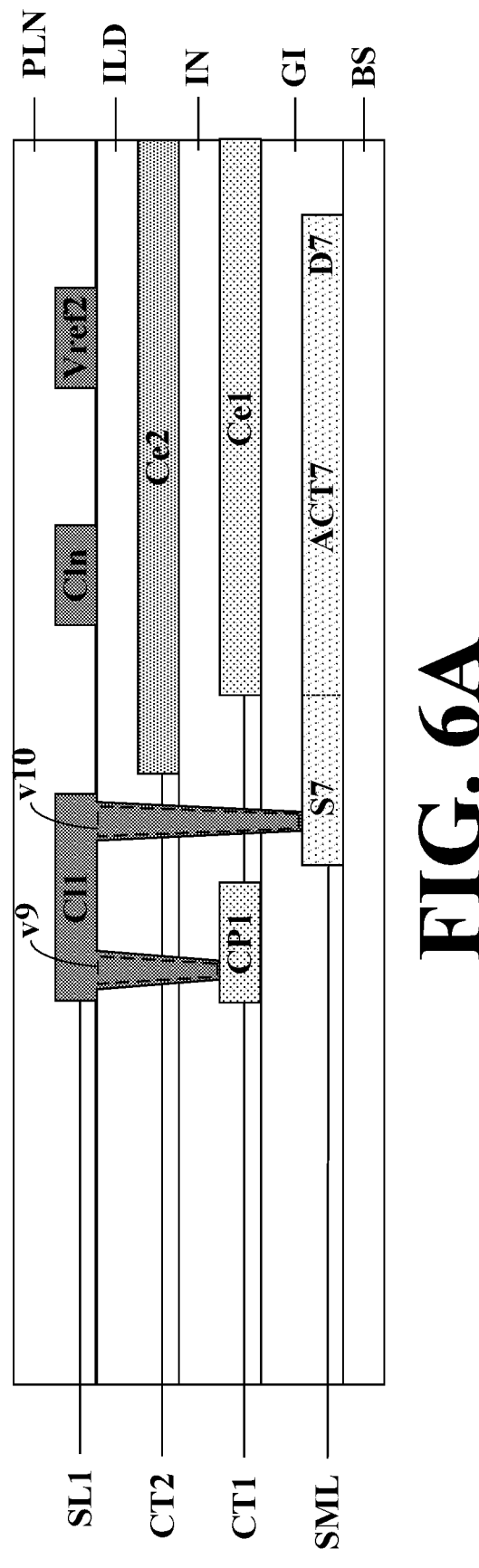
FIG. 6A is a cross-sectional view along an F-F' line in FIG. 5A.
Figure 6B:
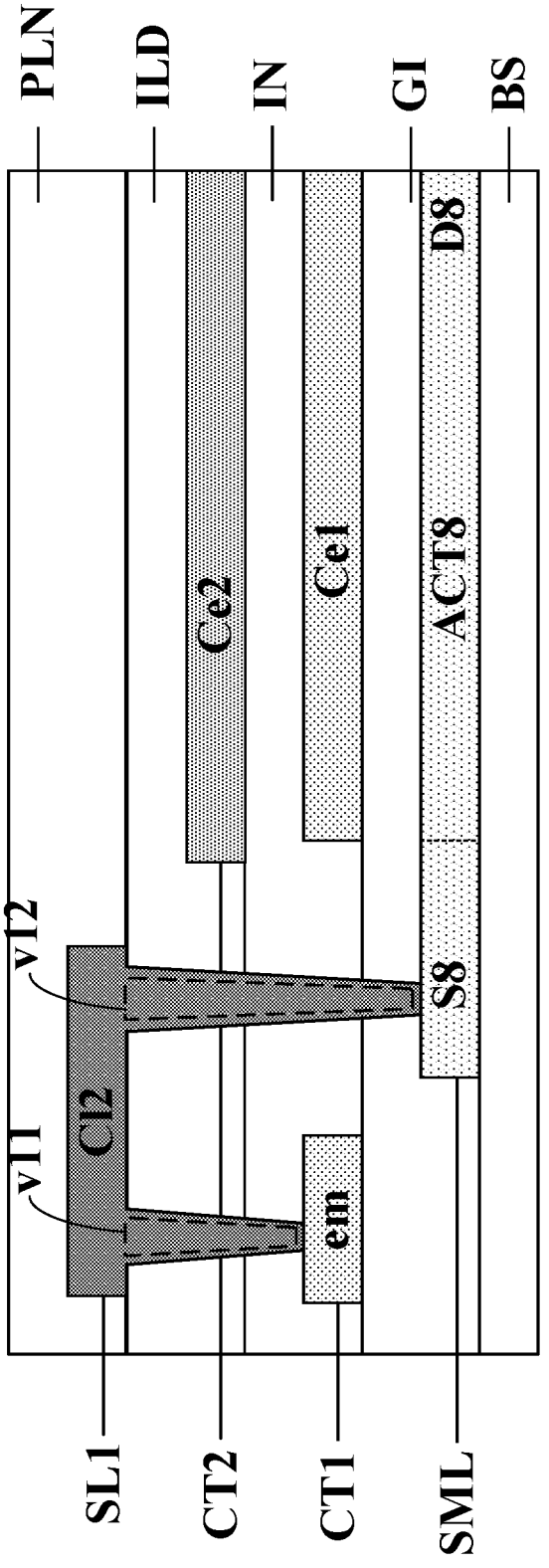
FIG. 6B is a cross-sectional view along a G-G' line in FIG. 5A.

FIG. 5A is a diagram illustrating the structure of an array substrate in some embodiments according to the present disclosure. FIG. 5B is a diagram illustrating the structure of a semiconductor material layer in an array substrate depicted in FIG. 5A. FIG. 5C is a diagram illustrating the structure of a first conductive layer in an array substrate depicted in FIG. 5A. FIG. 5D is a diagram illustrating the structure of a second conductive layer in an array substrate depicted in FIG. 5A. FIG. 5E is a diagram illustrating the structure of a first signal line layer in an array substrate depicted in FIG. 5A. FIG. 6A is a cross-sectional view along an F-F' line in FIG. 5A. FIG. 6B is a cross-sectional view along a G-G' line in FIG. 5A. The array substrate depicted in FIG. 5A to FIG. 5E, and FIG. 6A to FIG. 6B includes a pixel driving circuit corresponding to the pixel driving circuit depicted in FIG. 2B.

Referring to FIG. 5A to FIG. 5E, and FIG. 6A to FIG. 6B, in some embodiments, a first electrode S7 of the first auxiliary transistor T7 is coupled to a respective gate line of a plurality of gate lines GL, e.g., the respective gate line of a plurality of gate lines GL functions as the first voltage signal line. A first electrode S8 of the second auxiliary transistor T8 is coupled to a respective light emitting control signal line of a plurality of light emitting control signal lines em, e.g., the respective light emitting control signal line of a plurality of light emitting control signal lines em functions as the second voltage signal line. During at least a light emitting sub-phase of one frame of image, the respective gate line is configured to provide a first level voltage signal (e.g., a low level voltage signal), and the respective light emitting control signal line is configured to provide a second level voltage signal (e.g., a high level voltage signal).

Referring to FIG. 5A and FIG. 5C, in a respective pixel driving circuit, a respective gate line of the plurality of gate lines GL in some embodiments includes a first main portion MP1 extending along an extension direction of the respective gate line, and a gate protrusion GP protruding away from the first main portion MP1, e.g., along a direction from the respective gate line of the plurality of gate lines GL of a present stage toward the respective reset control signal line rstN in the present stage. In some embodiments, the respective gate line of the plurality of gate lines GL further includes a first connecting pad CP1 protruding away from the first main portion MP1, e.g., along a direction from the respective gate line of the plurality of gate lines GL of a present stage toward the first capacitor electrode Ce1 in the present stage.

Referring to FIG. 2B, and FIG. 5A to FIG. 5E, in some embodiments, the array substrate further includes a first connecting line Cl1 and a second connecting line Cl2. Optionally, the first connecting line Cl1 and the second connecting line Cl2 are in the first signal line layer. The first connecting line Cl1 connects the first electrode S7 of the first auxiliary transistor T7 to a respective gate line of a plurality of gate lines GL Referring to FIG. 2B, FIG. 5A to FIG. 5E, and FIG. 6A, in some embodiments, the array substrate further includes a ninth via v9 and a tenth via v10. The ninth via v9 extends through the inter-layer dielectric layer ILD and the insulating layer IN. The tenth via v10 extends through the inter-layer dielectric layer ILD, the insulating layer IN, and the gate insulating layer GI. The first connecting line Cl1 is connected to a first connecting pad CP1 of the respective gate line of the plurality of gate lines GL through the ninth via v9, and the first connecting line Cl1 is connected to the first electrode S7 of the first auxiliary transistor T7 through the tenth via v10.

Referring to FIG. 5A and FIG. 5C, in a respective pixel driving circuit, a respective light emitting control signal line of a plurality of light emitting control signal lines em in some embodiments includes a second main portion MP2 extending along an extension direction of the respective light emitting control signal line, and a second connecting pad CP2 protruding away from the second main portion MP2, e.g., along a direction from the respective light emitting control signal line of the plurality of light emitting control signal lines em of a present stage away from the first capacitor electrode Ce1 in the present stage.

Referring to FIG. 2B, FIG. 5A to FIG. 5E, and FIG. 6B, in some embodiments, the array substrate further includes an eleventh via v11 and a twelfth via v12. The eleventh via v11 extends through the inter-layer dielectric layer ILD and the insulating layer IN. The twelfth via v12 extends through the inter-layer dielectric layer ILD, the insulating layer IN, and the gate insulating layer GI. The second connecting line Cl2 is connected to a second connecting pad CP2 of the respective light emitting control signal line of the plurality of light emitting control signal lines em through the eleventh via v11, and the second connecting line Cl2 is connected to the first electrode S8 of the second auxiliary transistor T8 through the twelfth via v12.

Referring to FIG. 5A, FIG. 5B, FIG. 5C, FIG. 6A, and FIG. 6B, in some embodiments, an orthographic projection of the first capacitor electrode Ce1 on a base substrate BS at least partially overlaps with an orthographic projection of an active layer ACT7 of the first auxiliary transistor T7 on the base substrate BS.

Optionally, an orthographic projection of the first capacitor electrode Ce1 on a base substrate at least partially overlaps with an orthographic projection of a second electrode D7 of the first auxiliary transistor T7 on the base substrate BS.

Referring to FIG. 5A, FIG. 5B, FIG. 5C, FIG. 6A, and FIG. 6B, in some embodiments, an orthographic projection of the first capacitor electrode Ce1 on a base substrate BS at least partially overlaps with an orthographic projection of an active layer ACT8 of the second auxiliary transistor T8 on the base substrate BS.

Optionally, an orthographic projection of the first capacitor electrode Ce1 on a base substrate BS at least partially overlaps with an orthographic projection of a second electrode D8 of the second auxiliary transistor T8 on the base substrate BS.

Referring to FIG. 5A, FIG. 5B, FIG. 5C, FIG. 6A, and FIG. 6B, in some embodiments, an orthographic projection of the first capacitor electrode Ce1 on a base substrate BS at least partially overlaps with an orthographic projection of an active layer of the driving transistor Td on the base substrate BS and at least partially overlaps with an orthographic projection of an active layer ACT7 of the first auxiliary transistor T7 on the base substrate BS.

Optionally, an orthographic projection of the first capacitor electrode Ce1 on a base substrate BS at least partially overlaps with an orthographic projection of an active layer of the driving transistor Td on the base substrate BS, at least partially overlaps with an orthographic projection of an active layer ACT7 of the first auxiliary transistor T7 on the base substrate BS, and at least partially overlaps with an orthographic projection of a second electrode D7 of the first auxiliary transistor T7 on the base substrate BS.

Referring to FIG. 5A, FIG. 5B, FIG. 5C, FIG. 6A, and FIG. 6B, in some embodiments, an orthographic projection of the first capacitor electrode Ce1 on a base substrate BS at least partially overlaps with an orthographic projection of an active layer of the driving transistor Td on the base substrate BS and at least partially overlaps with an orthographic projection of an active layer ACT8 of the second auxiliary transistor T8 on the base substrate BS.

Optionally, an orthographic projection of the first capacitor electrode Ce1 on a base substrate BS at least partially overlaps with an orthographic projection of an active layer of the driving transistor Td on the base substrate BS, at least partially overlaps with an orthographic projection of an active layer ACT8 of the second auxiliary transistor T8 on the base substrate BS, and at least partially overlaps with an orthographic projection of a second electrode D8 of the second auxiliary transistor T8 on the base substrate BS.

The present disclosure may be implemented with various appropriate layouts of the auxiliary transistors. In some embodiments, the gate electrode of the first auxiliary transistor T7 is coupled to the gate electrode of the driving transistor Td, and the gate electrode of the second auxiliary transistor T8 is coupled to the gate electrode of the driving transistor Td. In FIG. 3A and FIG. 5A, the first capacitor electrode Ce1 functions as the gate electrodes of the first auxiliary transistor T7 and the second auxiliary transistor T8. Other layouts may be implemented.

Figure 7A:
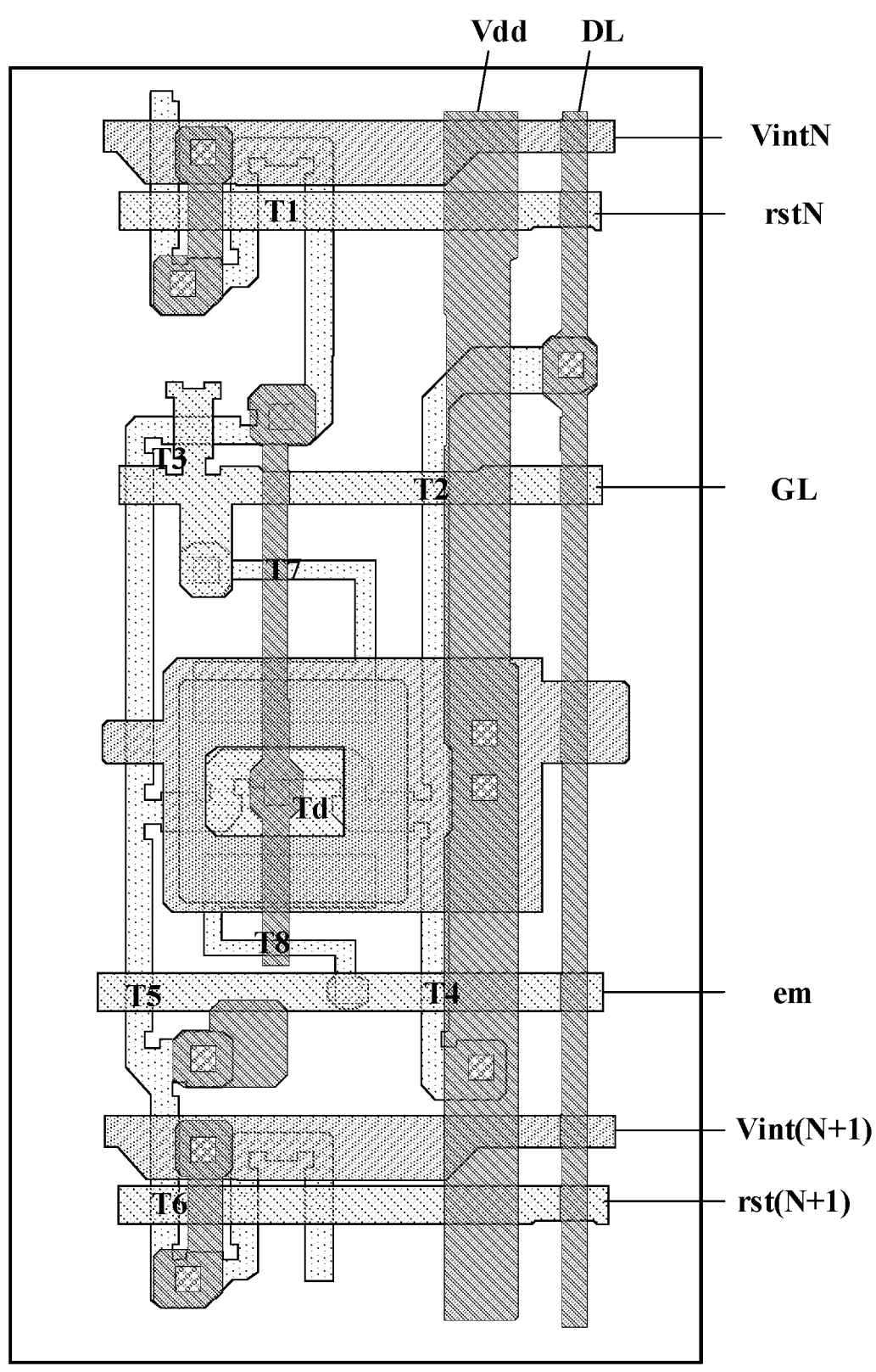
FIG. 7A is a diagram illustrating the structure of an array substrate in some embodiments according to the present disclosure.
Figure 7B:
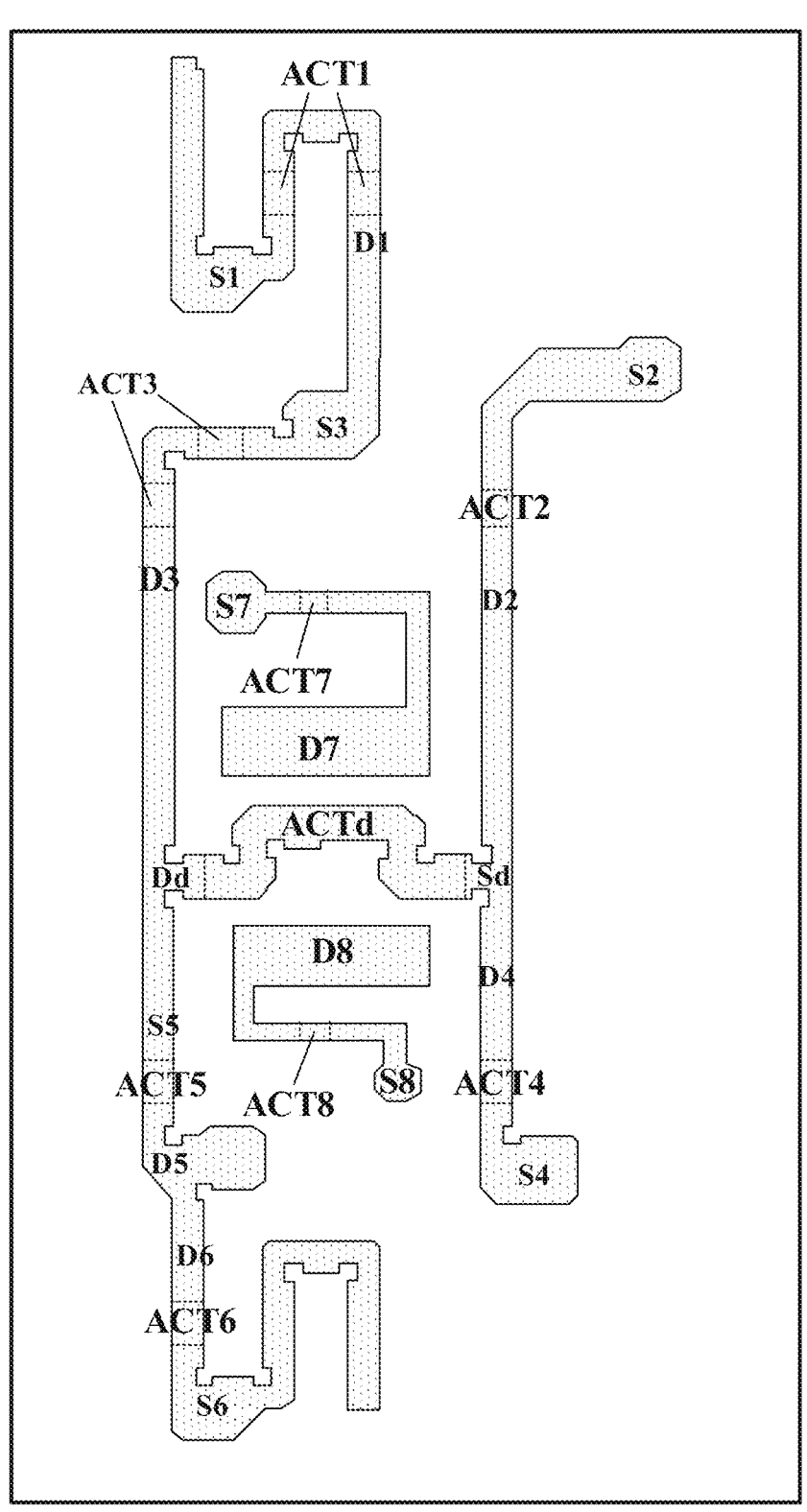
FIG. 7B is a diagram illustrating the structure of a semiconductor material layer in an array substrate depicted in FIG. 7A.
Figure 7C:
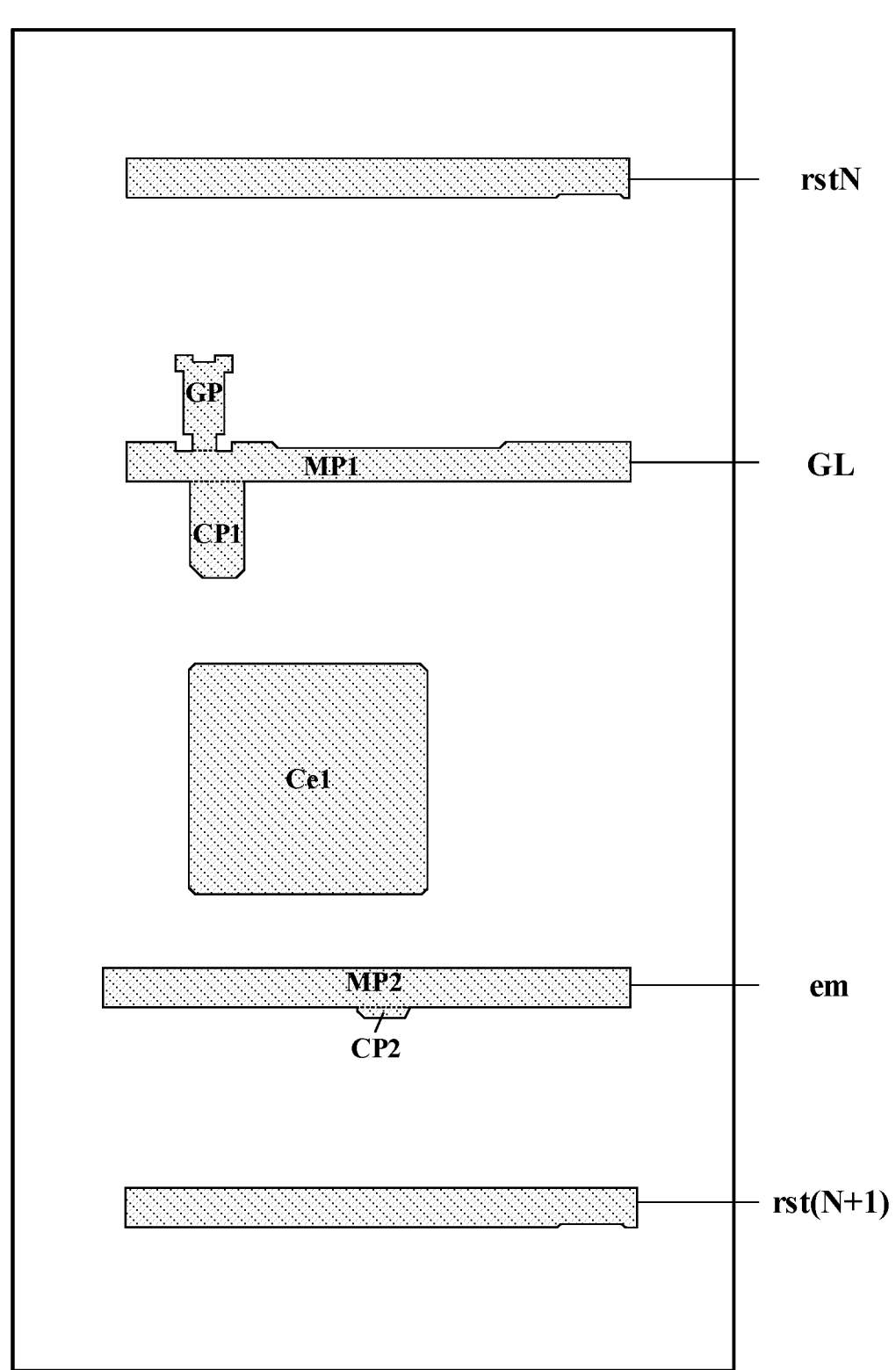
FIG. 7C is a diagram illustrating the structure of a first conductive layer in an array substrate depicted in FIG. 7A.
Figure 7D:
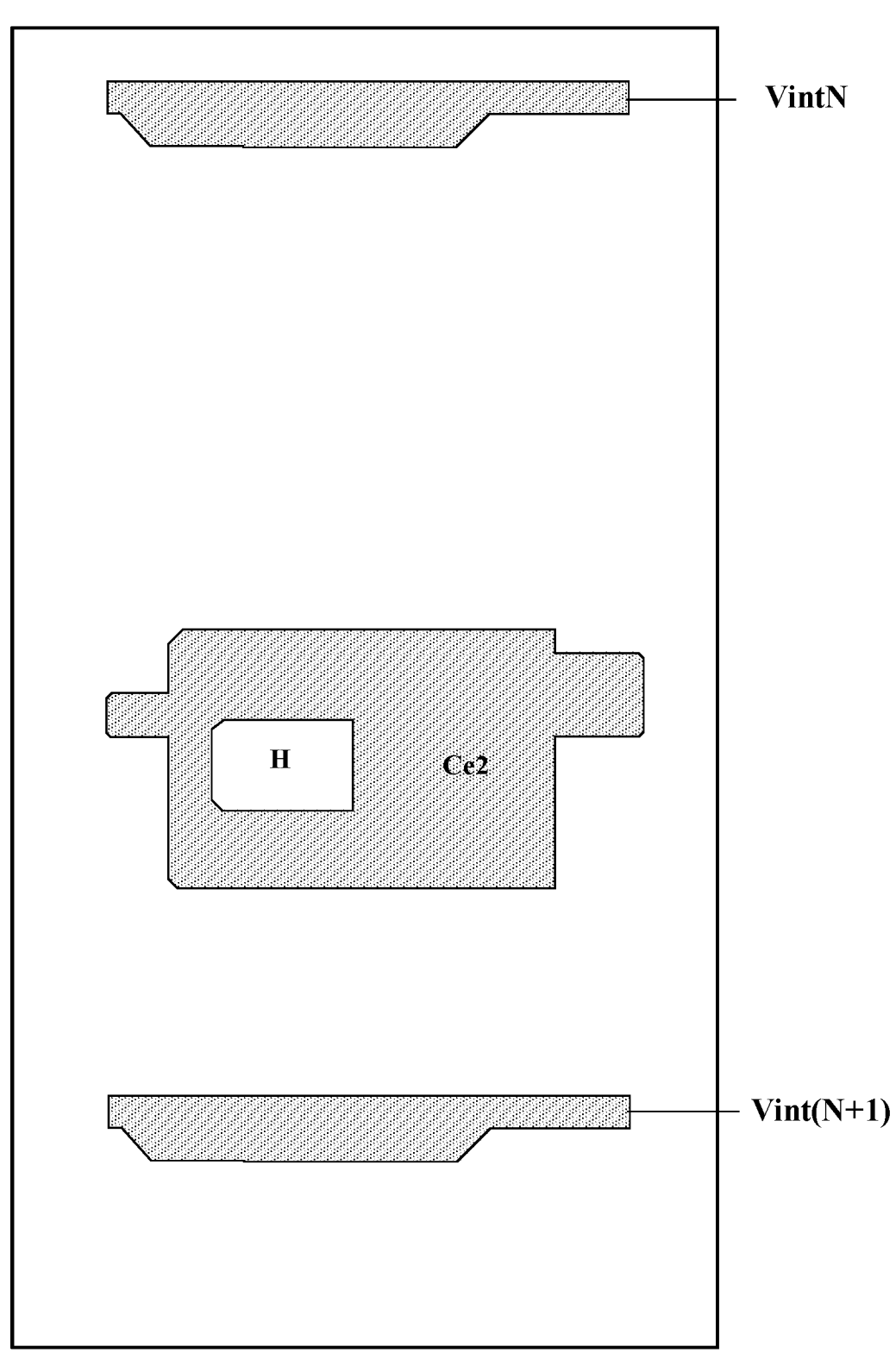
FIG. 7D is a diagram illustrating the structure of a second conductive layer in an array substrate depicted in FIG. 7A.
Figure 7E:
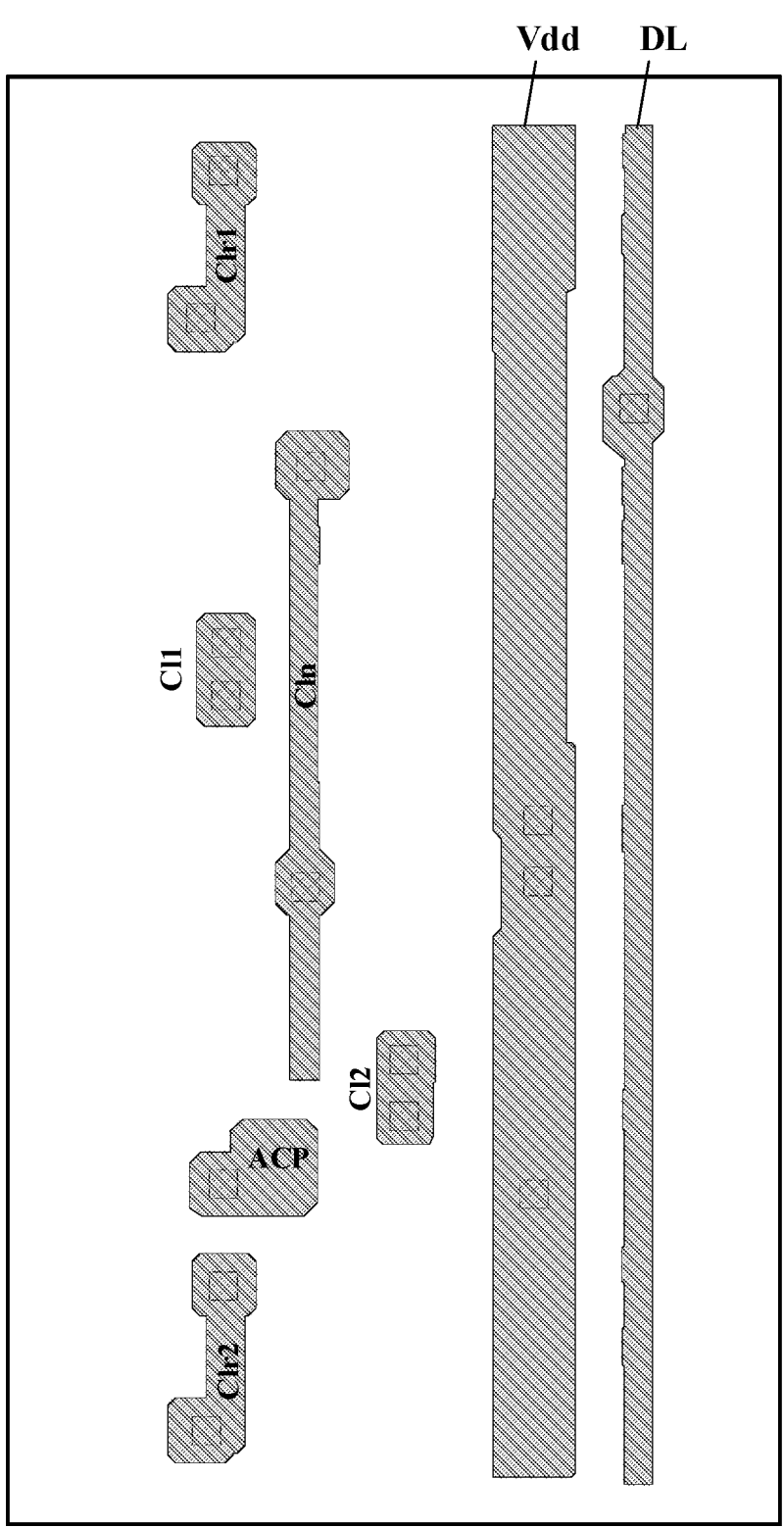
FIG. 7E is a diagram illustrating the structure of a first signal line layer in an array substrate depicted in FIG. 7A.

FIG. 7A is a diagram illustrating the structure of an array substrate in some embodiments according to the present disclosure. FIG. 7B is a diagram illustrating the structure of a semiconductor material layer in an array substrate depicted in FIG. 7A. FIG. 7C is a diagram illustrating the structure of a first conductive layer in an array substrate depicted in FIG. 7A. FIG. 7D is a diagram illustrating the structure of a second conductive layer in an array substrate depicted in FIG. 7A. FIG. 7E is a diagram illustrating the structure of a first signal line layer in an array substrate depicted in FIG. 7A.

Referring to FIG. 7A to FIG. 7E, in some embodiments, a gate electrode of the first auxiliary transistor T7 is a portion of the node connecting line Cln. An orthographic projection of a second electrode D7 of the first auxiliary transistor T7 on a base substrate at least partially overlaps with an orthographic projection of the second capacitor electrode Ce2 on the base substrate. Optionally, the orthographic projection of a second electrode D7 of the first auxiliary transistor T7 on the base substrate at least partially overlaps with an orthographic projection of the first capacitor electrode Ce1 on the base substrate. Optionally, an orthographic projection of the active layer ACT7 of the first auxiliary transistor T7 on the base substrate is non-overlapping with the orthographic projection of the first capacitor electrode Ce1 on the base substrate. Optionally, the orthographic projection of the active layer ACT7 of the first auxiliary transistor T7 on the base substrate is non-overlapping with the orthographic projection of the second capacitor electrode Ce2 on the base substrate.

Referring to FIG. 7A to FIG. 7E, in some embodiments, a gate electrode of the second auxiliary transistor T8 is a portion of the node connecting line Cln. An orthographic projection of a second electrode D8 of the second auxiliary transistor T8 on a base substrate at least partially overlaps with an orthographic projection of the second capacitor electrode Ce2 on the base substrate. Optionally, the orthographic projection of a second electrode D8 of the second auxiliary transistor T8 on the base substrate at least partially overlaps with an orthographic projection of the first capacitor electrode Ce1 on the base substrate. Optionally, an orthographic projection of the active layer ACT8 of the second auxiliary transistor T8 on the base substrate is non-overlapping with the orthographic projection of the first capacitor electrode Ce1 on the base substrate. Optionally, the orthographic projection of the active layer ACT8 of the second auxiliary transistor T8 on the base substrate is non-overlapping with the orthographic projection of the second capacitor electrode Ce2 on the base substrate.

Figure 8:
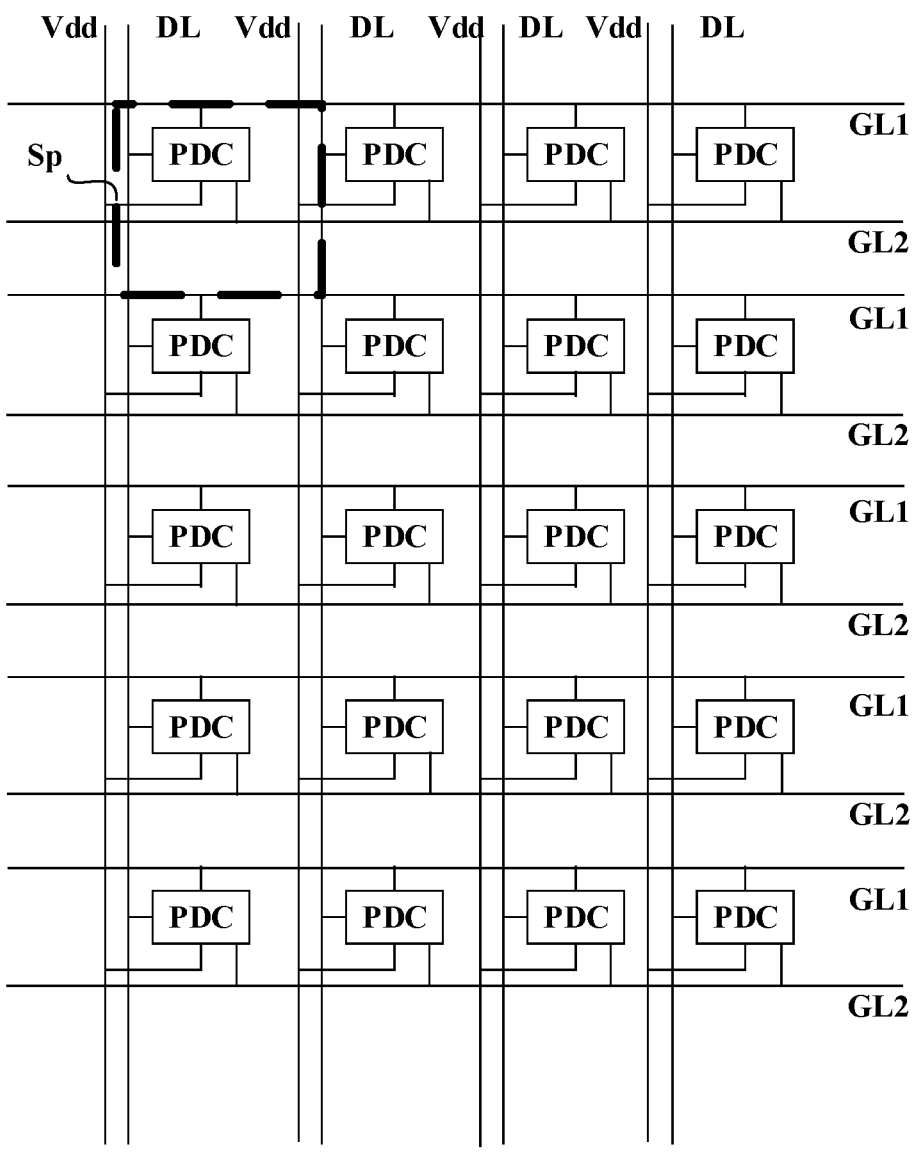
FIG. 8 is a plan view of an array substrate in some embodiments according to the present disclosure.

FIG. 8 is a plan view of an array substrate in some embodiments according to the present disclosure. Referring to FIG. 8, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of voltage supply line Vdd, and a respective second voltage supply line (e.g., a low voltage supply line Vss). Light emission in a respective subpixel Sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Figure 9A:
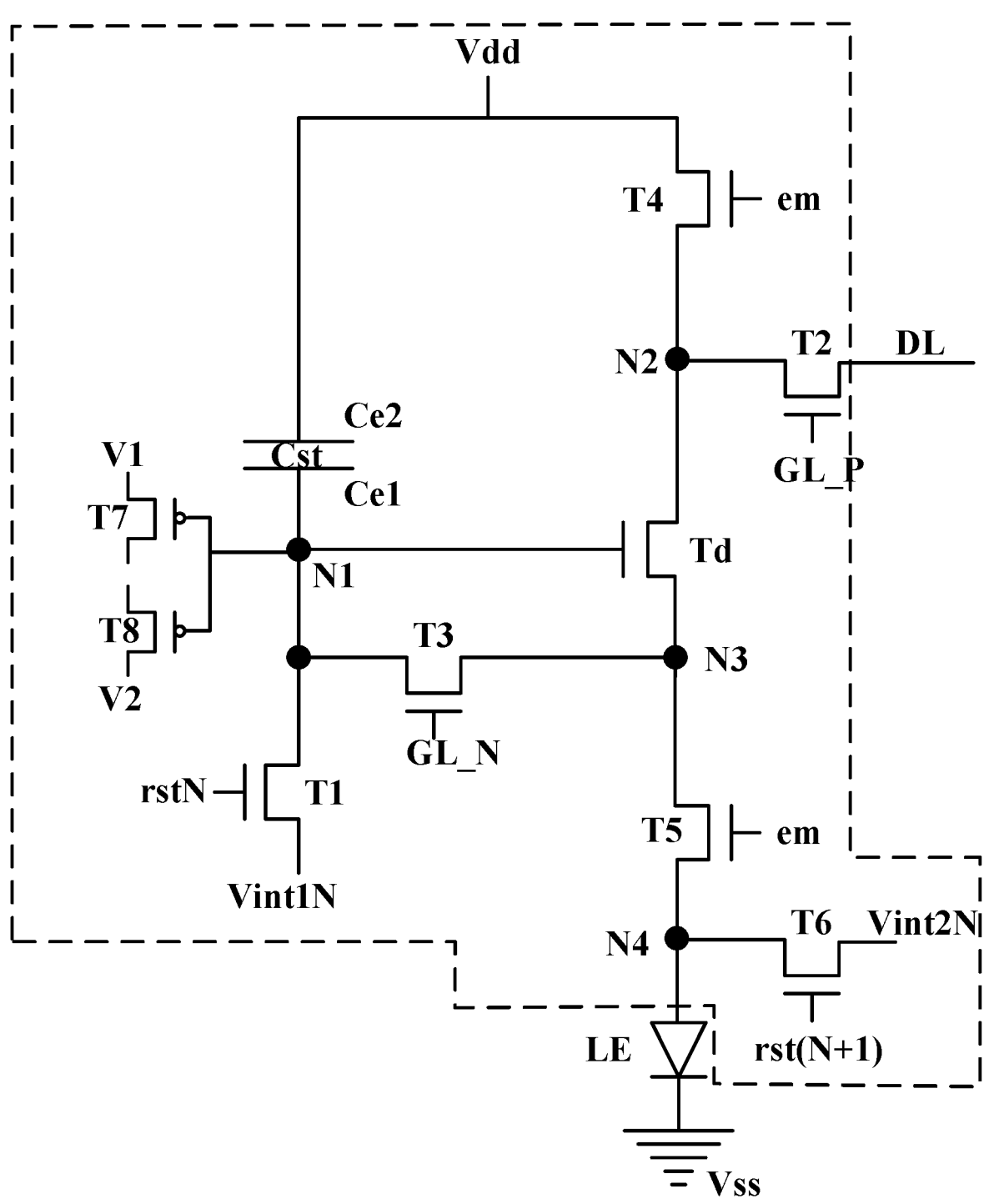
FIG. 9A is a circuit diagram illustrating the structure of a pixel driving circuit in some embodiments according to the present disclosure.

FIG. 9A is a circuit diagram illustrating the structure of a pixel driving circuit in some embodiments according to the present disclosure. Referring to FIG. 9A, in some embodiments, the respective pixel driving circuit includes a driving transistor Td; a storage capacitor Cst having a first capacitor electrode Ce1 and a second capacitor electrode Ce2; at least one auxiliary transistor configured to protect a channel part of an active layer of the driving transistor Td. In some embodiments, an orthographic projection of the first capacitor electrode Ce1 on a base substrate at least partially overlaps with an orthographic projection of a second electrode of the at least one auxiliary transistor on a base substrate. In some embodiments, the orthographic projection of the first capacitor electrode Ce1 on a base substrate at least partially overlaps with an orthographic projection of an active layer of the driving transistor Td on the base substrate. In some embodiments, an orthographic projection of the first capacitor electrode Ce1 on a base substrate at least partially overlaps with an orthographic projection of a second electrode of the at least one auxiliary transistor on a base substrate, and overlaps with an orthographic projection of an active layer of the driving transistor Td on a base substrate. In some embodiments, an orthographic projection of the first capacitor electrode Ce1 on a base substrate at least partially overlaps with an orthographic projection of an active layer of the at least one auxiliary transistor on a base substrate, and overlaps with an orthographic projection of an active layer of the driving transistor Td on a base substrate. Optionally, an orthographic projection of the first capacitor electrode Ce1 on a base substrate overlaps with an orthographic projection of an active layer of the at least one auxiliary transistor on a base substrate, and overlaps with an orthographic projection of an active layer of the driving transistor Td on a base substrate. Optionally, a gate electrode of the at least one auxiliary transistor is coupled to a gate electrode of the driving transistor Td. Optionally, the active layer of the at least one auxiliary transistor and the active layer of the driving transistor Td are in a same layer.

In some embodiments, the respective pixel driving circuit includes a first auxiliary transistor T7. A gate electrode of the first auxiliary transistor T7 is coupled to the gate electrode of the driving transistor Td. Optionally, at least a portion of the first capacitor electrode Ce1 is the gate electrode of the first auxiliary transistor T7, and at least another portion of the first capacitor electrode Ce1 is the gate electrode of the driving transistor Td. A first electrode of the first auxiliary transistor T7 is coupled to a first voltage signal line V1. Optionally, a second electrode of the first auxiliary transistor T7 is floating. In one example, the first voltage signal line V1 is configured to provide a first level voltage signal (e.g., a high level voltage signal) during at least a light emitting sub-phase of one frame of image. In another example, the first voltage signal line V1 is configured to provide a second level voltage signal (e.g., a low level voltage signal) during at least a light emitting sub-phase of one frame of image.

In some embodiments, an orthographic projection of the first capacitor electrode Ce1 on a base substrate at least partially overlaps with an orthographic projection of a second electrode of the first auxiliary transistor T7 on a base substrate, and overlaps with an orthographic projection of an active layer of the driving transistor Td on a base substrate. In some embodiments, an orthographic projection of the first capacitor electrode Ce1 on a base substrate at least partially overlaps with an orthographic projection of an active layer of the first auxiliary transistor T7 on a base substrate, and overlaps with an orthographic projection of an active layer of the driving transistor Td on a base substrate. In one example, the gate electrode of the first auxiliary transistor T7 is coupled to the gate electrode of the driving transistor Td and/or the first capacitor electrode Ce1. In another example, the gate electrode of the first auxiliary transistor T7 is independently provided, for example, the gate electrode of the first auxiliary transistor T7 is electrically separated from the gate electrode of the driving transistor Td and/or the first capacitor electrode Ce1.

In some embodiments, the respective pixel driving circuit includes a second auxiliary transistor T8. A gate electrode of the second auxiliary transistor T8 is coupled to the gate electrode of the driving transistor Td. Optionally, at least a portion of the first capacitor electrode Ce1 is the gate electrode of the second auxiliary transistor T8, and at least another portion of the first capacitor electrode Ce1 is the gate electrode of the driving transistor Td. A first electrode of the second auxiliary transistor T8 is coupled to a second voltage signal line V2. Optionally, a second electrode of the second auxiliary transistor T8 is floating. In one example, the second voltage signal line V2 is configured to provide a second level voltage signal (e.g., a low level voltage signal) during at least a light emitting sub-phase of one frame of image. In one example, the second voltage signal line V2 is configured to provide a first level voltage signal (e.g., a high level voltage signal) during at least a light emitting sub-phase of one frame of image.

In some embodiments, an orthographic projection of the first capacitor electrode Ce1 on a base substrate at least partially overlaps with an orthographic projection of a second electrode of the second auxiliary transistor T8 on a base substrate, and overlaps with an orthographic projection of an active layer of the driving transistor Td on a base substrate. In some embodiments, an orthographic projection of the first capacitor electrode Ce1 on a base substrate at least partially overlaps with an orthographic projection of an active layer of the second auxiliary transistor T8 on a base substrate, and overlaps with an orthographic projection of an active layer of the driving transistor Td on a base substrate. In one example, the gate electrode of the second auxiliary transistor T8 is coupled to the gate electrode of the driving transistor Td and/or the first capacitor electrode Ce1. In another example, the gate electrode of the second auxiliary transistor T8 is independently provided, for example, the gate electrode of the second auxiliary transistor T8 is electrically separated from the gate electrode of the driving transistor Td and/or the first capacitor electrode Ce1.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. FIG. 9A illustrates an example in which the transistors are n-type transistors. However, the present disclosure may be implemented in pixel driving circuit having transistors of p-type transistors.

Referring to FIG. 9A, the respective pixel driving circuit in some embodiments further includes a first transistor T1 having a gate electrode connected to a respective reset control signal line rstN of a present stage (or a present row) of a plurality of reset control signal lines, a first electrode connected to a respective first reset signal line of a plurality of first reset signal lines Vint1N, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to a respective reset control signal line rst(N+1) of a next adjacent stage (or a next adjacent row) of a plurality of reset control signal lines, a first electrode connected to a respective second reset signal line of a plurality of second reset signal lines Vint2N, and a second electrode connected to the second electrode of the fifth transistor and the anode of the light emitting element LE. The second capacitor electrode Ce2 is connected to the respective voltage supply line and the first electrode of the fourth transistor T4.

Figure 9B:
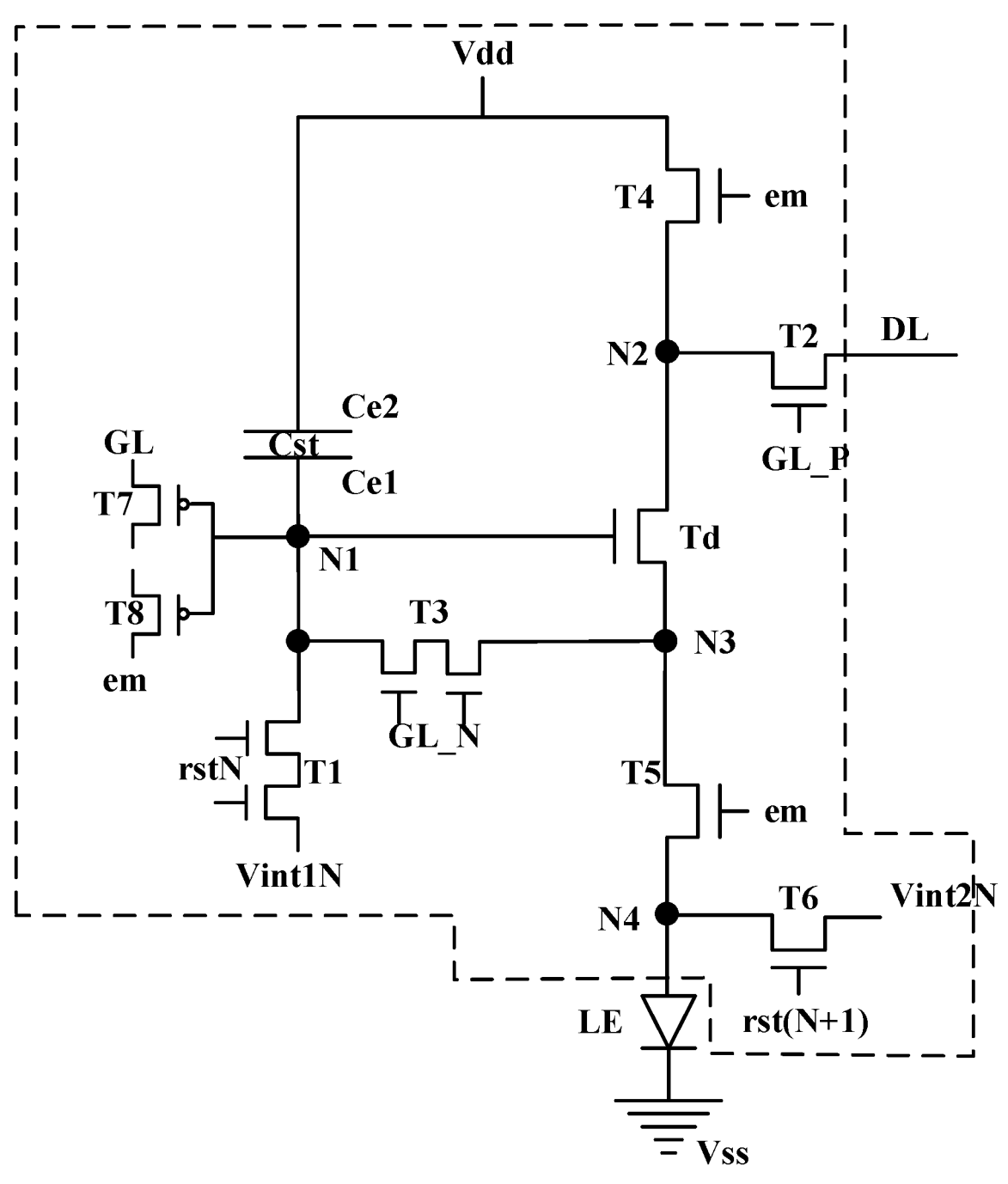
FIG. 9B is a circuit diagram illustrating the structure of a pixel driving circuit in some embodiments according to the present disclosure.

FIG. 9B is a circuit diagram illustrating the structure of a pixel driving circuit in some embodiments according to the present disclosure. Referring to FIG. 9B, in some embodiments, the first voltage signal line is a respective gate line of a plurality of gate lines GL, and the second voltage signal line is a respective light emitting control signal line of a plurality of light emitting control signal lines em. During at least a light emitting sub-phase of one frame of image, the respective gate line is configured to provide a first level voltage signal (e.g., a high level voltage signal), and the respective light emitting control signal line is configured to provide a second level voltage signal (e.g., a low level voltage signal).

The present disclosure may be implemented with various appropriate first voltage signal lines and second voltage signal lines. In another example, the first voltage signal line is a first reference voltage signal line configured to provide a first reference voltage signal having a first level (e.g., a high level), and the second voltage signal line is a second reference voltage signal line configured to provide a second reference voltage signal having a second level (e.g., a low level).

The inventors of the present disclosure discover that one of the reasons for the occurrence of hysteresis of the driving transistor is the effect of electric charges accumulated in the base substrate (e.g., a polyimide base substrate) on a channel part of the driving transistor. The inventors of the present disclosure discover that, surprisingly and unexpectedly, having at least one auxiliary transistor according to the present disclosure can effectively protect the channel part of the driving transistor against the electric charges from the base substrate. In one example, the at least one auxiliary transistor includes a first auxiliary transistor for neutralizing negative charges from the base substrate, the first voltage signal line is configured to provide a high voltage signal during at least a light emitting sub-phase of one frame of image. In another example, the at least one auxiliary transistor includes a second auxiliary transistor for neutralizing positive charges from the base substrate, the second voltage signal line is configured to provide a low voltage signal during at least a light emitting sub-phase of one frame of image.

In another example, the at least one auxiliary transistor includes a first auxiliary transistor and a second auxiliary transistor; wherein the first auxiliary transistor is configured to neutralize negative charges from the base substrate, the first voltage signal line is configured to provide a high voltage signal during at least a light emitting sub-phase of one frame of image; the second auxiliary transistor is configured to neutralize positive charges from the base substrate, the second voltage signal line is configured to provide a low voltage signal during at least a light emitting sub-phase of one frame of image. The inventors of the present disclosure discover that a synergistic effect can be achieved by having both the first auxiliary transistor and the second auxiliary transistor, unexpectedly reducing, or eliminating the hysteresis of the driving transistor to a minimum.

Figure 9C:
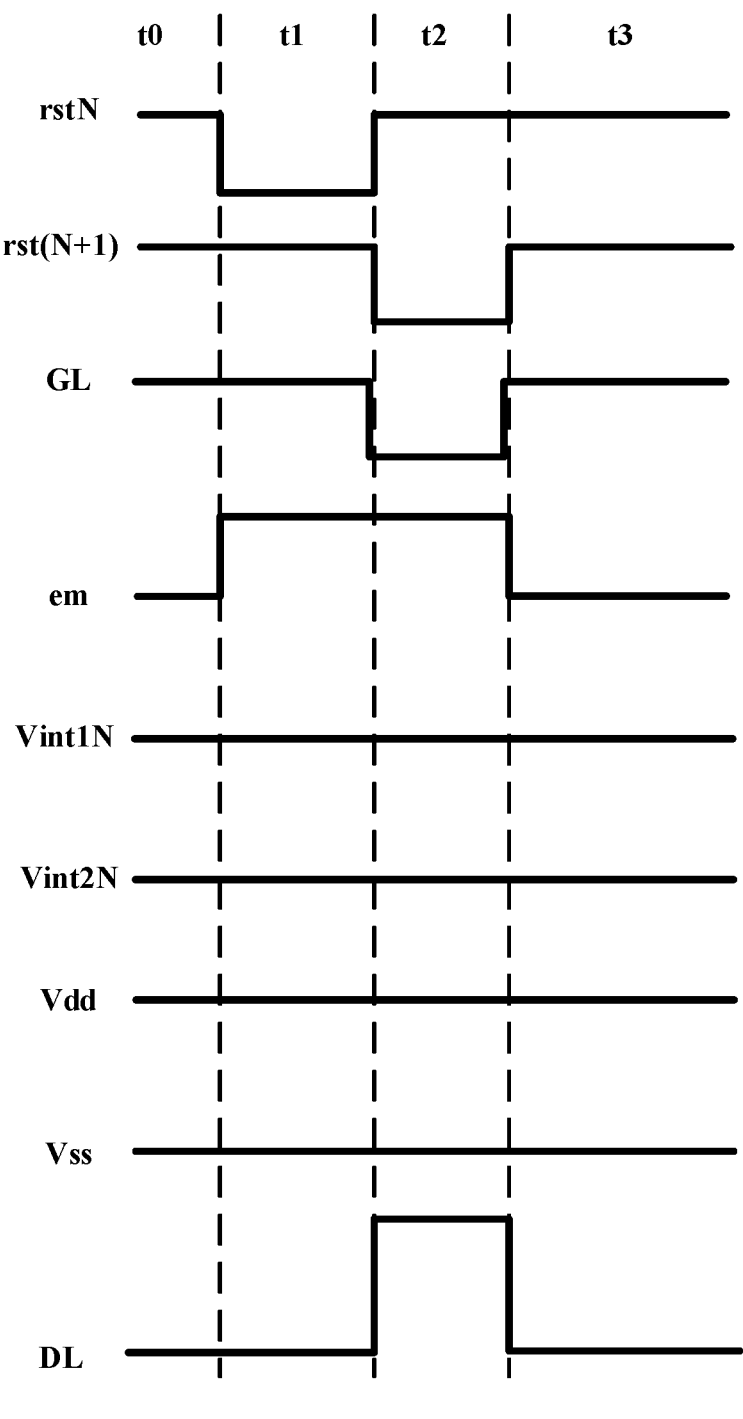
FIG. 9C is a timing diagram illustrating the operation of a pixel driving circuit in some embodiments according to the present disclosure.

FIG. 9C is a timing diagram illustrating the operation of a pixel driving circuit in some embodiments according to the present disclosure. Referring to FIG. 9A, FIG. 9B, and FIG. 9C, during one frame of image, the operation of the pixel driving circuit includes an initial sub-phase t0, a reset sub-phase t1, a data write sub-phase t2, and a light emitting sub-phase t3. In the initial sub-phase t0, a turning-off reset control signal is provided through the respective reset control signal line rstN in a present stage (or a present row) of a plurality of reset control signal lines to the gate electrode of the first transistor T1 to turn off the first transistor T1. In the initial sub-phase t0, the respective gate line of a plurality of gate lines GL is provided with a turning-off signal, thus the second transistor T2 and the third transistor T3 are turned off.

In the reset sub-phase t1, a turning-on reset control signal is provided through the reset control signal line of a present stage rstN to the gate electrode of the first transistor T1 to turn on the first transistor T1; allowing an initialization voltage signal from the respective first reset signal line of a present stage Vint1N to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line of the plurality of voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase t2, the turning-off reset control signal is again provided through the reset control signal line of a present stage rstN to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective reset control signal line rst(N+1) in a next adjacent stage to the gate electrode of the sixth transistor T6 to turn on the sixth transistor T6; allowing an initialization voltage signal from the respective second reset signal line of a present stage Vint2N to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the reset control signal line of a present stage rstN to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

In the light emitting sub-phase t3, the respective gate line of a plurality of gate lines GL is provided with a high voltage signal, and the respective light emitting control signal line of the plurality of light emitting control signal lines em is provided with a low voltage signal. The first electrode of the first auxiliary transistor T7 is provided with a high voltage signal, the first electrode of the second auxiliary transistor T8 is provided with a low voltage signal. During the light emitting sub-phase t3, the first electrode of the first auxiliary transistor T7 and the second auxiliary transistor T8 are turned on by a voltage signal at the N1 node. The high voltage signal passes from the first electrode of the first auxiliary transistor T7 to the second electrode of the first auxiliary transistor T7, thereby neutralizing negative charges that may adversely affect the channel part of the driving transistor Td. The low voltage signal passes from the first electrode of the second auxiliary transistor T8 to the second electrode of the second auxiliary transistor T8, thereby neutralizing positive charges that may adversely affect the channel part of the driving transistor Td.

Figure 9D:
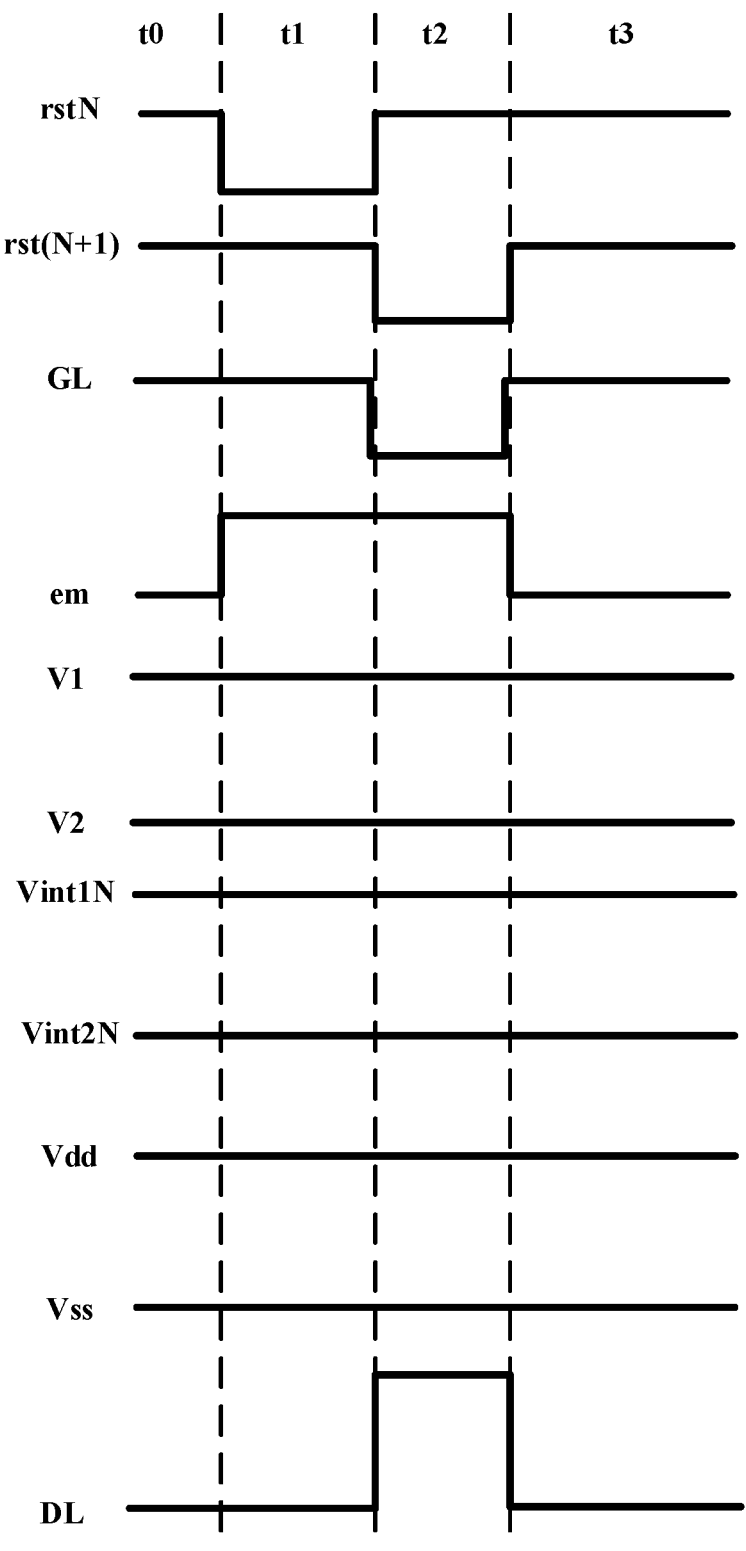
FIG. 9D is a timing diagram illustrating the operation of a pixel driving circuit in some embodiments according to the present disclosure.

FIG. 9D is a timing diagram illustrating the operation of a pixel driving circuit in some embodiments according to the present disclosure. Referring to FIG. 9A and FIG. 9D, in some embodiments, the first voltage signal line V1 is independent of the respective gate line of the plurality of gate lines GL, and the second voltage signal line V2 is independent of the respective light emitting control signal line of the plurality of light emitting control signal lines em. In one example as depicted in FIG. 2D, the first voltage signal line V1 is configured to provide a high voltage signal in at least the light emitting sub-phase t3, and the second voltage signal line V2 is configured to provide a low voltage signal in at least the light emitting sub-phase t3.

Figure 9E:
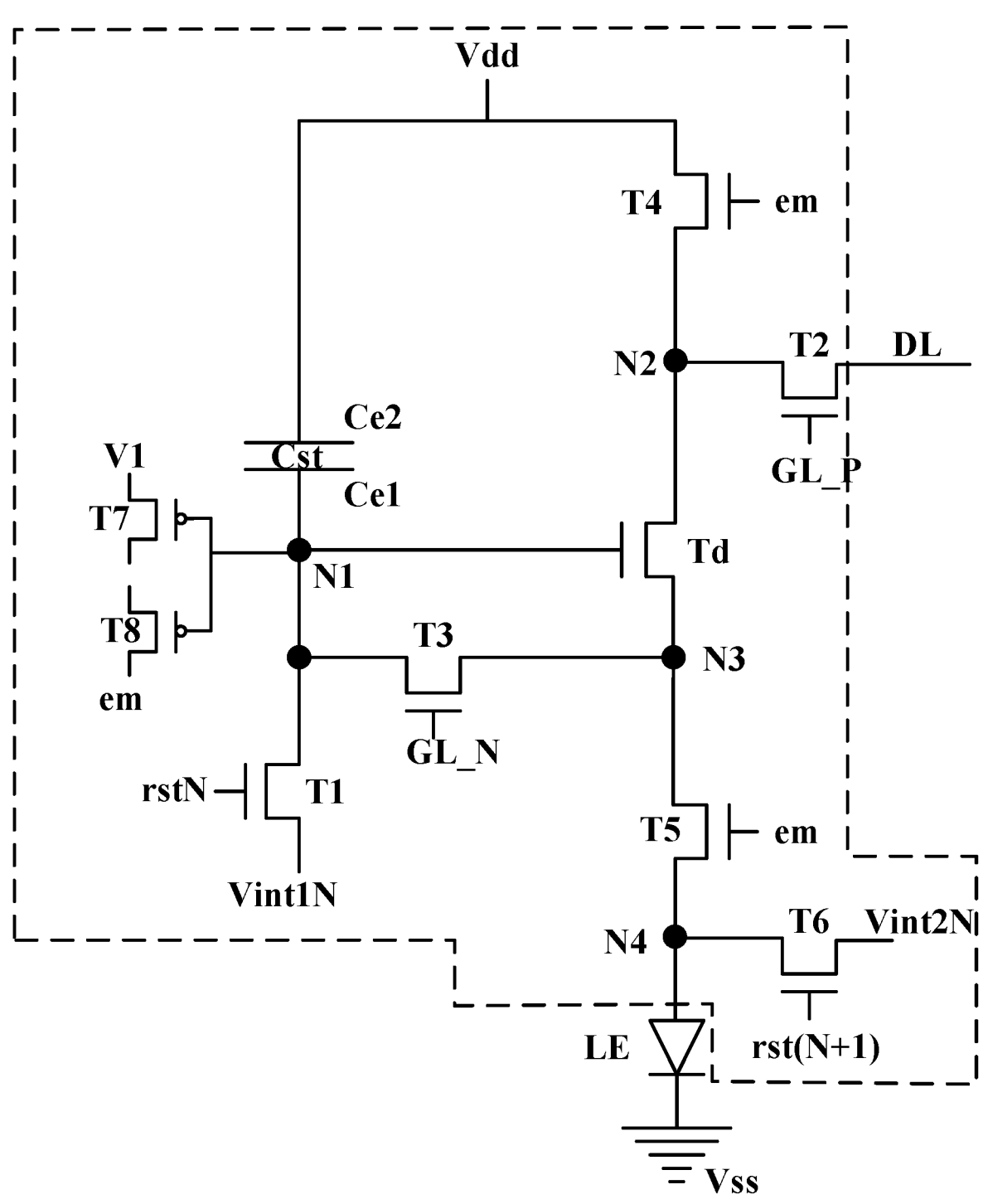
FIG. 9E is a circuit diagram illustrating the structure of a pixel driving circuit in some embodiments according to the present disclosure.

Various appropriate combinations and permutations of embodiments may be implemented. FIG. 9E is a circuit diagram illustrating the structure of a pixel driving circuit in some embodiments according to the present disclosure. Referring to FIG. 9E, in some embodiments, the first electrode of the first auxiliary transistor T7 is coupled to a first voltage signal line V1, and the first electrode of the second auxiliary transistor T8 is coupled to a respective light emitting control signal line of a plurality of light emitting control signal lines em. The first voltage signal line V1 is independent of the respective gate line of the plurality of gate lines GL.

Figure 9F:
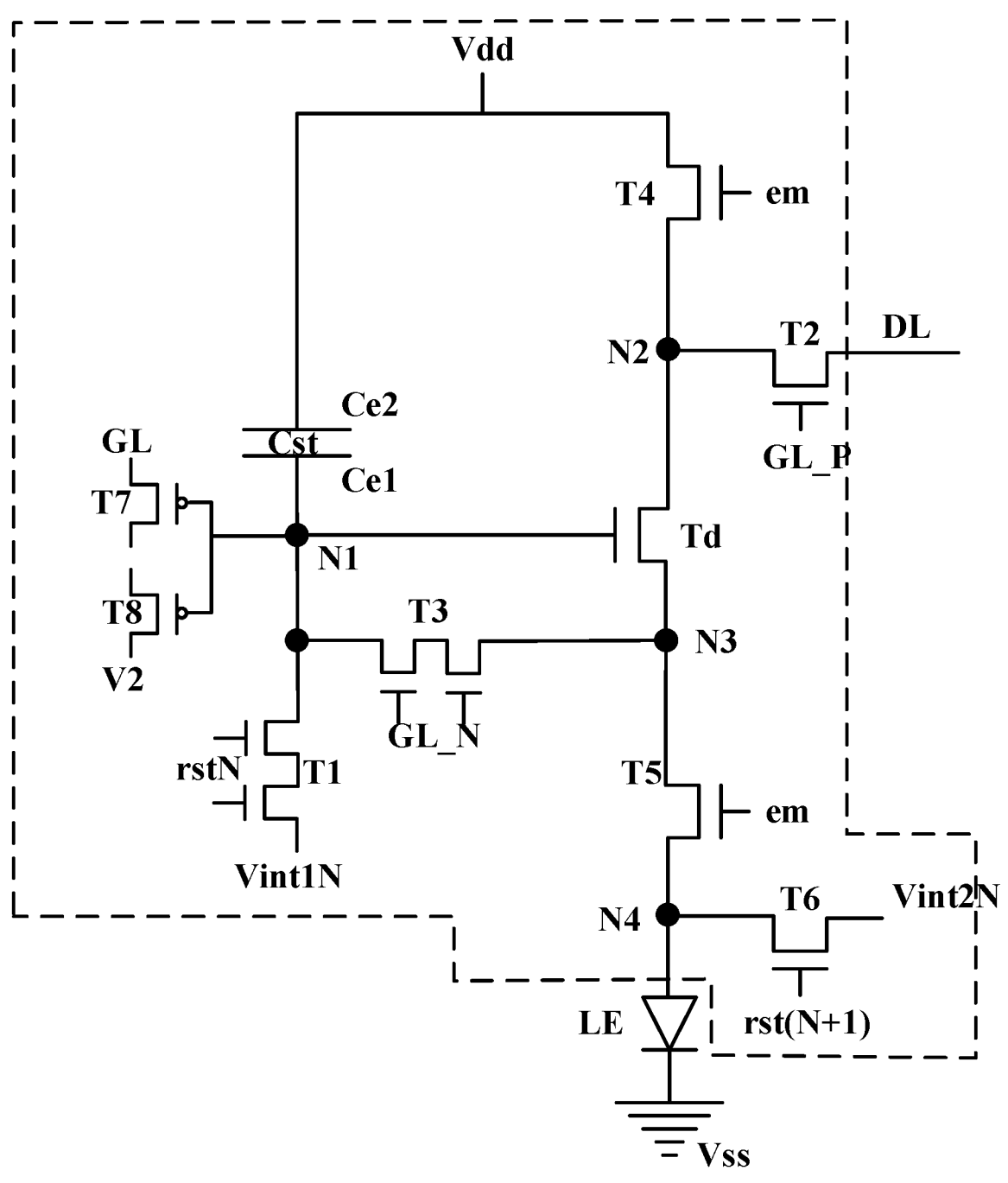
FIG. 9F is a circuit diagram illustrating the structure of a pixel driving circuit in some embodiments according to the present disclosure.

FIG. 9F is a circuit diagram illustrating the structure of a pixel driving circuit in some embodiments according to the present disclosure. Referring to FIG. 9F, in some embodiments, the first electrode of the first auxiliary transistor T7 is coupled to a respective gate line of the plurality of gate lines GL, and the first electrode of the second auxiliary transistor T8 is coupled to a second voltage signal line V2. The second voltage signal line V2 is independent of the respective light emitting control signal line of the plurality of light emitting control signal lines em.

Figure 10A:
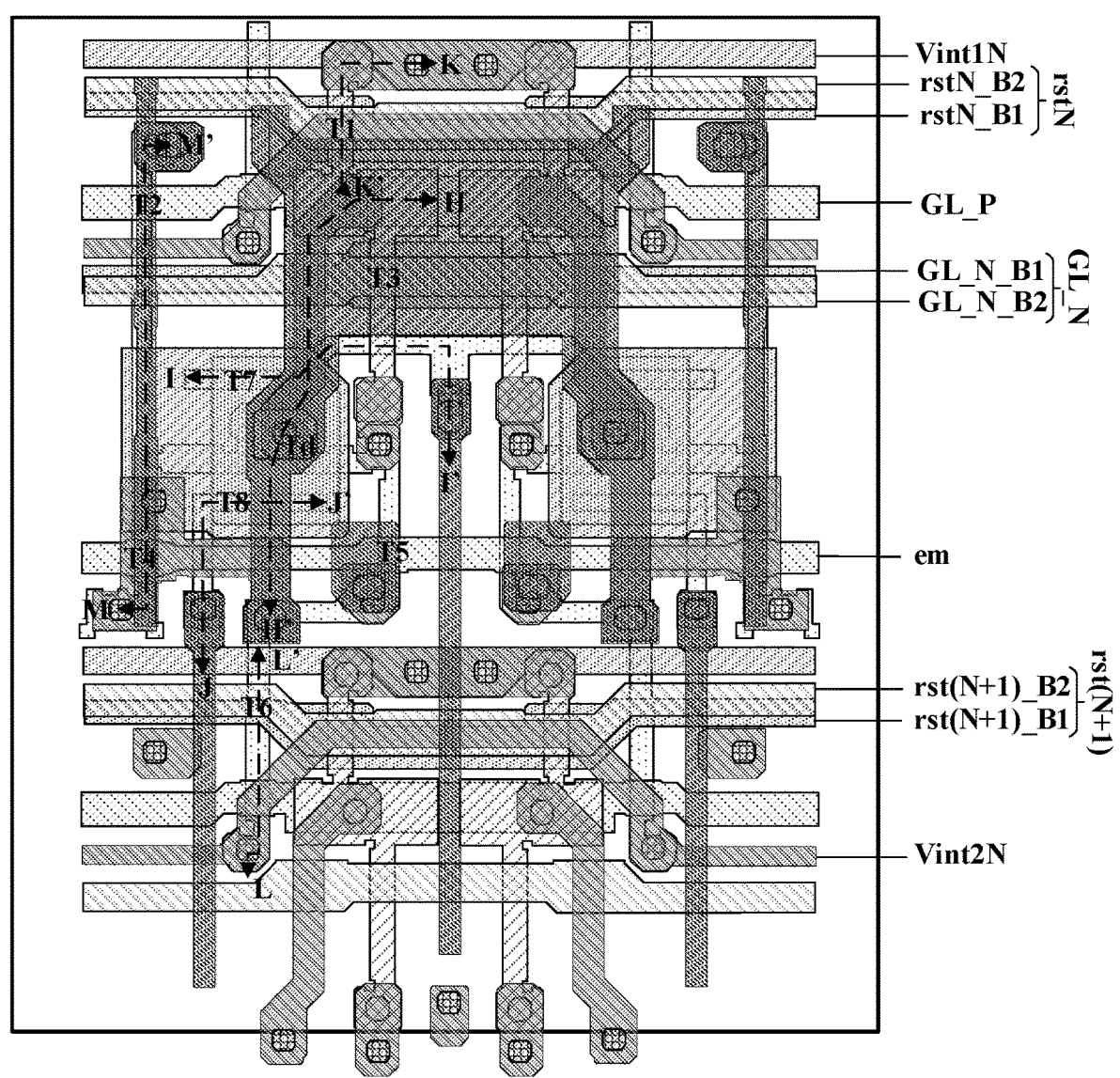
FIG. 10A is a diagram illustrating the structure of two adjacent pixel driving circuits in an array substrate in some embodiments according to the present disclosure.
Figure 10B:
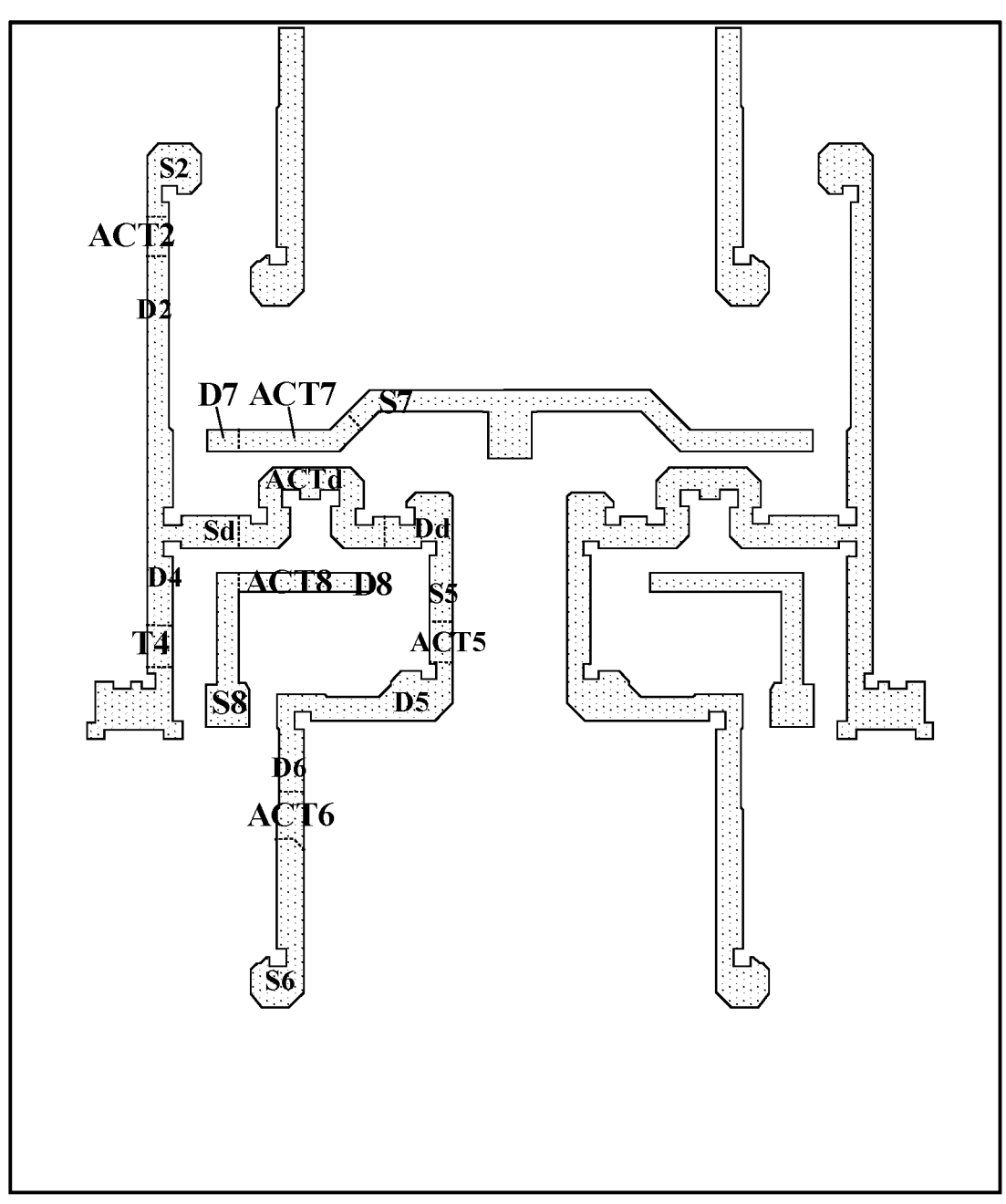
FIG. 10B is a diagram illustrating the structure of a semiconductor material layer of two adjacent pixel driving circuits in an array substrate depicted in FIG. 10A.
Figure 10C:
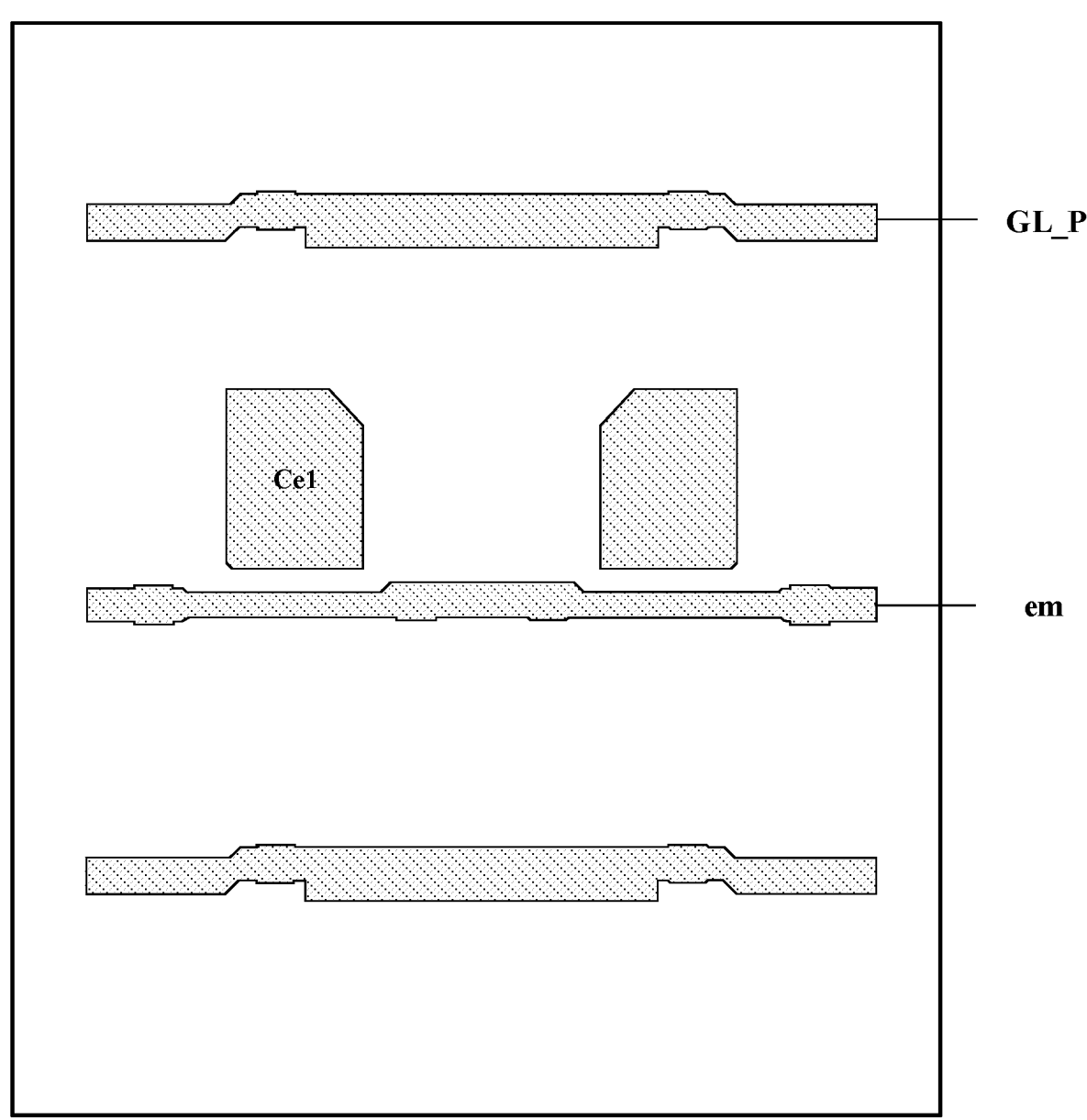
FIG. 10C is a diagram illustrating the structure of a first conductive layer of two adjacent pixel driving circuits in an array substrate depicted in FIG. 10A.
Figure 10D:
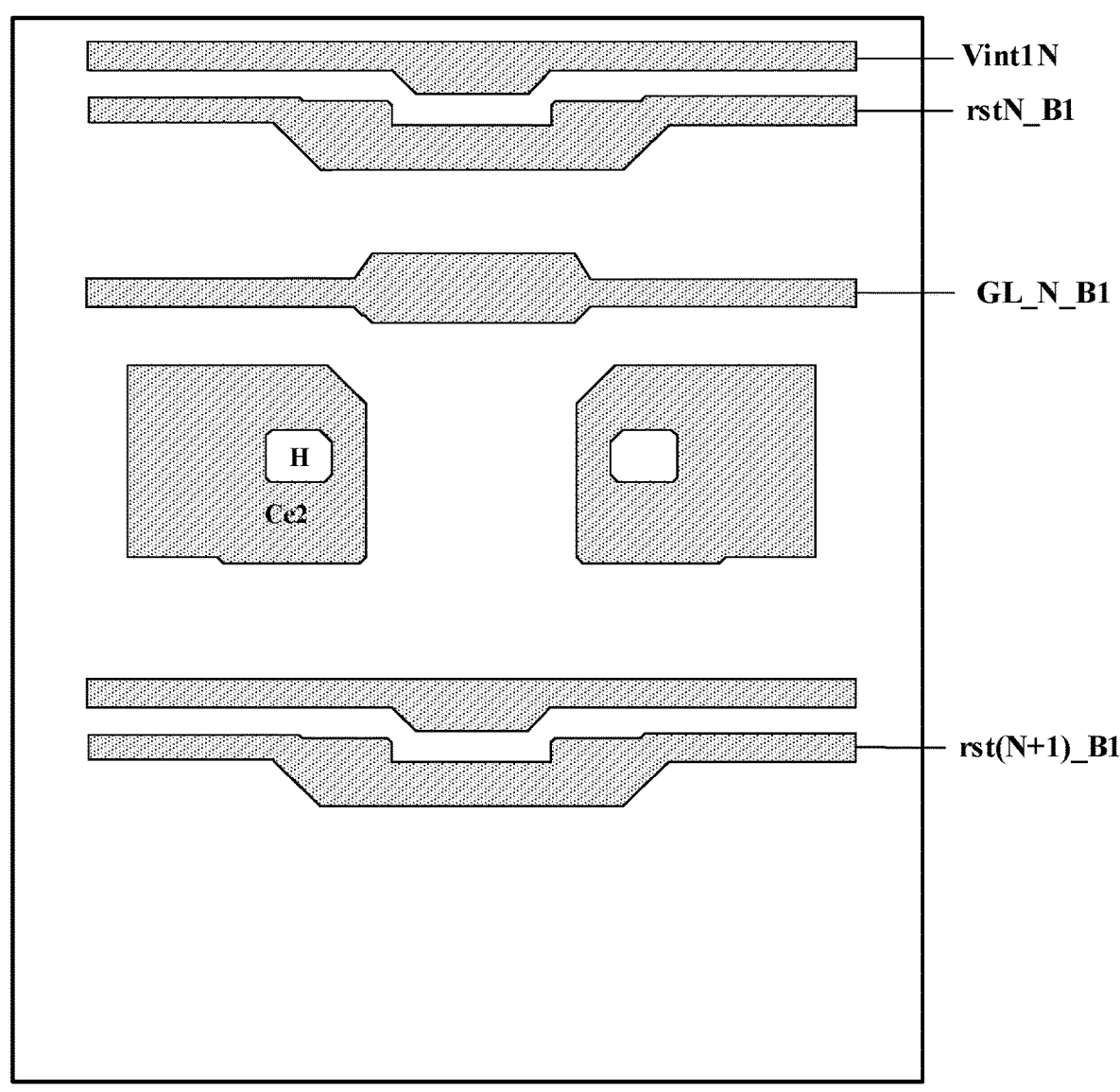
FIG. 10D is a diagram illustrating the structure of a second conductive layer of two adjacent pixel driving circuits in an array substrate depicted in FIG. 10A.
Figure 10E:
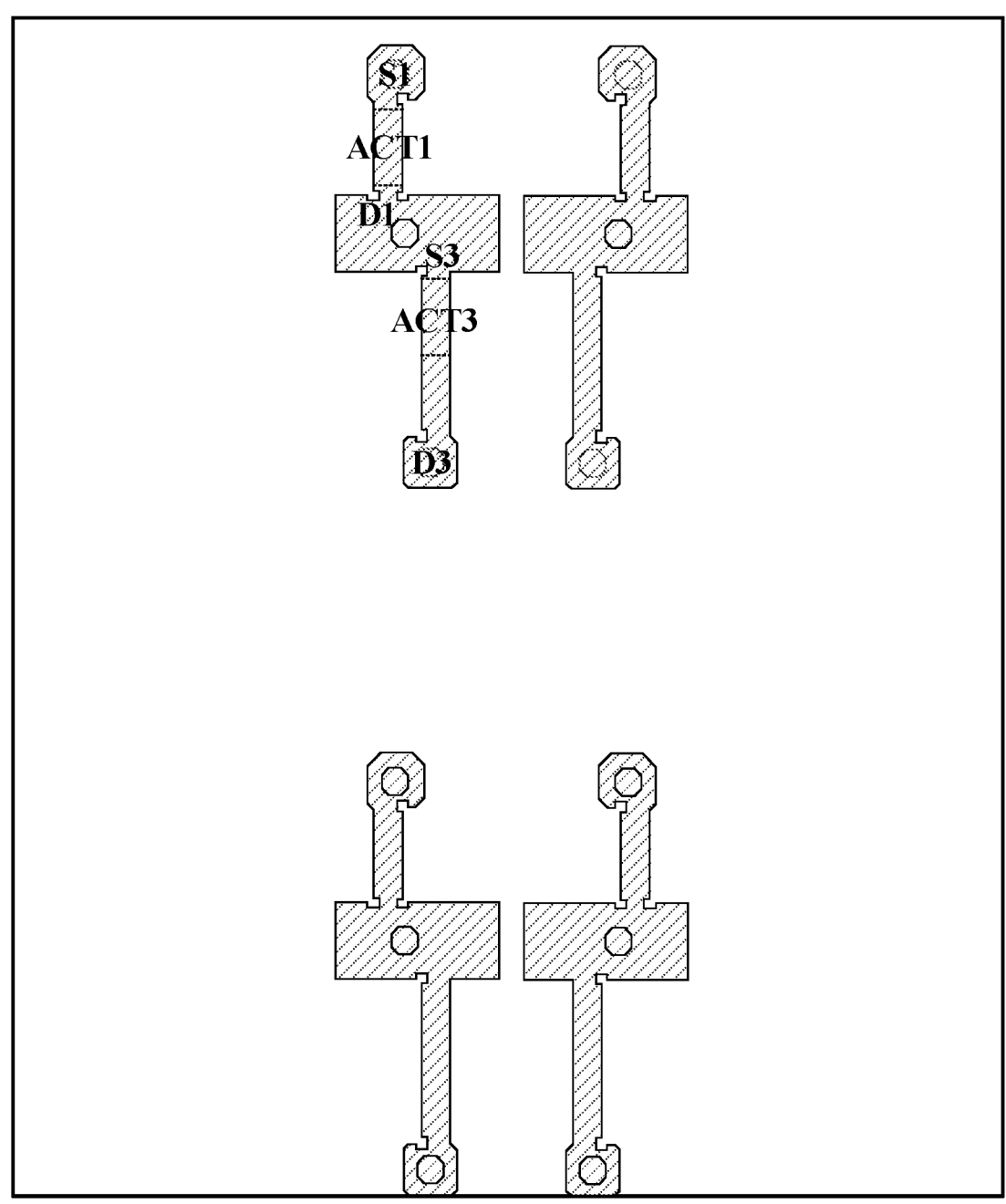
FIG. 10E is a diagram illustrating the structure of a second semiconductor material layer of two adjacent pixel driving circuits in an array substrate depicted in FIG. 10A.
Figure 10F:
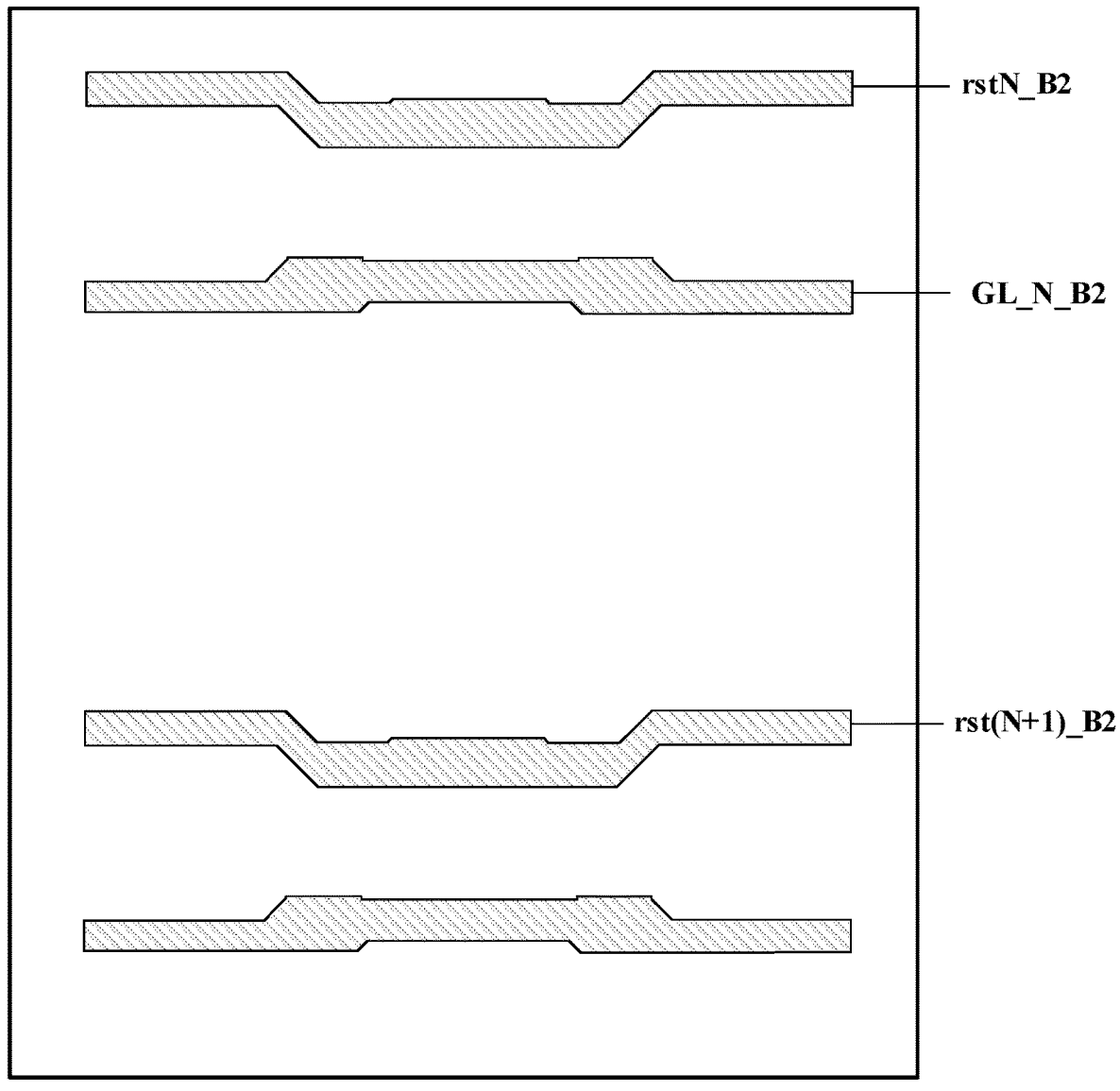
FIG. 10F is a diagram illustrating the structure of a third conductive layer of two adjacent pixel driving circuits in an array substrate depicted in FIG. 10A.
Figure 10G:
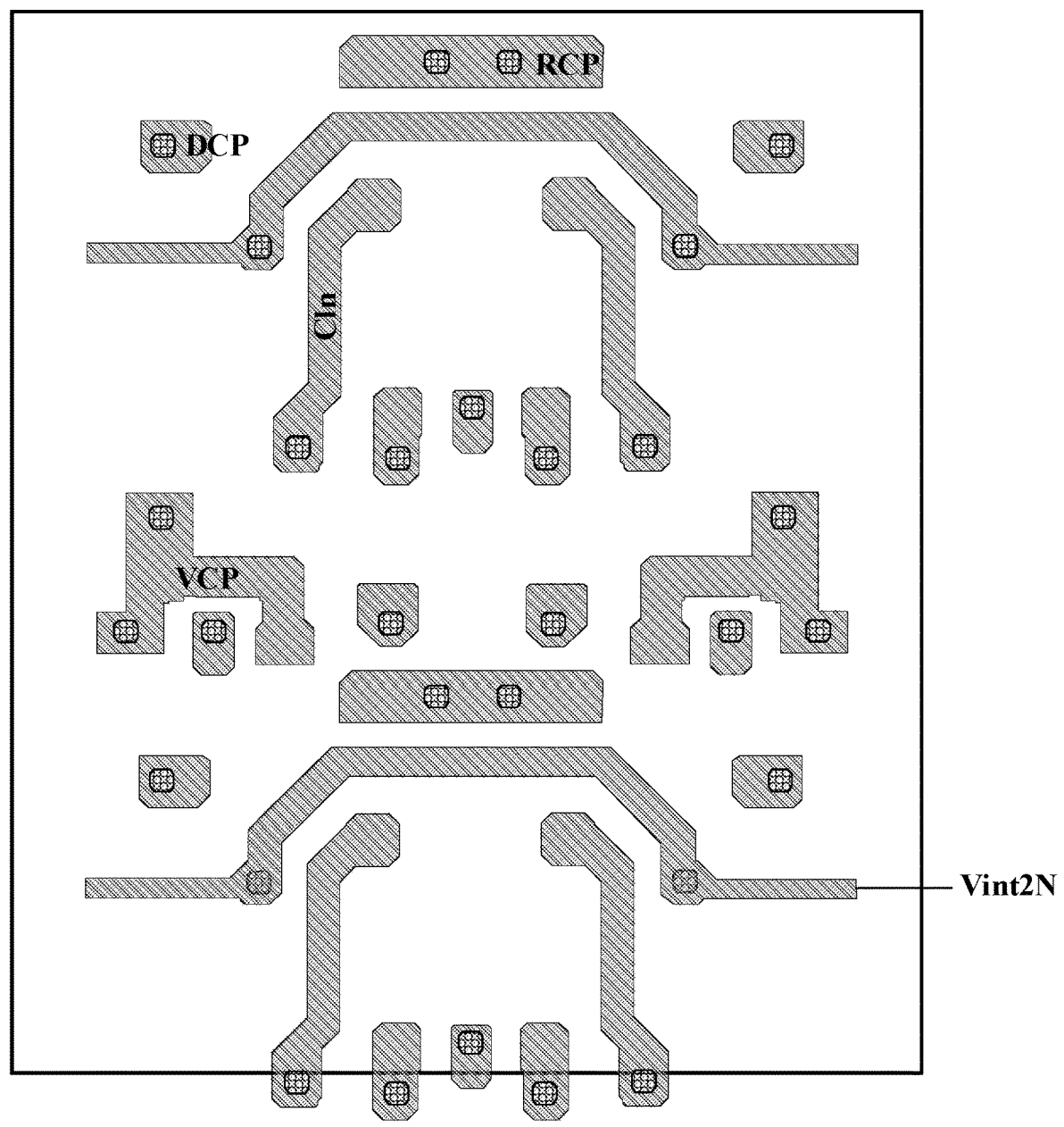
FIG. 10G is a diagram illustrating the structure of a first signal line layer of two adjacent pixel driving circuits in an array substrate depicted in FIG. 10A.
Figure 10H:
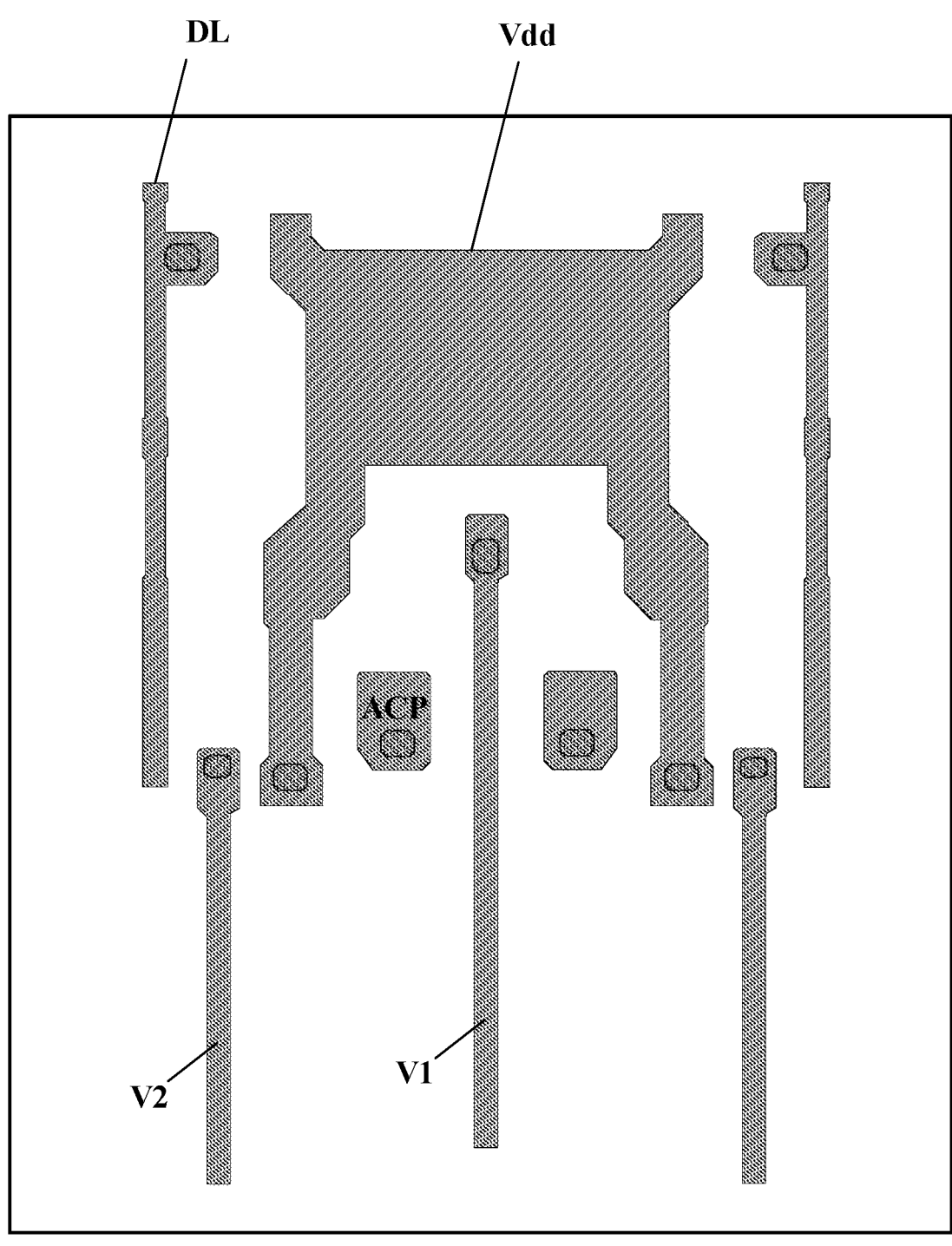
FIG. 10H is a diagram illustrating the structure of a second signal line layer of two adjacent pixel driving circuits in an array substrate depicted in FIG. 10A.
Figure 11A:
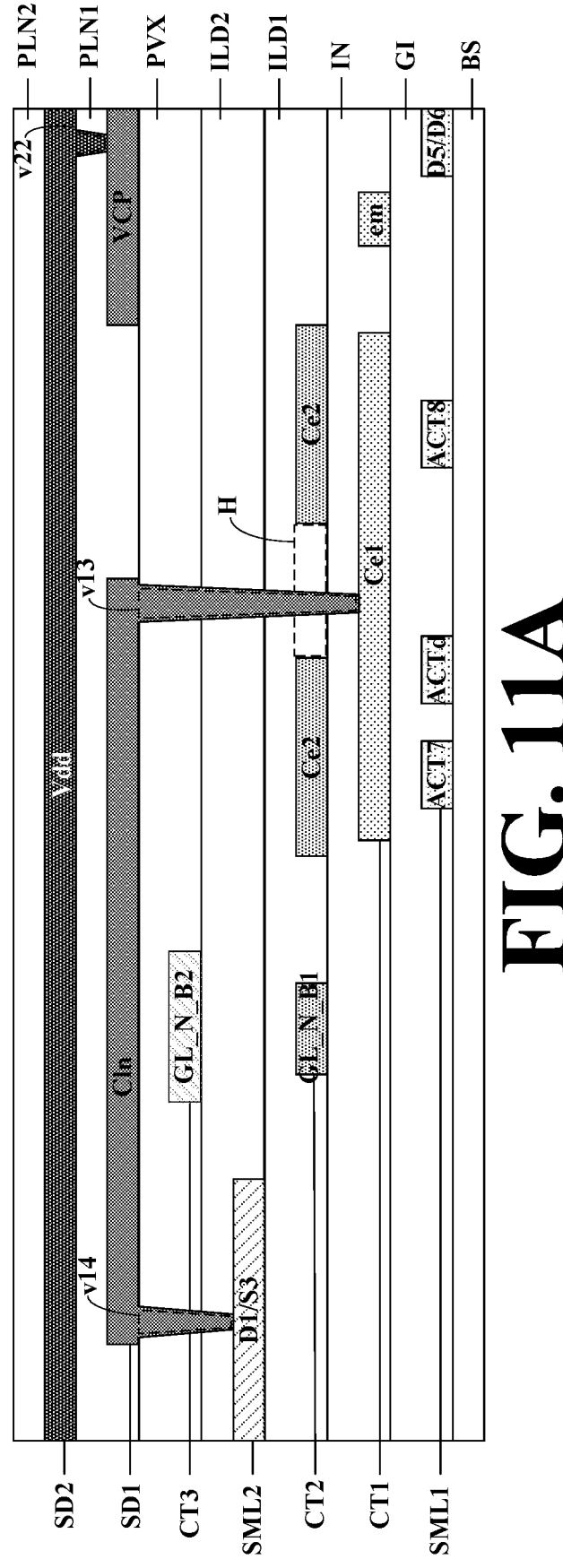
FIG. 11A is a cross-sectional view along an H-H' line in FIG. 10A.
Figure 11B:
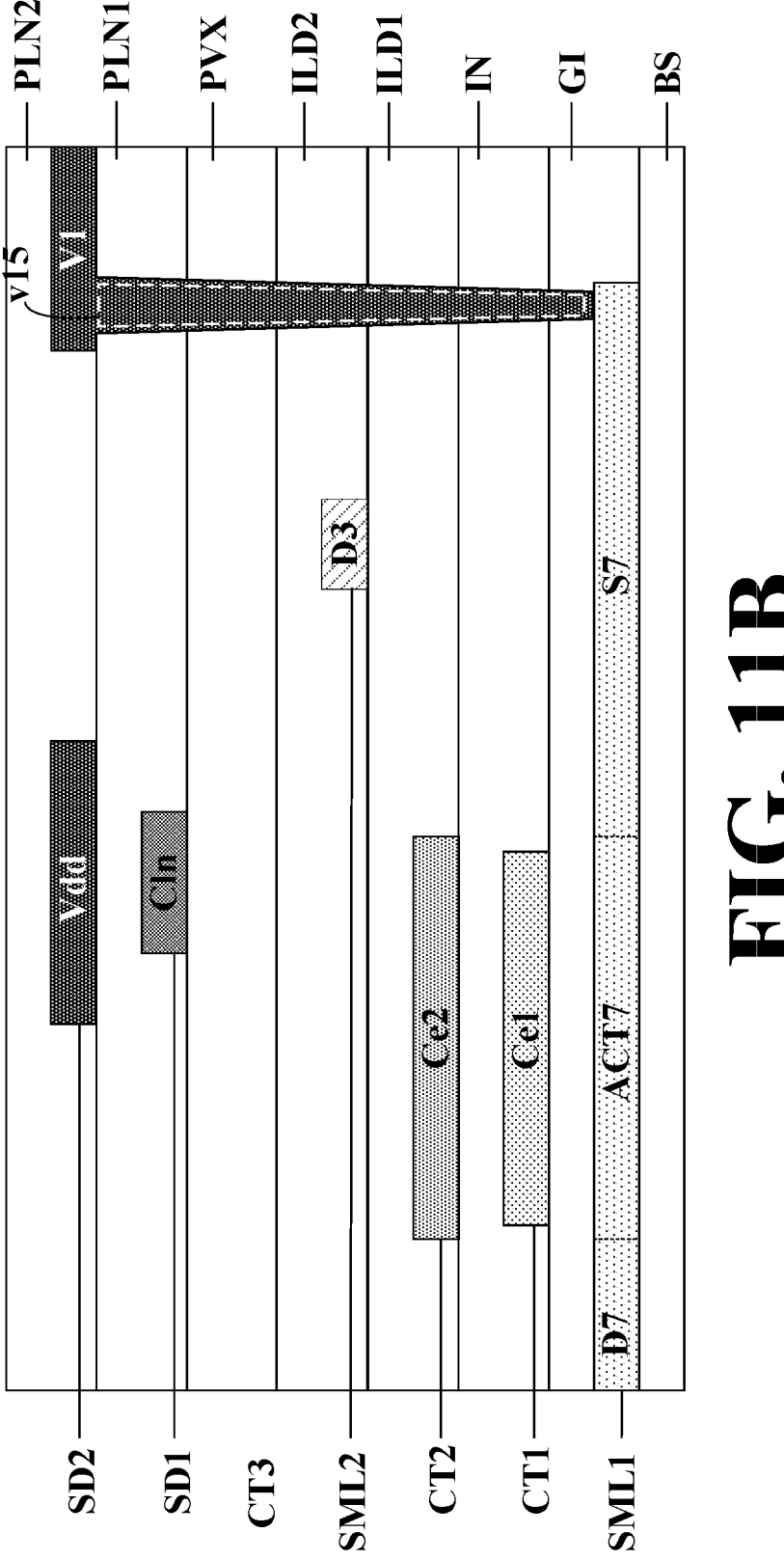
FIG. 11B is a cross-sectional view along an I-I' line in FIG. 10A.
Figure 11C:
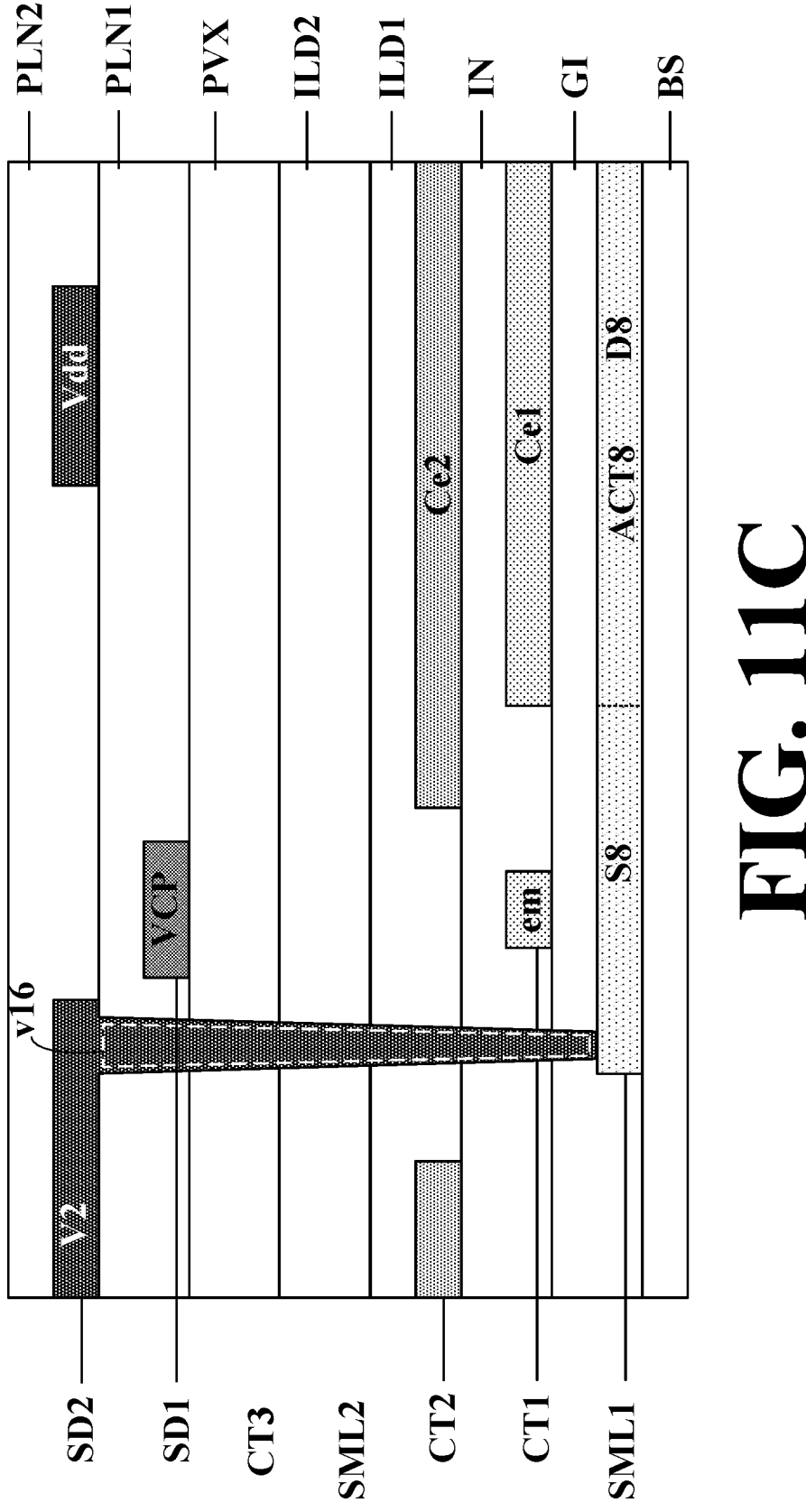
FIG. 11C is a cross-sectional view along a J-J' line in FIG. 10A.
Figure 11D:
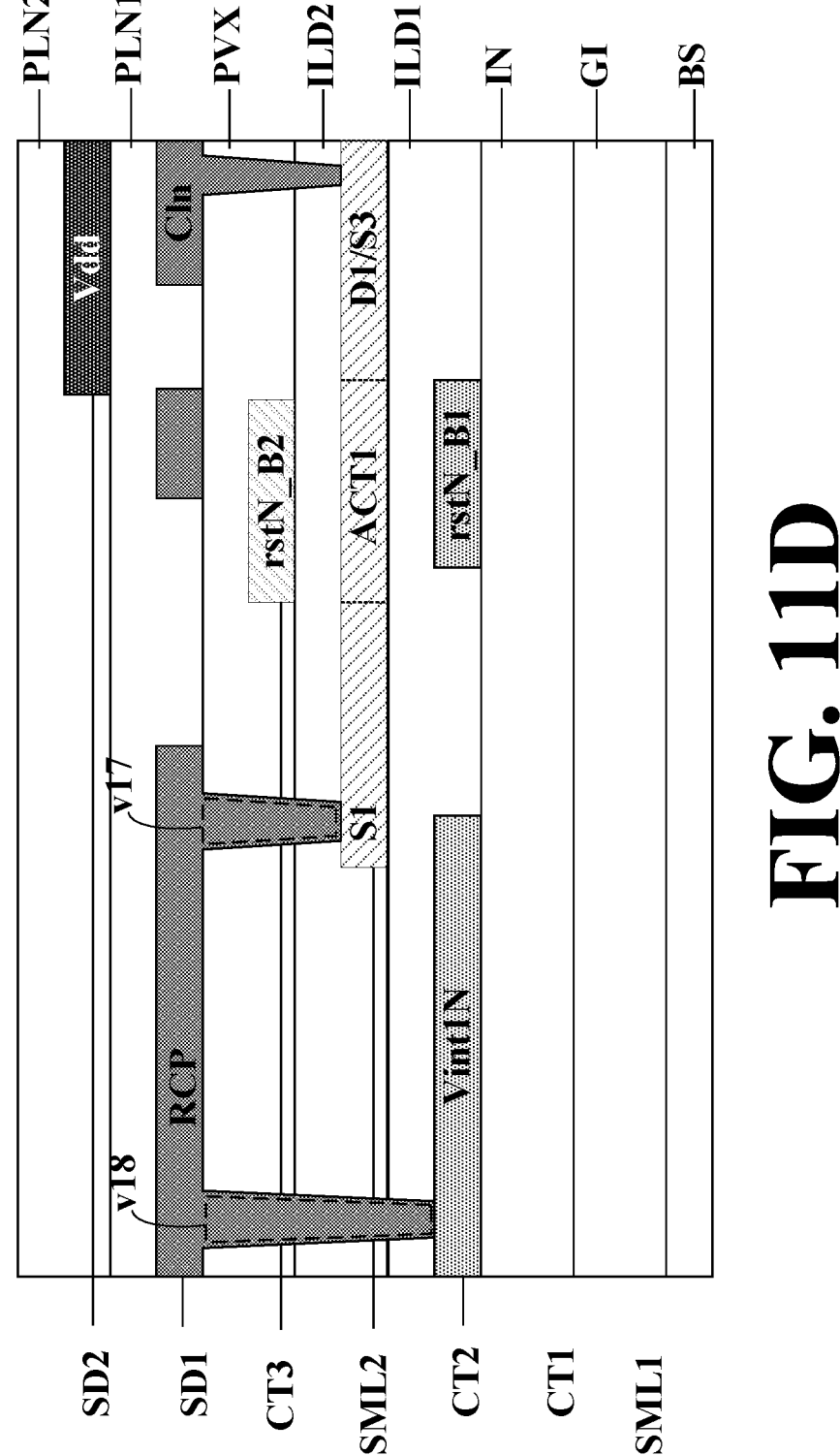
FIG. 11D is a cross-sectional view along a K-K' line in FIG. 10A.
Figure 11E:
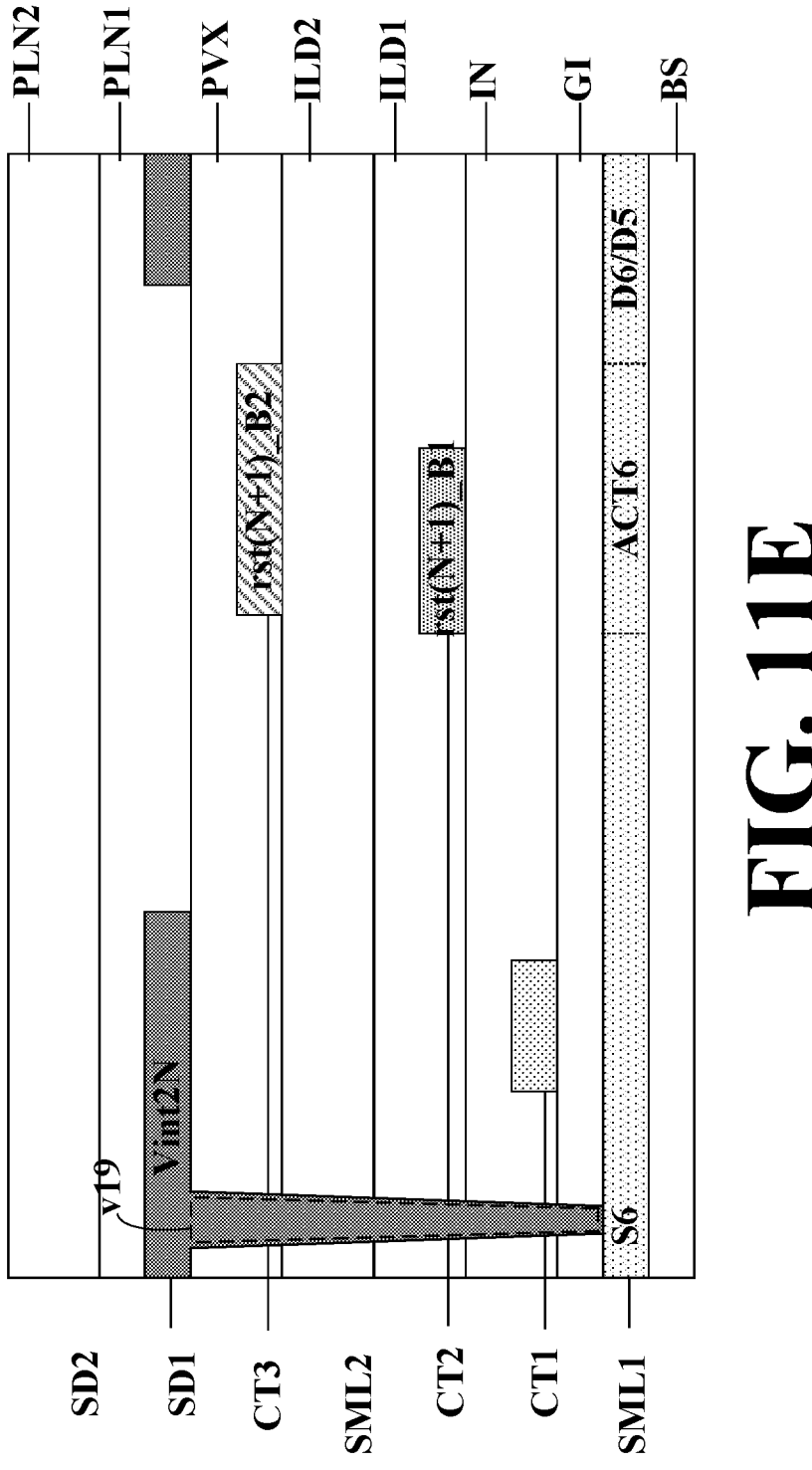
FIG. 11E is a cross-sectional view along a L-L' line in FIG. 10A.
Figure 11F:
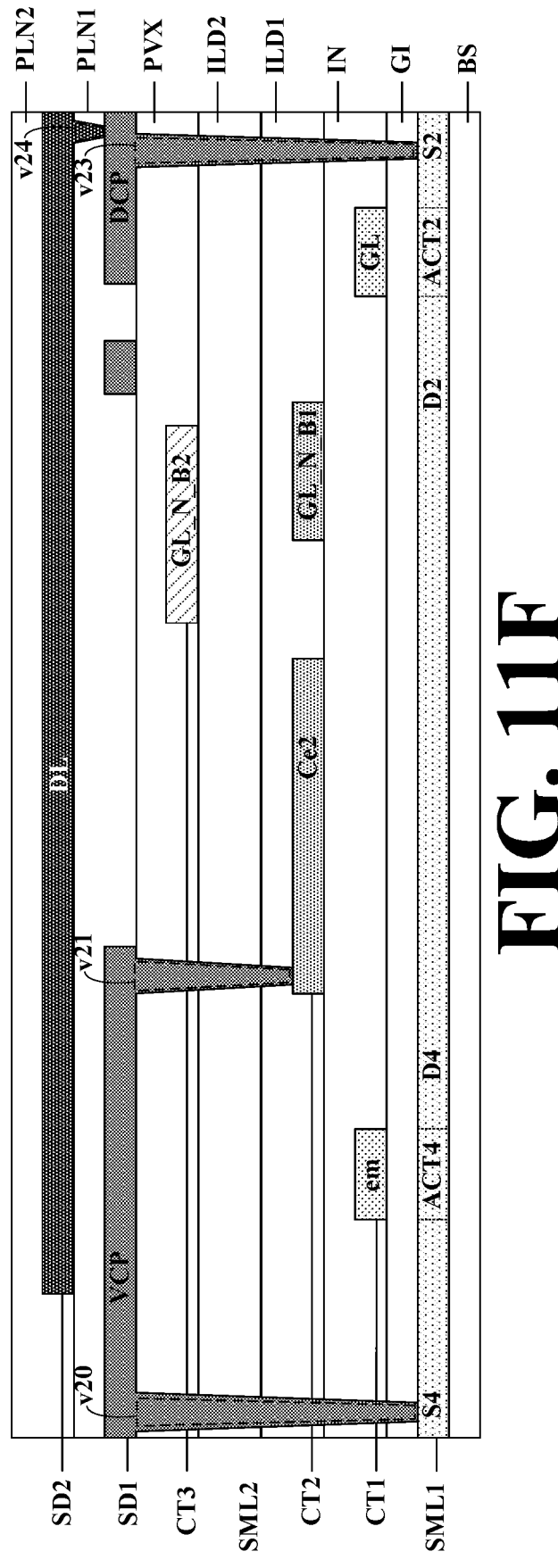
FIG. 11F is a cross-sectional view along an M-M' line in FIG. 10A.

FIG. 10A is a diagram illustrating the structure of two adjacent pixel driving circuits in an array substrate in some embodiments according to the present disclosure. FIG. 10B is a diagram illustrating the structure of a semiconductor material layer of two adjacent pixel driving circuits in an array substrate depicted in FIG. 10A. FIG. 10C is a diagram illustrating the structure of a first conductive layer of two adjacent pixel driving circuits in an array substrate depicted in FIG. 10A. FIG. 10D is a diagram illustrating the structure of a second conductive layer of two adjacent pixel driving circuits in an array substrate depicted in FIG. 10A. FIG. 10E is a diagram illustrating the structure of a second semiconductor material layer of two adjacent pixel driving circuits in an array substrate depicted in FIG. 10A. FIG. 10F is a diagram illustrating the structure of a third conductive layer of two adjacent pixel driving circuits in an array substrate depicted in FIG. 10A. FIG. 10G is a diagram illustrating the structure of a first signal line layer of two adjacent pixel driving circuits in an array substrate depicted in FIG. 10A. FIG. 10H is a diagram illustrating the structure of a second signal line layer of two adjacent pixel driving circuits in an array substrate depicted in FIG. 10A. FIG. 11A is a cross-sectional view along an H-H' line in FIG. 10A. FIG. 11B is a cross-sectional view along a I-I' line in FIG. 10A. FIG. 11C is a cross-sectional view along a J-J' line in FIG. 10A. FIG. 11D is a cross-sectional view along a K-K' line in FIG. 10A. FIG. 11E is a cross-sectional view along a L-L' line in FIG. 10A. FIG. 11F is a cross-sectional view along a M-M' line in FIG. 10A.

Referring to FIG. 10A to FIG. 10H, and FIG. 11A to FIG. 11F, in some embodiments, the array substrate includes a base substrate BS, a first semiconductor material layer SML1 on the base substrate BS, a gate insulating layer GI on a side of the first semiconductor material layer SML1 away from the base substrate BS, a first conductive layer CT1 on a side of the gate insulating layer GI away from the first semiconductor material layer SML1, an insulating layer IN on a side of the first conductive layer CT1 away from the gate insulating layer GI, a second conductive layer CT2 on a side of the insulating layer IN away from the first conductive layer CT1, a first inter-layer dielectric layer ILD1 on a side of the second conductive layer CT2 away from the insulating layer IN, a second semiconductor material layer SML2 on a side of the first inter-layer dielectric layer ILD1 away from the second conductive layer CT2, a second inter-layer dielectric layer ILD2 on a side of the second semiconductor material layer SML2 away from the first inter-layer dielectric layer ILD1, a third conductive layer CT3 on a side of the second inter-layer dielectric layer ILD2 away from the second semiconductor material layer SML2, a passivation layer PVX on a side of the third conductive layer CT3 away from the second inter-layer dielectric layer ILD2, a first signal line layer SD1 on a side of the passivation layer PVX away from the third conductive layer CT3, a first planarization layer PLN1 on a side of the first signal line layer SD1 away from the passivation layer PVX, a second signal line layer SD2 on a side of the first planarization layer PLN1 away from the first signal line layer SD1, and a second planarization layer PLN2 on a side of the second signal line layer SD2 away from the first planarization layer PLN1.

Referring to FIG. 9A, FIG. 10A, FIG. 10B, and FIG. 11A to FIG. 11F, in some embodiments, the first semiconductor material layer SML1 includes at least active layers of multiple transistors of the pixel driving circuit, including the second transistor T2, the fourth transistor T4, the fifth transistor T5, the sixth transistor T6, the first auxiliary transistor T7, the second auxiliary transistor T8, and the driving transistor Td. Optionally, the first semiconductor material layer SML1 further includes at least respective portions of first electrodes of multiple transistors of the pixel driving circuit, including the second transistor T2, the fourth transistor T4, the fifth transistor T5, the sixth transistor T6, the first auxiliary transistor T7, the second auxiliary transistor T8, and the driving transistor Td. Optionally, the first semiconductor material layer SML1 further includes at least respective portions of second electrodes of multiple transistors of the pixel driving circuit, including the second transistor T2, the fourth transistor T4, the fifth transistor T5, the sixth transistor T6, the first auxiliary transistor T7, the second auxiliary transistor T8, and the driving transistor Td. Optionally, the first semiconductor material layer SML1 includes active layers, first electrodes, and second electrodes of multiple transistors of the pixel driving circuit, including the second transistor T2, the fourth transistor T4, the fifth transistor T5, the sixth transistor T6, the first auxiliary transistor T7, the second auxiliary transistor T8, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

In FIG. 10B, the pixel driving circuit on the left is annotated with labels indicating components of each of multiple transistors (T2, T4, T5, T6, T7, T8, and Td) in the pixel driving circuit. For example, the second transistor T2 includes an active layer ACT2, a first electrode S2, and a second electrode D2. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The first auxiliary transistor T7 includes an active layer ACT7, a first electrode S7, and a second electrode D7. The second auxiliary transistor T8 includes an active layer ACT8, a first electrode S8, and a second electrode D8. The driving transistor Td includes an active layer ACTd, a first electrode Sd, and a second electrode Dd.

Optionally, the active layers (ACT2, ACT4, ACT5, ACT6, ACT7, ACT8, and ACTd), the first electrodes (S2, S4, S5, S6, S7, S8, and Sd), and the second electrodes (D2, D4, D5, D6, D7, D8, and Dd) of the respective transistors (T2, T4, T5, T6, T7, T8, and Td) are in a same layer.

In some embodiments, the active layers (ACT2, ACT4, ACT5, ACT6, and ACTd), the first electrodes (S2, S4, S5, S6, and Sd), and the second electrodes (D2, D4, D5, D6, and Dd) of the respective transistors (T2, T4, T5, T6, and Td) in the pixel driving circuit are parts of a unitary structure.

Optionally, a part of the first auxiliary transistor T7 in the first semiconductor material layer is spaced apart from other transistors (T2, T4, T5, T6, T8, and Td) in a same pixel driving circuit. Optionally, a part of the second auxiliary transistor T8 in the first semiconductor material layer is spaced apart from other transistors (T2, T4, T5, T6, T7, and Td) in a same pixel driving circuit.

Referring to FIG. 10B, first auxiliary transistors respectively from a first pixel driving circuit and a second pixel driving circuit directly adjacent to each other and in the present stage form a unitary structure. Specifically, first electrodes of the first auxiliary transistors respectively from the first pixel driving circuit and the second pixel driving circuit directly adjacent to each other and in the present stage are connected to each other, thereby forming the unitary structure.

Referring to FIG. 9A, FIG. 10A, FIG. 10C, and FIG. 11A to FIG. 11F, in some embodiments, the first conductive layer CT1 includes a plurality of first gate lines GL_P, a plurality of light emitting control signal lines em, and a first capacitor electrode Ce1 of the storage capacitor Cst. Various appropriate electrode materials and various appropriate fabricating methods may be used to make the first conductive layer CT1. For example, a conductive material may be deposited on the substrate by a plasma-enhanced chemical vapor deposition (PECVD) process and patterned. Examples of appropriate conductive materials for making the first conductive layer CT1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first gate lines GL_P, the plurality of light emitting control signal lines em, and a first capacitor electrode Ce1 of the storage capacitor Cst are in a same layer.

Referring to FIG. 9A, FIG. 10A, FIG. 10D, and FIG. 11A to FIG. 11F, in some embodiments, the second conductive layer CT2 includes at least portions of a plurality of second gate lines GL_N (e.g., a second gate line first branch GL_N_B1), at least portions of a plurality of reset control signal lines (e.g., a reset control signal line first branch rstN_B1 of a respective reset control signal line of a present stage rstN, and a reset control signal line first branch rst(N+1)_B1 of a reset control signal line of a next stage rst(N+1)), a plurality of first reset signal lines Vint1N, and a second capacitor electrode Ce2 of the storage capacitor Cst. Various appropriate electrode materials and various appropriate fabricating methods may be used to make the second conductive layer CT2. For example, a conductive material may be deposited on the substrate by a plasma-enhanced chemical vapor deposition (PECVD) process and patterned. Examples of appropriate conductive materials for making the second conductive layer CT2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the second gate line first branch GL_N_B1, the reset control signal line first branch rstN_B1 of a respective reset control signal line of a present stage rstN, the reset control signal line first branch rst(N+1)_B1 of a reset control signal line of a next stage rst(N+1), and the second capacitor electrode Ce2 of the storage capacitor Cst are in a same layer.

Referring to FIG. 9A, FIG. 10A, FIG. 10E, and FIG. 11A to FIG. 11F, in some embodiments, the second semiconductor material layer SML2 includes at least an active layer ACT1 of the first transistor T1 and at least an active layer ACT3 of the third transistor T3. Optionally, the second semiconductor material layer SML2 further includes at least a portion of a first electrode S1 of the first transistor T1. Optionally, the second semiconductor material layer SML2 further includes at least a portion of a second electrode D1 of the first transistor T1. Optionally, the second semiconductor material layer SML2 includes the active layer ACT1, the first electrode S1, and the second electrode D1 of the first transistor T1. Optionally, the second semiconductor material layer SML2 further includes at least a portion of a first electrode S3 of the third transistor T3. Optionally, the second semiconductor material layer SML2 further includes at least a portion of a second electrode D3 of the third transistor T3. Optionally, the second semiconductor material layer SML2 includes the active layer ACT3, the first electrode S3, and the second electrode D3 of the third transistor T3. In the present array substrate, at least the active layer ACT1 of the first transistor T1 and the active layer ACT3 of the third transistor T3 are in a layer different from at least the active layers of other transistors of the pixel driving circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as zinc oxynitride.

In FIG. 10E, the pixel driving circuit on the left is annotated with labels indicating components of the first transistor T1 and the third transistor T3 in the pixel driving circuit. For example, the first transistor T1 includes an active layer ACT1, a first electrode S1, and a second electrode D1; the third transistor T3 includes an active layer ACT3, a first electrode S3, and a second electrode D3. Optionally, the active layer ACT1, the first electrode S1, and the second electrode D1 of the first transistor T1; and the active layer ACT3, the first electrode S3, and the second electrode D3 of the third transistor T3 are in a same layer.

Referring to FIG. 9A, FIG. 10A, FIG. 10F, and FIG. 11A to FIG. 11F, in some embodiments, the third conductive layer CT3 includes at least portions of a plurality of second gate lines GL_N (e.g., a second gate line second branch GL_N_B2), and at least portions of a plurality of reset control signal lines (e.g., a reset control signal line second branch rstN_B2 of a respective reset control signal line of a present stage rstN, and a reset control signal line second branch rst(N+1)_B2 of a reset control signal line of a next stage rst(N+1)). Various appropriate electrode materials and various appropriate fabricating methods may be used to make the third conductive layer CT3. For example, a conductive material may be deposited on the substrate by a plasma-enhanced chemical vapor deposition (PECVD) process and patterned. Examples of appropriate conductive materials for making the third conductive layer CT3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, the respective second gate line of the plurality of second gate lines GL_N in a present stage includes the second gate line first branch GL_N_B1 and the second gate line second branch GL_N_B2 in two different layers. Optionally, the second gate line first branch GL_N_B1 is in the second conductive layer CT2, and the second gate line second branch GL_N_B2 is in the third conductive layer CT3. As shown in FIG. 11A and FIG. 11F, in some embodiments, an orthographic projection of the second gate line first branch GL_N_B1 on a base substrate BS at least partially overlaps with an orthographic projection of the second gate line second branch GL_N_B2 on the base substrate BS.

In some embodiments, the respective reset control signal line of the plurality of reset control signal lines in a present stage includes a reset control signal line first branch rstN_B1 of a respective reset control signal line of a present stage rstN, and a reset control signal line second branch rstN_B2 of a reset control signal line of a present stage rstN in two different layers. Optionally, the reset control signal line first branch rstN_B1 is in the second conductive layer CT2, and the reset control signal line second branch rstN_B2 is in the third conductive layer CT3. As shown in FIG. 11D, in some embodiments, an orthographic projection of the reset control signal line first branch rstN_B1 on a base substrate BS at least partially overlaps with an orthographic projection of the reset control signal line second branch rstN_B2 on the base substrate BS.

In some embodiments, the respective reset control signal line of the plurality of reset control signal lines in a next adjacent stage includes a reset control signal line first branch rst(N+1)_B1 of a respective reset control signal line of a next adjacent stage rst(N+1), and a reset control signal line second branch rst(N+1)_B2 of a reset control signal line of a next adjacent stage rst(N+1) in two different layers. Optionally, the reset control signal line first branch rst(N+1)_B1 is in the second conductive layer CT2, and the reset control signal line second branch rst(N+1)_B2 is in the third conductive layer CT3. As shown in FIG. 11E, in some embodiments, an orthographic projection of the reset control signal line first branch rst(N+1)_B1 on a base substrate BS at least partially overlaps with an orthographic projection of the reset control signal line second branch rst(N+1)_B2 on the base substrate BS.

Referring to FIG. 9A, FIG. 10A, FIG. 10G, and FIG. 11A to FIG. 11F, in some embodiments, the first signal line layer SD1 includes a plurality of second reset signal lines Vint2N, a node connecting line Cln, a reset signal connecting pad RCP, a voltage connecting pad VCP, and a data signal connecting pad DCP. Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second reset signal lines Vint2N, the node connecting line Cln, the reset signal connecting pad RCP, the voltage connecting pad VCP, and the data signal connecting pad DCP are in a same layer.

In some embodiments, the node connecting line Cln connects various components of the pixel driving circuit to the node N1. Referring to FIG. 11A, in some embodiments, the array substrate further includes a thirteenth via v13 and a fourteenth via v14. Optionally, the thirteenth via v13 extends through the passivation layer PVX, the second inter-layer dielectric layer ILD2, the first inter-layer dielectric layer ILD1, and the insulating layer IN. Optionally, the fourteenth via v14 extends through the passivation layer PVX and the second inter-layer dielectric layer ILD2. The node connecting line Cln is connected to the first capacitor electrode Ce1 through the thirteenth via v13, and connected to the second electrode D1 of the first transistor and/or the first electrode S3 of the third transistor through the fourteenth via v14.

Referring to FIG. 11D, in some embodiments, the array substrate further includes a seventeenth via v17 and an eighteenth via v18. Optionally, the seventeenth via v17 extends through the passivation layer PVX and the second inter-layer dielectric layer ILD2. Optionally, the eighteenth via v18 extends through the passivation layer PVX, the second inter-layer dielectric layer ILD2, and the first inter-layer dielectric layer ILD1. The reset signal connecting pad RCP is connected to a first electrode S1 of the first transistor through the seventeenth via v17, and connected to a respective first reset signal line of the plurality of first reset signal lines Vint1N through the eighteenth via v18.

Referring to FIG. 11E, in some embodiments, the array substrate further includes a nineteenth via v19. Optionally, the nineteenth via v19 extends through the passivation layer PVX, the second inter-layer dielectric layer ILD2, the first inter-layer dielectric layer ILD1, the insulating layer IN, and the gate insulating layer GI. A respective second reset signal line of the plurality of second reset signal lines Vint2N is connected to a first electrode S6 of the sixth transistor through the nineteenth via v19.

Referring to FIG. 11F, in some embodiments, the array substrate further includes a twentieth via v20 and a twenty first via v21. Optionally, the twentieth via v20 extends through the passivation layer PVX, the second inter-layer dielectric layer ILD2, the first inter-layer dielectric layer ILD1, the insulating layer IN, and the gate insulating layer GI. Optionally, the twenty first via v21 extends through the passivation layer PVX, the second inter-layer dielectric layer ILD2, and the first inter-layer dielectric layer ILD1. The voltage connecting pad VCP is connected to a first electrode S4 of the fourth transistor through the twentieth via v20, and connected to the second capacitor electrode Ce2 through the twenty first via v21.

Referring to FIG. 11A, in some embodiments, the array substrate further includes a twenty second via v22. Optionally, the twenty second via v22 extends through the first planarization layer PLN1. A respective voltage supply line of the plurality of voltage supply line Vdd is connected to the voltage connecting pad VCP through the twenty second via v22.

Referring to FIG. 11F, in some embodiments, the array substrate further includes a twenty third via v23. Optionally, the twenty third via v23 extends through the passivation layer PVX, the second inter-layer dielectric layer ILD2, the first inter-layer dielectric layer ILD1, the insulating layer IN, and the gate insulating layer GI. The data signal connecting pad DCP is connected to a first electrode S2 of the second transistor through the twenty third via v23.

Referring to FIG. 11F, in some embodiments, the array substrate further includes a twenty fourth via v24. Optionally, the twenty fourth via v24 extends through the first planarization layer PLN1. A respective data line of the plurality of data line DL is connected to the data signal connecting pad DCP through the twenty fourth via v24.

Referring to FIG. 9A, FIG. 10A, FIG. 10H, and FIG. 11A to FIG. 11F, in some embodiments, the second signal line layer SD2 includes a plurality of voltage supply lines Vdd, a plurality of data lines DL, a first voltage signal line V1, a second voltage signal line V2, and an anode contact pad ACP. Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the first voltage signal line V1, the second voltage signal line V2, and the anode contact pad ACP are in a same layer. The anode contact pad ACP is connected to second electrodes of the fifth transistor T5 and the sixth transistor T6, and is connected to an anode of a respective light emitting element.

Referring to FIG. 9A, FIG. 10A to FIG. 10H, and FIG. 11A to FIG. 11F, in some embodiments, in a hole region H, a portion of the second capacitor electrode Ce2 is absent. Optionally, an orthographic projection of the second capacitor electrode Ce2 on a base substrate BS completely covers, with a margin, an orthographic projection of the first capacitor electrode Ce1 on the base substrate BS except for the hole region H in which a portion of the second capacitor electrode Ce2 is absent. Optionally, the thirteenth via v13 extends through the passivation layer PVX, the second inter-layer dielectric layer ILD2, the first inter-layer dielectric layer ILD1, the hole region H, and the insulating layer IN.

Referring to FIG. 11B, in some embodiments, the array substrate further includes a fifteenth via v15. Optionally, the fifteenth via v15 extends through the first planarization layer PLN1, the passivation layer PVX, the second inter-layer dielectric layer ILD2, the first inter-layer dielectric layer ILD1, the insulating layer IN, and the gate insulating layer GI. The first voltage signal line V1 is connected to a first electrode S7 of the first auxiliary transistor through the fifteenth via v15.

Referring to FIG. 11C, in some embodiments, the array substrate further includes a sixteenth via v16. Optionally, the sixteenth via v16 extends through the first planarization layer PLN1, the passivation layer PVX, the second inter-layer dielectric layer ILD2, the first inter-layer dielectric layer ILD1, the insulating layer IN, and the gate insulating layer GI. The second voltage signal line V2 is connected to a first electrode S8 of the second auxiliary transistor through the sixteenth via v16.

Figure 12A:
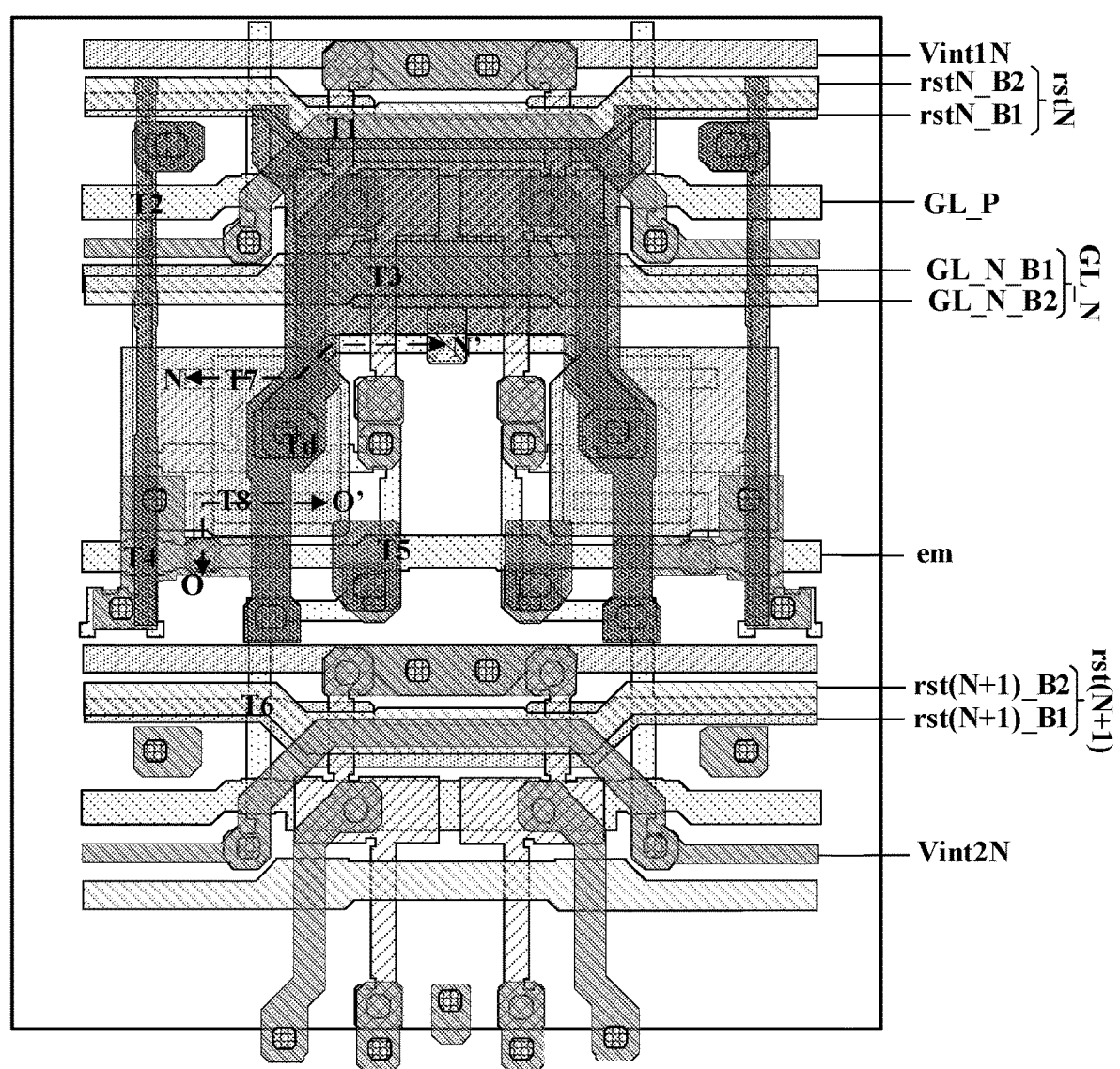
FIG. 12A is a diagram illustrating the structure of two adjacent pixel driving circuits in an array substrate in some embodiments according to the present disclosure.
Figure 12B:
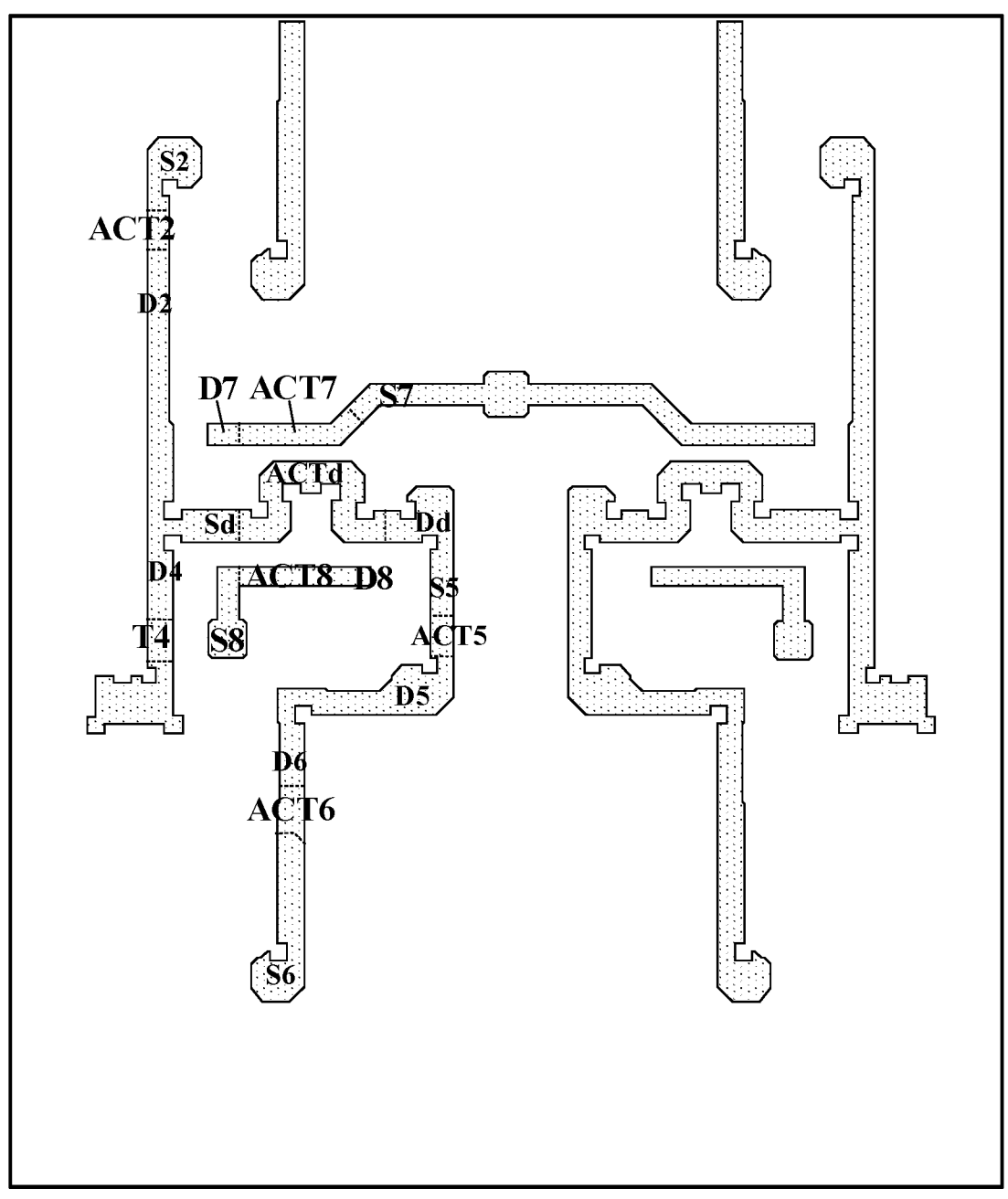
FIG. 12B is a diagram illustrating the structure of a semiconductor material layer of two adjacent pixel driving circuits in an array substrate depicted in FIG. 12A.
Figure 12C:
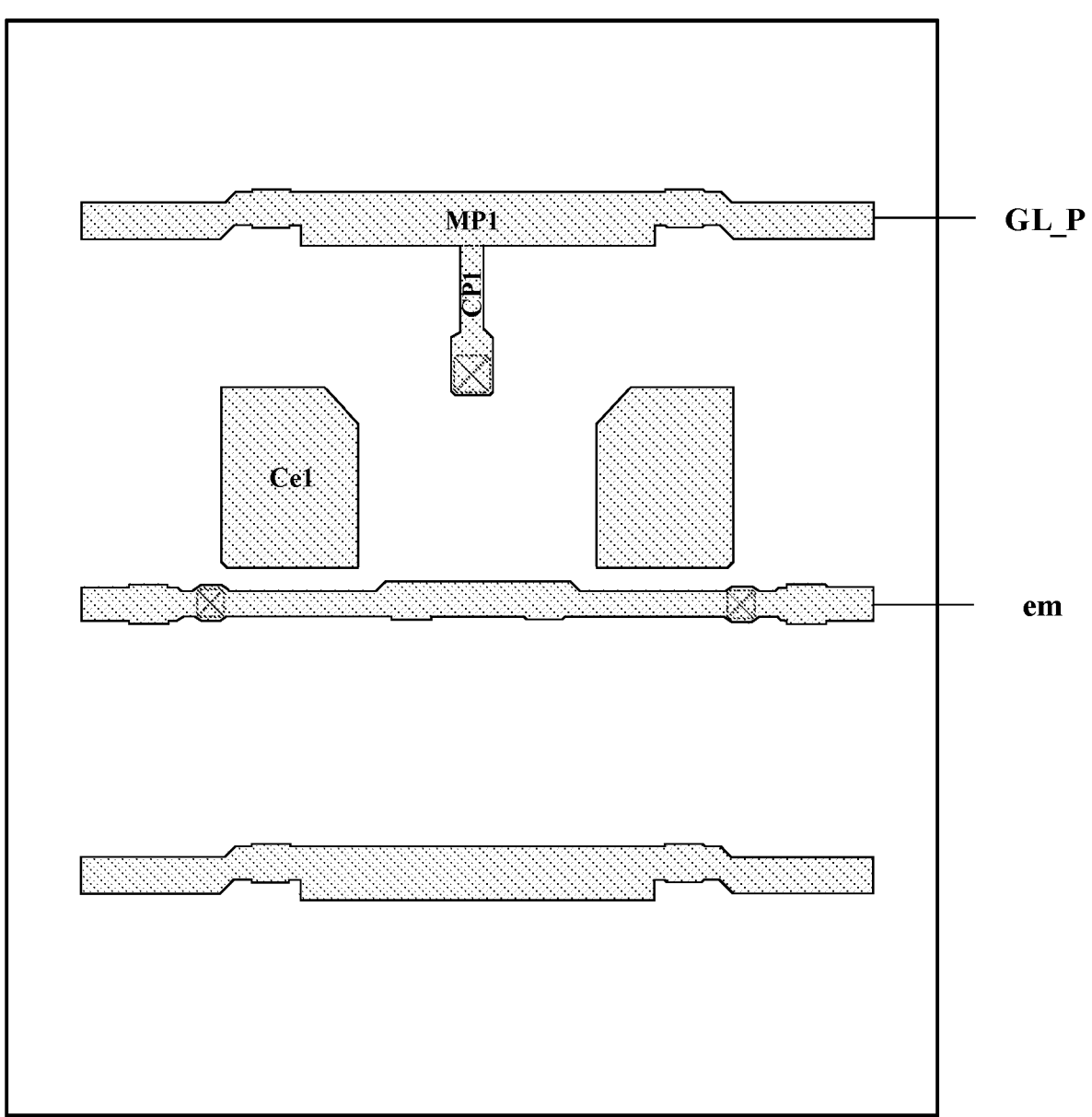
FIG. 12C is a diagram illustrating the structure of a first conductive layer of two adjacent pixel driving circuits in an array substrate depicted in FIG. 12A.
Figure 12D:
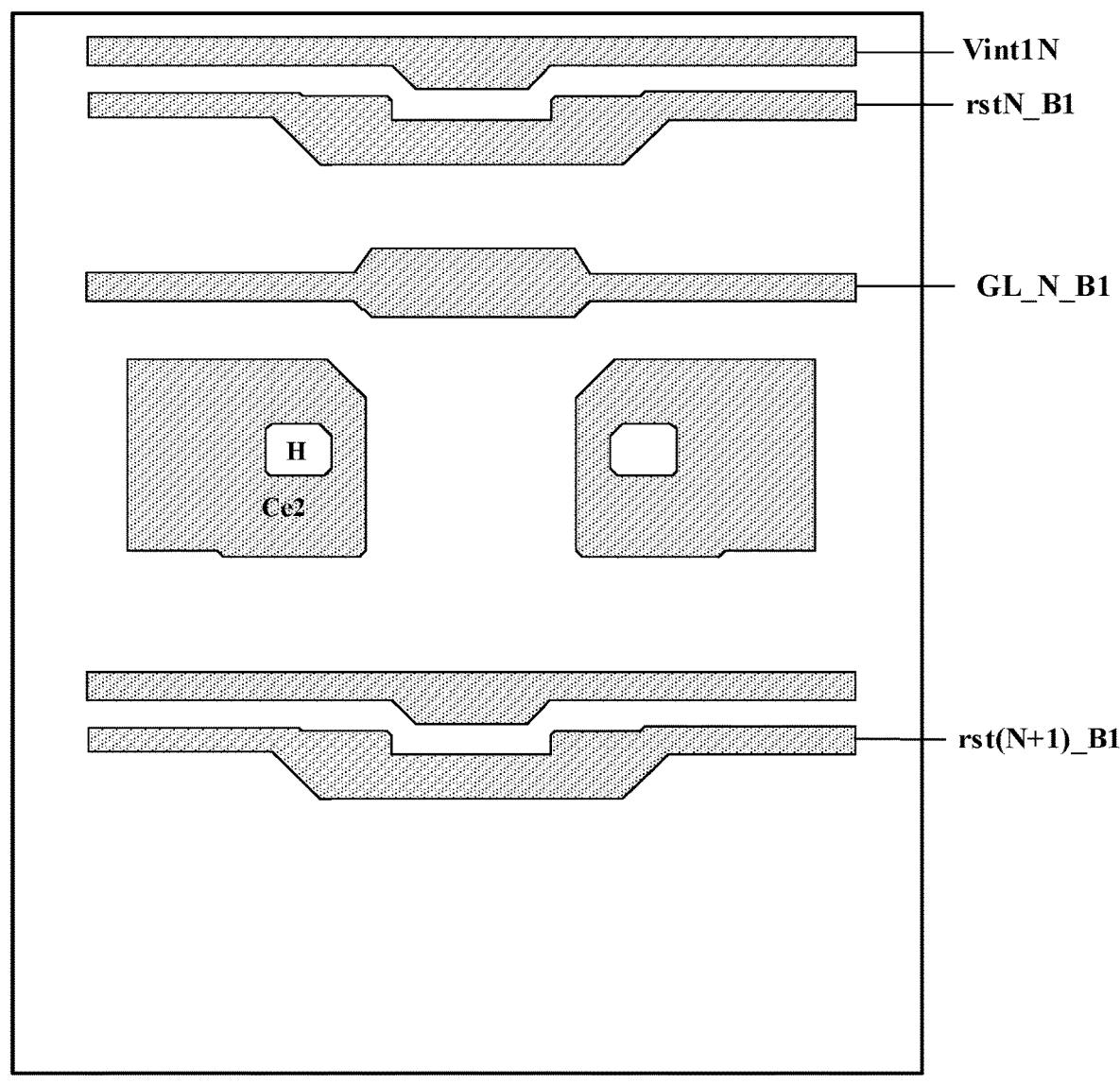
FIG. 12D is a diagram illustrating the structure of a second conductive layer of two adjacent pixel driving circuits in an array substrate depicted in FIG. 12A.
Figure 12E:
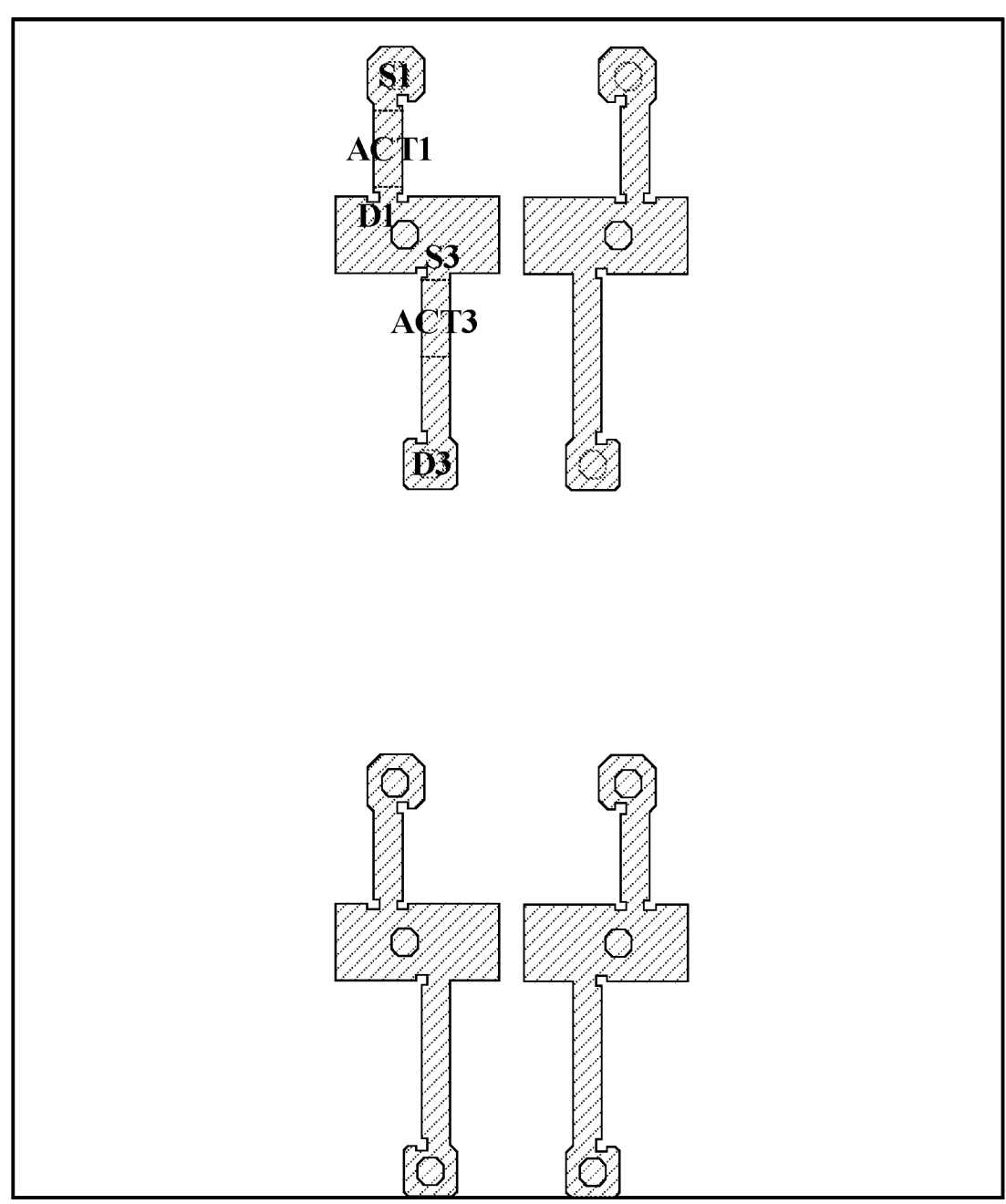
FIG. 12E is a diagram illustrating the structure of a second semiconductor material layer of two adjacent pixel driving circuits in an array substrate depicted in FIG. 12A.
Figure 12F:
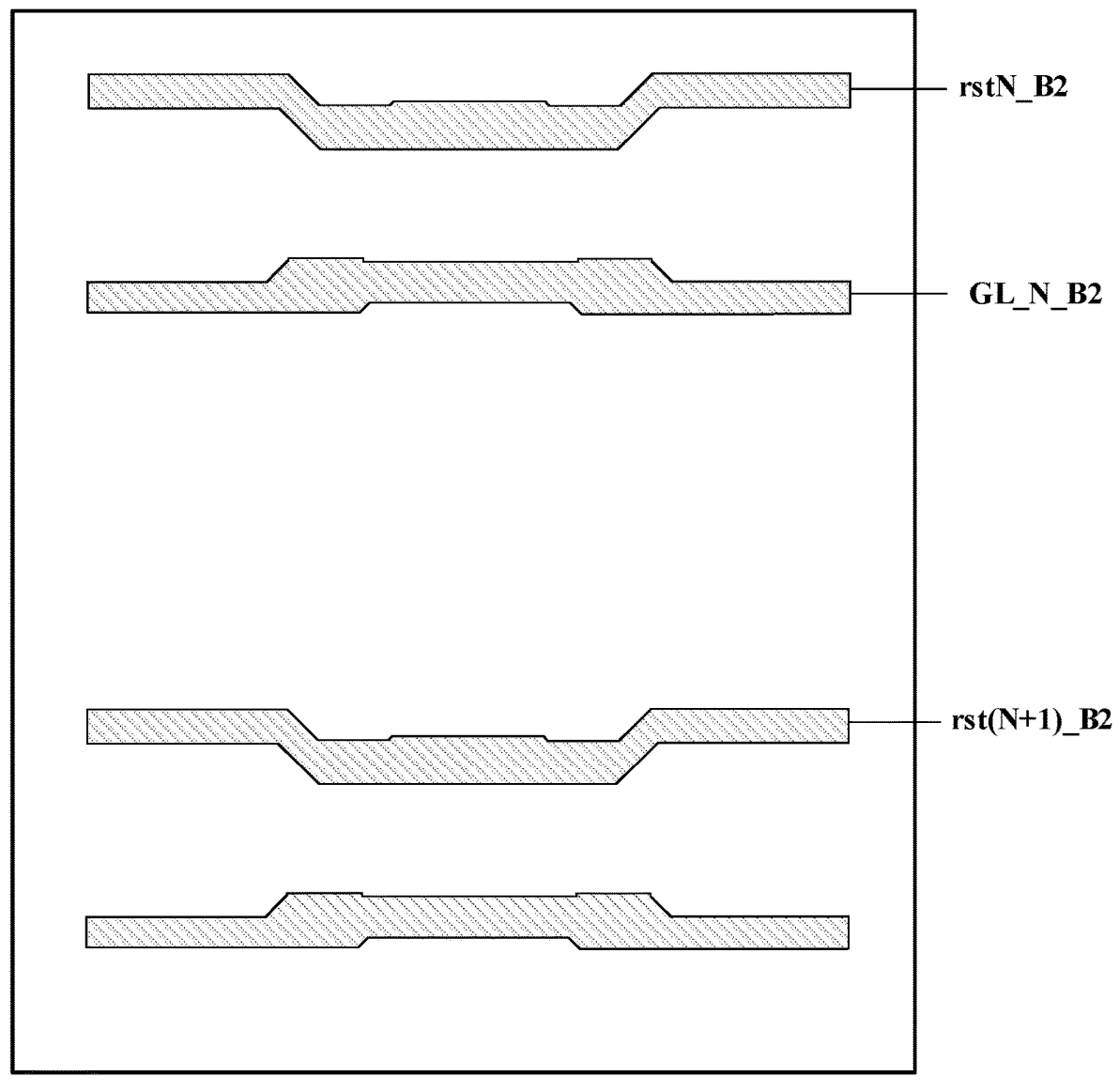
FIG. 12F is a diagram illustrating the structure of a third conductive layer of two adjacent pixel driving circuits in an array substrate depicted in FIG. 12A.
Figure 12G:
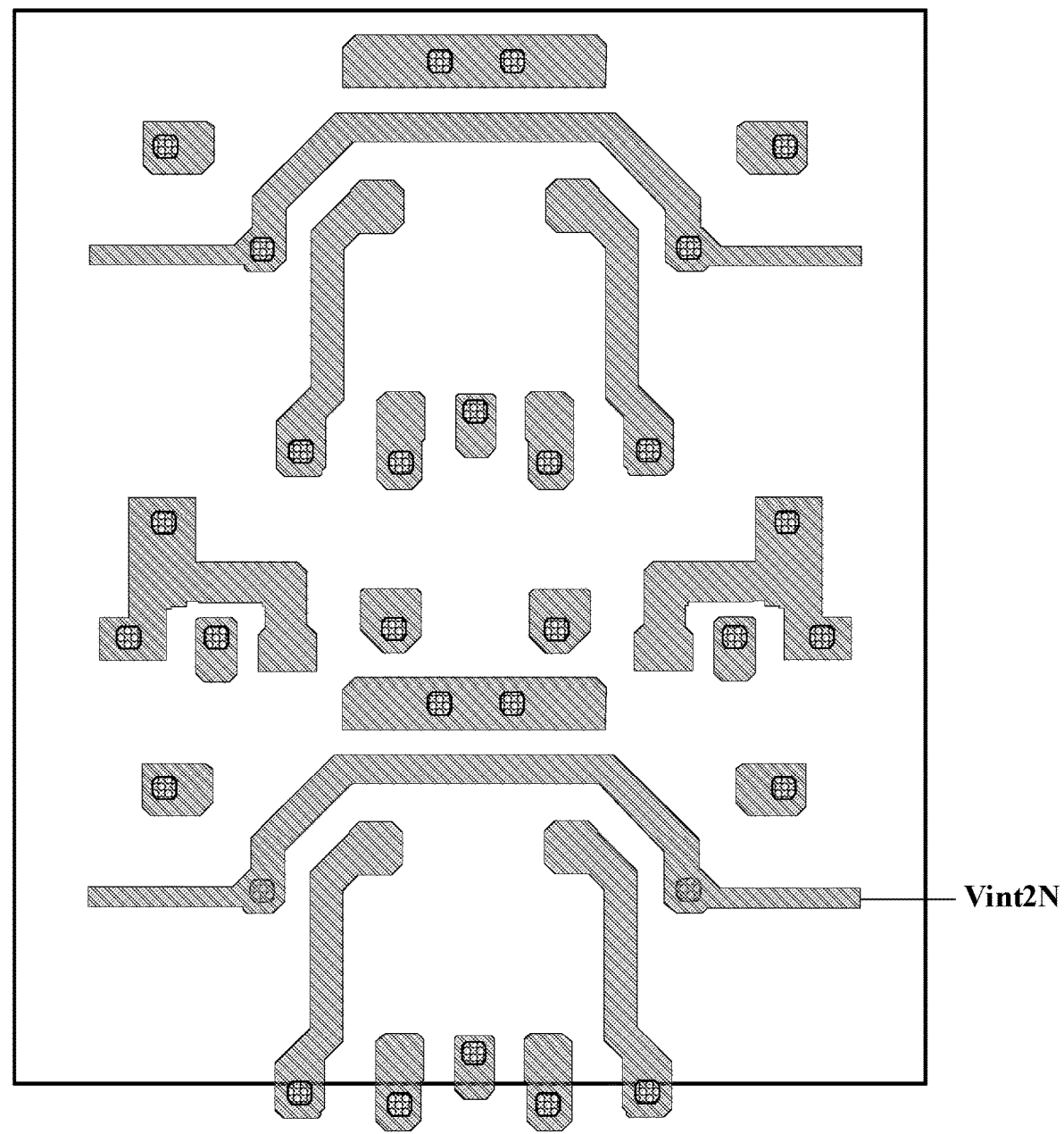
FIG. 12G is a diagram illustrating the structure of a first signal line layer of two adjacent pixel driving circuits in an array substrate depicted in FIG. 12A.
Figure 12H:
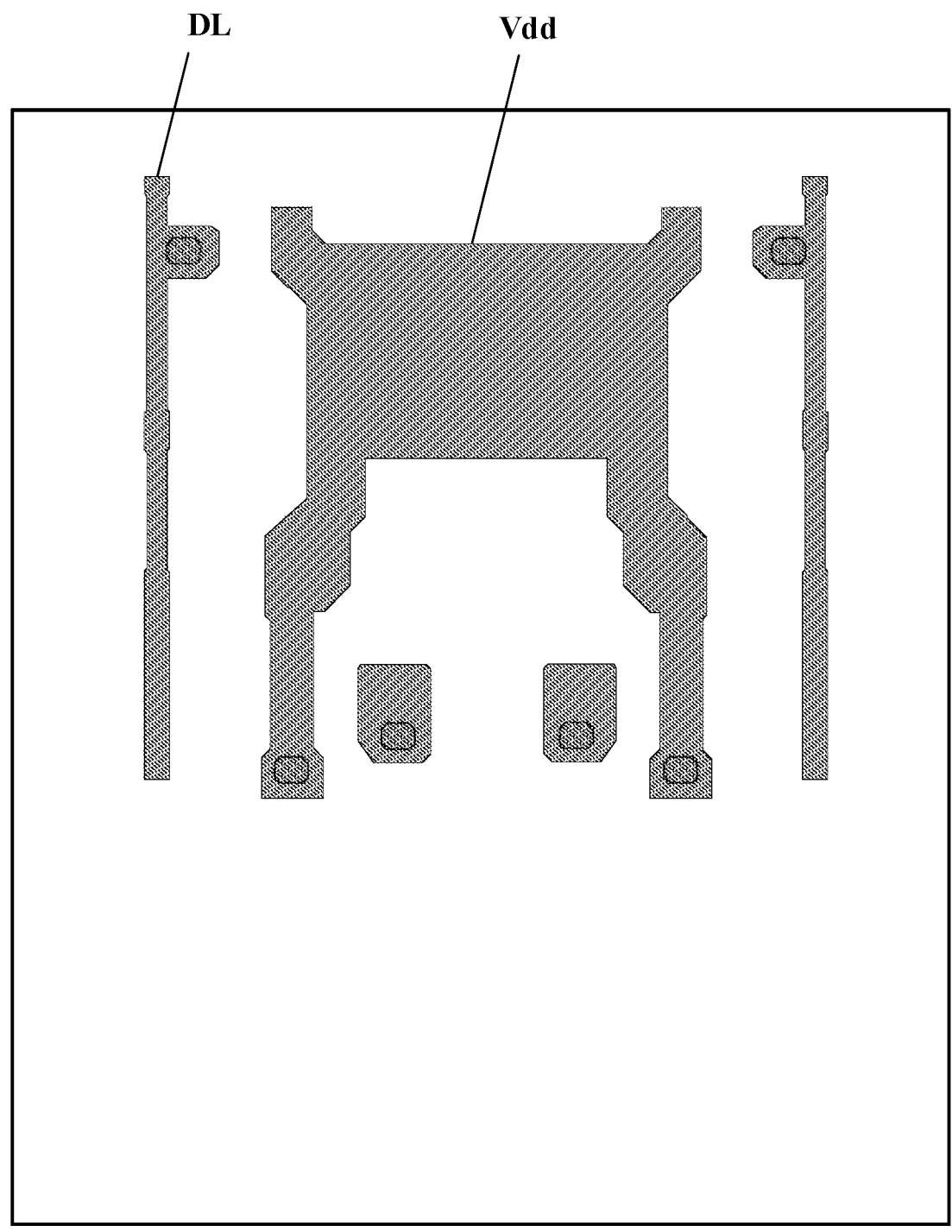
FIG. 12H is a diagram illustrating the structure of a second signal line layer of two adjacent pixel driving circuits in an array substrate depicted in FIG. 12A.
Figure 13A:
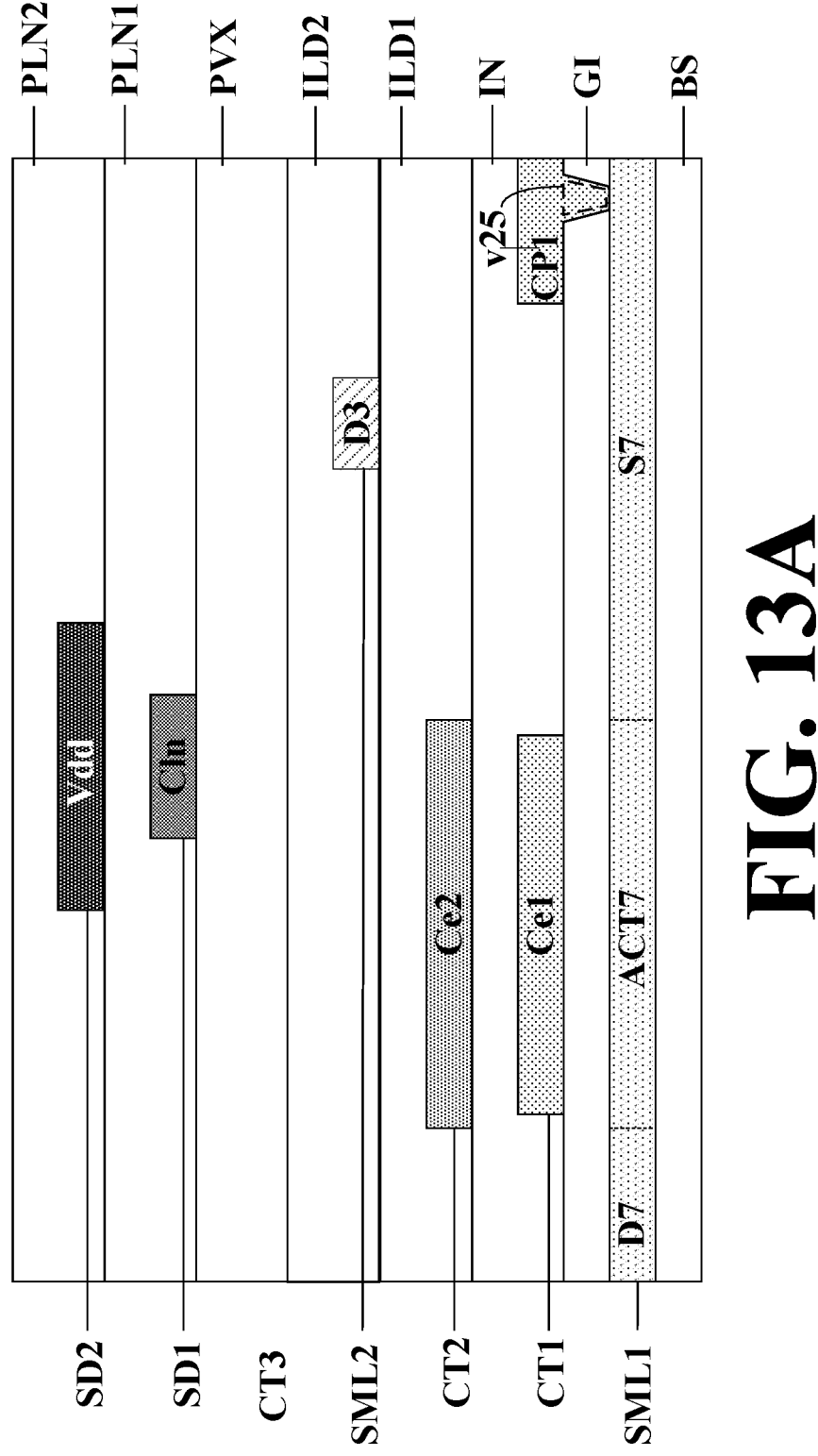
FIG. 13A is a cross-sectional view along an N-N' line in FIG. 12A.
Figure 13B:
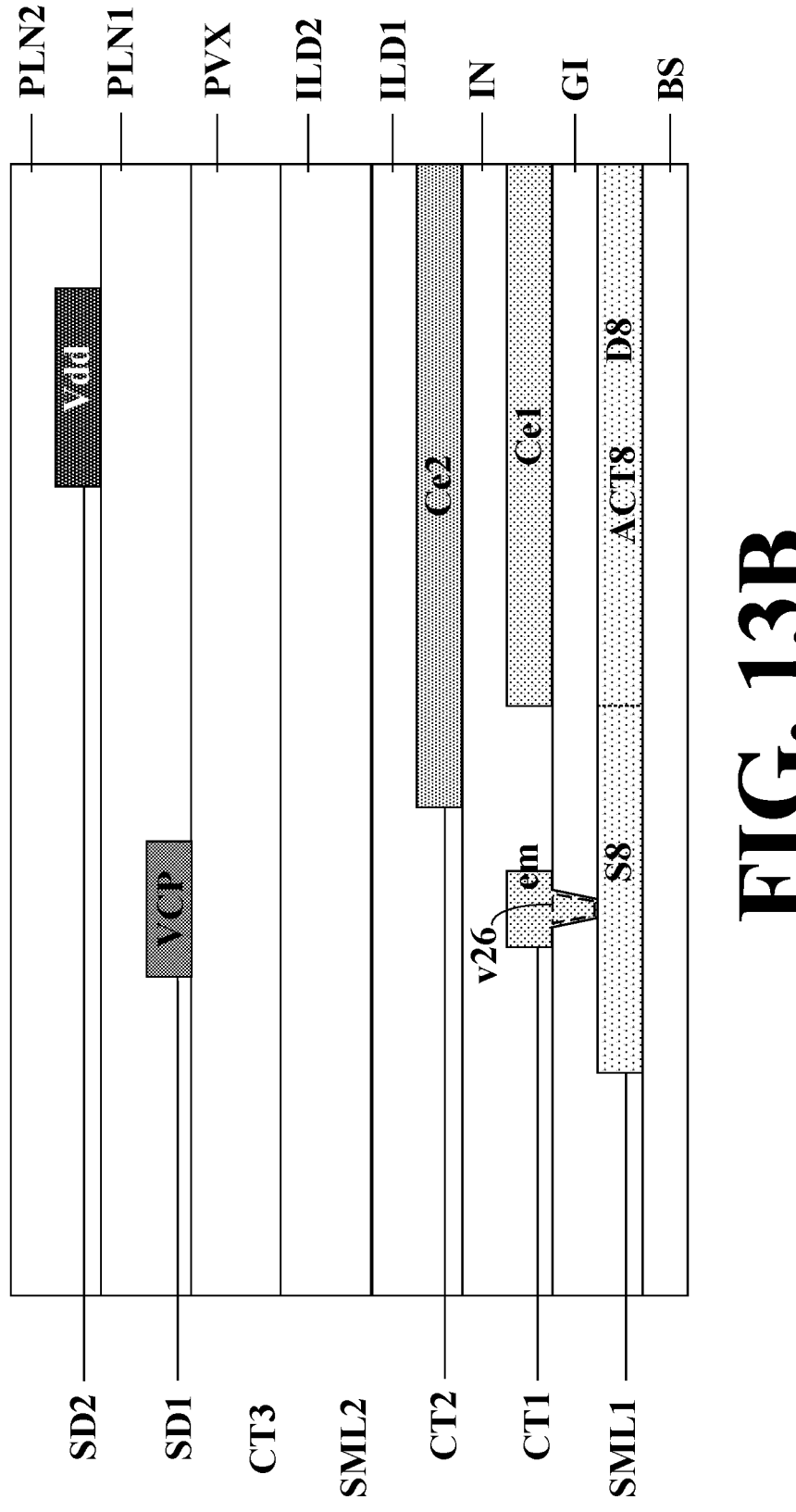
FIG. 13B is a cross-sectional view along an O-O' line in FIG. 12A.

FIG. 12A is a diagram illustrating the structure of two adjacent pixel driving circuits in an array substrate in some embodiments according to the present disclosure. FIG. 12B is a diagram illustrating the structure of a semiconductor material layer of two adjacent pixel driving circuits in an array substrate depicted in FIG. 12A. FIG. 12C is a diagram illustrating the structure of a first conductive layer of two adjacent pixel driving circuits in an array substrate depicted in FIG. 12A. FIG. 12D is a diagram illustrating the structure of a second conductive layer of two adjacent pixel driving circuits in an array substrate depicted in FIG. 12A. FIG. 12E is a diagram illustrating the structure of a second semiconductor material layer of two adjacent pixel driving circuits in an array substrate depicted in FIG. 12A. FIG. 12F is a diagram illustrating the structure of a third conductive layer of two adjacent pixel driving circuits in an array substrate depicted in FIG. 12A. FIG. 12G is a diagram illustrating the structure of a first signal line layer of two adjacent pixel driving circuits in an array substrate depicted in FIG. 12A. FIG. 12H is a diagram illustrating the structure of a second signal line layer of two adjacent pixel driving circuits in an array substrate depicted in FIG. 12A. FIG. 13A is a cross-sectional view along an N-N' line in FIG. 12A. FIG. 13B is a cross-sectional view along an O-O' line in FIG. 12A.

Referring to FIG. 12A to FIG. 12H, and FIG. 13A to FIG. 13B, in some embodiments, a first electrode S7 of the first auxiliary transistor T7 is coupled to a respective gate line of a plurality of gate lines GL, e.g., the respective gate line of a plurality of gate lines GL functions as the first voltage signal line. A first electrode S8 of the second auxiliary transistor T8 is coupled to a respective light emitting control signal line of a plurality of light emitting control signal lines em, e.g., the respective light emitting control signal line of a plurality of light emitting control signal lines em functions as the second voltage signal line. During at least a light emitting sub-phase of one frame of image, the respective gate line is configured to provide a first level voltage signal (e.g., a high level voltage signal), and the respective light emitting control signal line is configured to provide a second level voltage signal (e.g., a low level voltage signal).

Referring to FIG. 12A and FIG. 12C, in a respective pixel driving circuit, a respective gate line of the plurality of gate lines GL in some embodiments includes a first main portion MP1 extending along an extension direction of the respective gate line, and a first connecting pad CP1 protruding away from the first main portion MP1, e.g., along a direction from the respective gate line of the plurality of gate lines GL of a present stage toward the respective light emitting control signal line of a plurality of light emitting control signal lines em in the present stage.

Referring to FIG. 13A, in some embodiments, the array substrate further includes a twenty fifth via v25. Optionally, the twenty fifth via v25 extends through the gate insulating layer GI. The first connecting pad CP1 is connected to a first electrode S7 of the first auxiliary transistor through the twenty fifth via v25.

Referring to FIG. 13B, in some embodiments, the array substrate further includes a twenty sixth via v26. Optionally, the twenty sixth via v26 extends through the gate insulating layer GI. The respective light emitting control signal line of a plurality of light emitting control signal lines em is connected to a first electrode S8 of the second auxiliary transistor through the twenty sixth via v26.

Referring to FIG. 11A, FIG. 11B, FIG. 11C, FIG. 13A, and FIG. 13B, in some embodiments, an orthographic projection of the first capacitor electrode Ce1 on a base substrate BS at least partially overlaps with an orthographic projection of a second electrode D7 of the first auxiliary transistor T7 on the base substrate BS.

Optionally, an orthographic projection of the first capacitor electrode Ce1 on a base substrate at least partially overlaps with an orthographic projection of an active layer ACT7 of the first auxiliary transistor T7 on the base substrate BS.

Referring to FIG. 11A, FIG. 11B, FIG. 11C, FIG. 13A, and FIG. 13B, in some embodiments, an orthographic projection of the first capacitor electrode Ce1 on a base substrate BS at least partially overlaps with an orthographic projection of a second electrode D8 of the second auxiliary transistor T8 on the base substrate BS.

Optionally, an orthographic projection of the first capacitor electrode Ce1 on a base substrate BS at least partially overlaps with an orthographic projection of an active layer ACT8 of the second auxiliary transistor T8 on the base substrate BS.

Referring to FIG. 11A, FIG. 11B, FIG. 11C, FIG. 13A, and FIG. 13B, in some embodiments, an orthographic projection of the first capacitor electrode Ce1 on a base substrate BS at least partially overlaps with an orthographic projection of an active layer of the driving transistor Td on the base substrate BS and at least partially overlaps with an orthographic projection of a second electrode D7 of the first auxiliary transistor T7 on the base substrate BS.

Optionally, an orthographic projection of the first capacitor electrode Ce1 on a base substrate BS at least partially overlaps with an orthographic projection of an active layer of the driving transistor Td on the base substrate BS and an orthographic projection of an active layer ACT7 of the first auxiliary transistor T7 on the base substrate BS.

Optionally, an orthographic projection of the first capacitor electrode Ce1 on a base substrate BS at least partially overlaps with an orthographic projection of an active layer of the driving transistor Td on the base substrate BS, at least partially overlaps with an orthographic projection of an active layer ACT7 of the first auxiliary transistor T7 on the base substrate BS, and at least partially overlaps with an orthographic projection of a second electrode D7 of the first auxiliary transistor T7 on the base substrate BS.

Referring to FIG. 11A, FIG. 11B, FIG. 11C, FIG. 13A, and FIG. 13B, in some embodiments, an orthographic projection of the first capacitor electrode Ce1 on a base substrate BS at least partially overlaps with an orthographic projection of an active layer of the driving transistor Td on the base substrate BS and at least partially overlaps with an orthographic projection of a second electrode D8 of the second auxiliary transistor T8 on the base substrate BS.

Optionally, an orthographic projection of the first capacitor electrode Ce1 on a base substrate BS at least partially overlaps with an orthographic projection of an active layer of the driving transistor Td on the base substrate BS and at least partially overlaps with an orthographic projection of an active layer ACT8 of the second auxiliary transistor T8 on the base substrate BS.

Optionally, an orthographic projection of the first capacitor electrode Ce1 on a base substrate BS at least partially overlaps with an orthographic projection of an active layer of the driving transistor Td on the base substrate BS, at least partially overlaps with an orthographic projection of an active layer ACT8 of the second auxiliary transistor T8 on the base substrate BS, and at least partially overlaps with an orthographic projection of a second electrode D8 of the second auxiliary transistor T8 on the base substrate BS.

Figure 14:
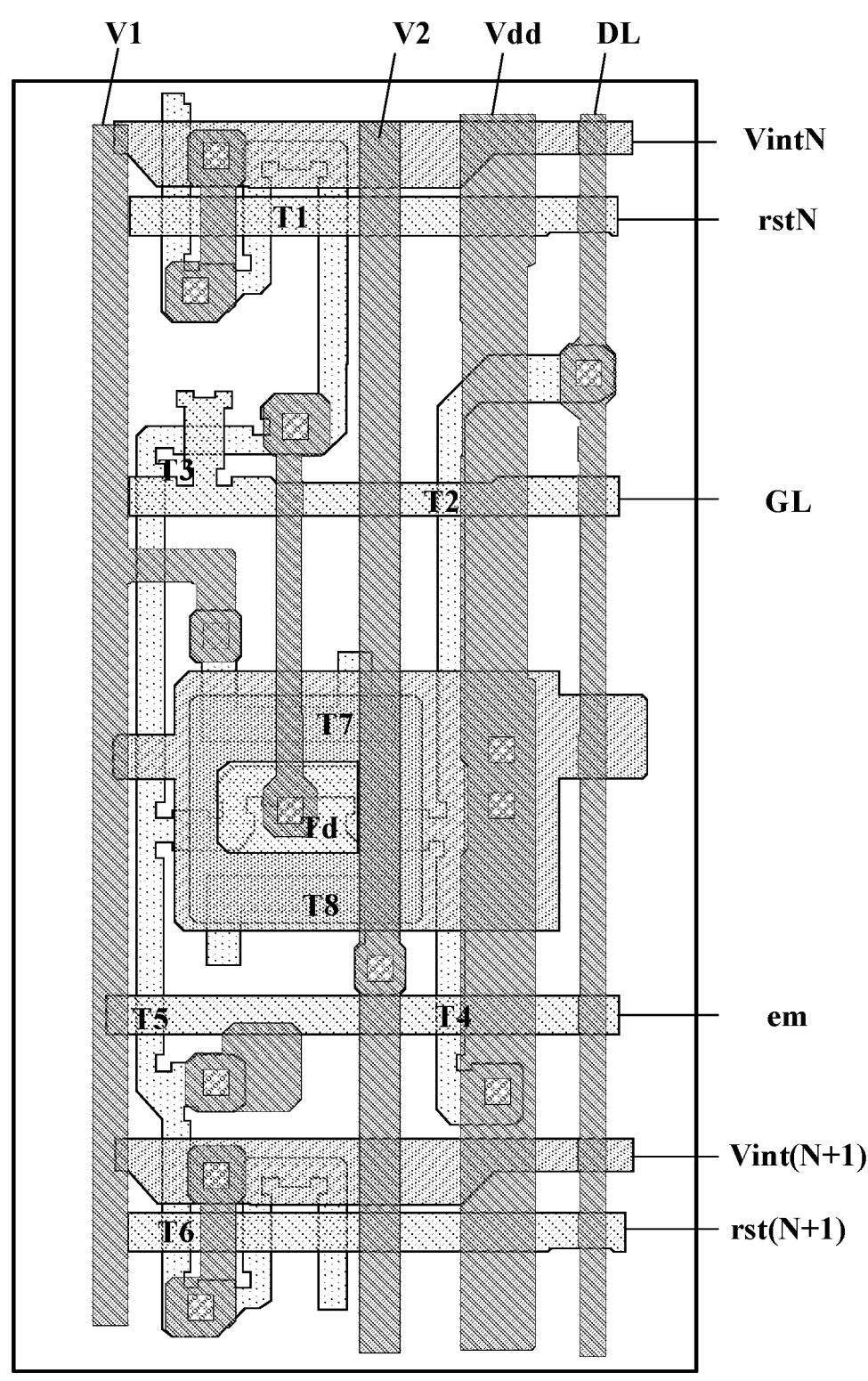
FIG. 14 is a diagram illustrating the structure of an array substrate in some embodiments according to the present disclosure.

FIG. 14 is a diagram illustrating the structure of an array substrate in some embodiments according to the present disclosure. Referring to FIG. 14, in some embodiments, an orthographic projection of the first electrode of the first auxiliary transistor T7 on a base substrate is at least partially non-overlapping with an orthographic projection of the first capacitor electrode on the base substrate. Optionally, the orthographic projection of the first electrode of the first auxiliary transistor T7 on a base substrate is at least partially non-overlapping with an orthographic projection of the second capacitor electrode on the base substrate. As compared to the structure depicted in FIG. 3A, the structure depicted in FIG. 14 is more conducive for neutralizing charges from the base substrate.

The non-overlapping portion of the first electrode of the first auxiliary transistor T7 may extend away from the first capacitor electrode/the second capacitor electrode along any appropriate direction. In one example, the non-overlapping portion of the first electrode of the first auxiliary transistor T7 extends away from the first capacitor electrode/the second capacitor electrode along a direction substantially parallel to an extension direction of the plurality of data lines DL. In another example, the non-overlapping portion of the first electrode of the first auxiliary transistor T7 extends away from the first capacitor electrode/the second capacitor electrode along a direction substantially perpendicular to the extension direction of the plurality of data lines DL.

In some embodiments, an orthographic projection of the second electrode of the first auxiliary transistor T7 on a base substrate is at least partially non-overlapping with an orthographic projection of the first capacitor electrode on the base substrate. Optionally, the orthographic projection of the second electrode of the first auxiliary transistor T7 on a base substrate is at least partially non-overlapping with an orthographic projection of the second capacitor electrode on the base substrate. As compared to the structure depicted in FIG. 3A, the structure depicted in FIG. 14 is more conducive for neutralizing charges from the base substrate.

The non-overlapping portion of the second electrode of the first auxiliary transistor T7 may extend away from the first capacitor electrode/the second capacitor electrode along any appropriate direction. In one example, the non-overlapping portion of the second electrode of the first auxiliary transistor T7 extends away from the first capacitor electrode/the second capacitor electrode along a direction substantially parallel to an extension direction of the plurality of data lines DL. In another example, the non-overlapping portion of the second electrode of the first auxiliary transistor T7 extends away from the first capacitor electrode/the second capacitor electrode along a direction substantially perpendicular to the extension direction of the plurality of data lines DL.

In some embodiments, an orthographic projection of the first electrode of the second auxiliary transistor T8 on a base substrate is at least partially non-overlapping with an orthographic projection of the first capacitor electrode on the base substrate. Optionally, the orthographic projection of the first electrode of the second auxiliary transistor T8 on a base substrate is at least partially non-overlapping with an orthographic projection of the second capacitor electrode on the base substrate. As compared to the structure depicted in FIG. 3A, the structure depicted in FIG. 14 is more conducive for neutralizing charges from the base substrate.

The non-overlapping portion of the first electrode of the second auxiliary transistor T8 may extend away from the first capacitor electrode/the second capacitor electrode along any appropriate direction. In one example, the non-overlapping portion of the first electrode of the second auxiliary transistor T8 extends away from the first capacitor electrode/the second capacitor electrode along a direction substantially parallel to an extension direction of the plurality of data lines DL. In another example, the non-overlapping portion of the first electrode of the second auxiliary transistor T8 extends away from the first capacitor electrode/the second capacitor electrode along a direction substantially perpendicular to the extension direction of the plurality of data lines DL.

In some embodiments, an orthographic projection of the second electrode of the second auxiliary transistor T8 on a base substrate is at least partially non-overlapping with an orthographic projection of the first capacitor electrode on the base substrate. Optionally, the orthographic projection of the second electrode of the second auxiliary transistor T8 on a base substrate is at least partially non-overlapping with an orthographic projection of the second capacitor electrode on the base substrate. As compared to the structure depicted in FIG. 3A, the structure depicted in FIG. 14 is more conducive for neutralizing charges from the base substrate.

The non-overlapping portion of the second electrode of the second auxiliary transistor T8 may extend away from the first capacitor electrode/the second capacitor electrode along any appropriate direction. In one example, the non-overlapping portion of the second electrode of the second auxiliary transistor T8 extends away from the first capacitor electrode/the second capacitor electrode along a direction substantially parallel to an extension direction of the plurality of data lines DL. In another example, the non-overlapping portion of the second electrode of the second auxiliary transistor T8 extends away from the first capacitor electrode/the second capacitor electrode along a direction substantially perpendicular to the extension direction of the plurality of data lines DL.

In some embodiments, the array substrate include only the first auxiliary transistor T7, but does not include a second auxiliary transistor T8.

In some embodiments, the array substrate include only the second auxiliary transistor T8, but does not include a first auxiliary transistor T7.

The first voltage signal line V1 and the second voltage signal line V2 are depicted in FIG. 10A and FIG. 10H merely for illustration purpose. The present disclosure may be implemented with various appropriate layouts of the first voltage signal line V1 and the second voltage signal line V2. In one example, the first voltage signal line V1 and/or the second voltage signal line V2 are signal lines extending across multiple subpixels in the array substrate (e.g., continuously extending across a column of subpixels in the array substrate), and are configured to receive a first voltage signal (with respect to the first voltage signal line V1) or a second voltage signal (with respect to the second voltage signal line V2).

Figure 15:
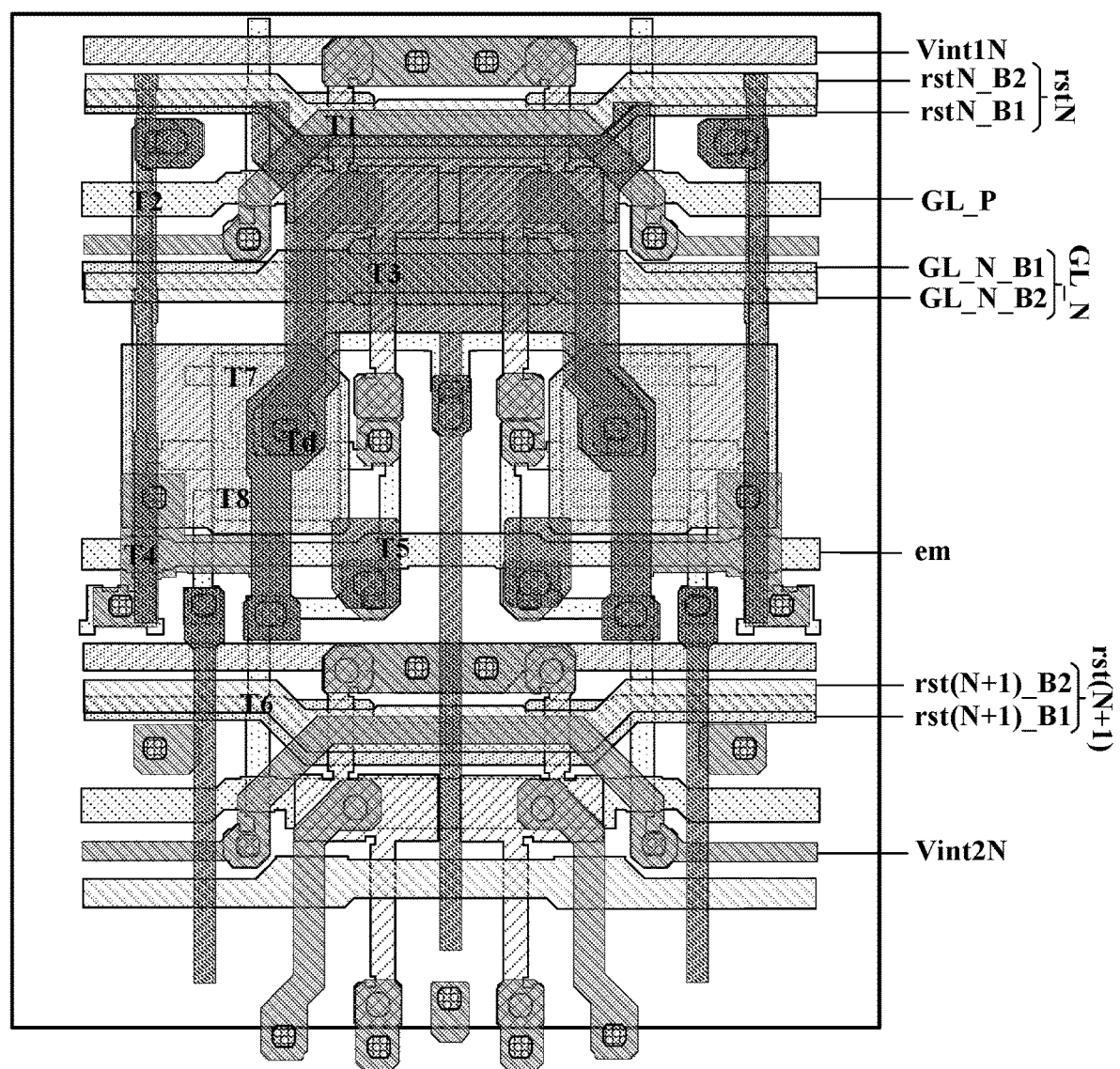
FIG. 15 is a diagram illustrating the structure of two adjacent pixel driving circuits in an array substrate in some embodiments according to the present disclosure.

FIG. 15 is a diagram illustrating the structure of two adjacent pixel driving circuits in an array substrate in some embodiments according to the present disclosure. Referring to FIG. 15, in some embodiments, the first voltage signal line V1 and a respective voltage supply line of the plurality of voltage supply line VDD are parts of a unitary structure. The first voltage signal line V1 is configured to receive a voltage supply signal from the respective voltage supply line of the plurality of voltage supply line Vdd as the first voltage signal.

Figure 16:
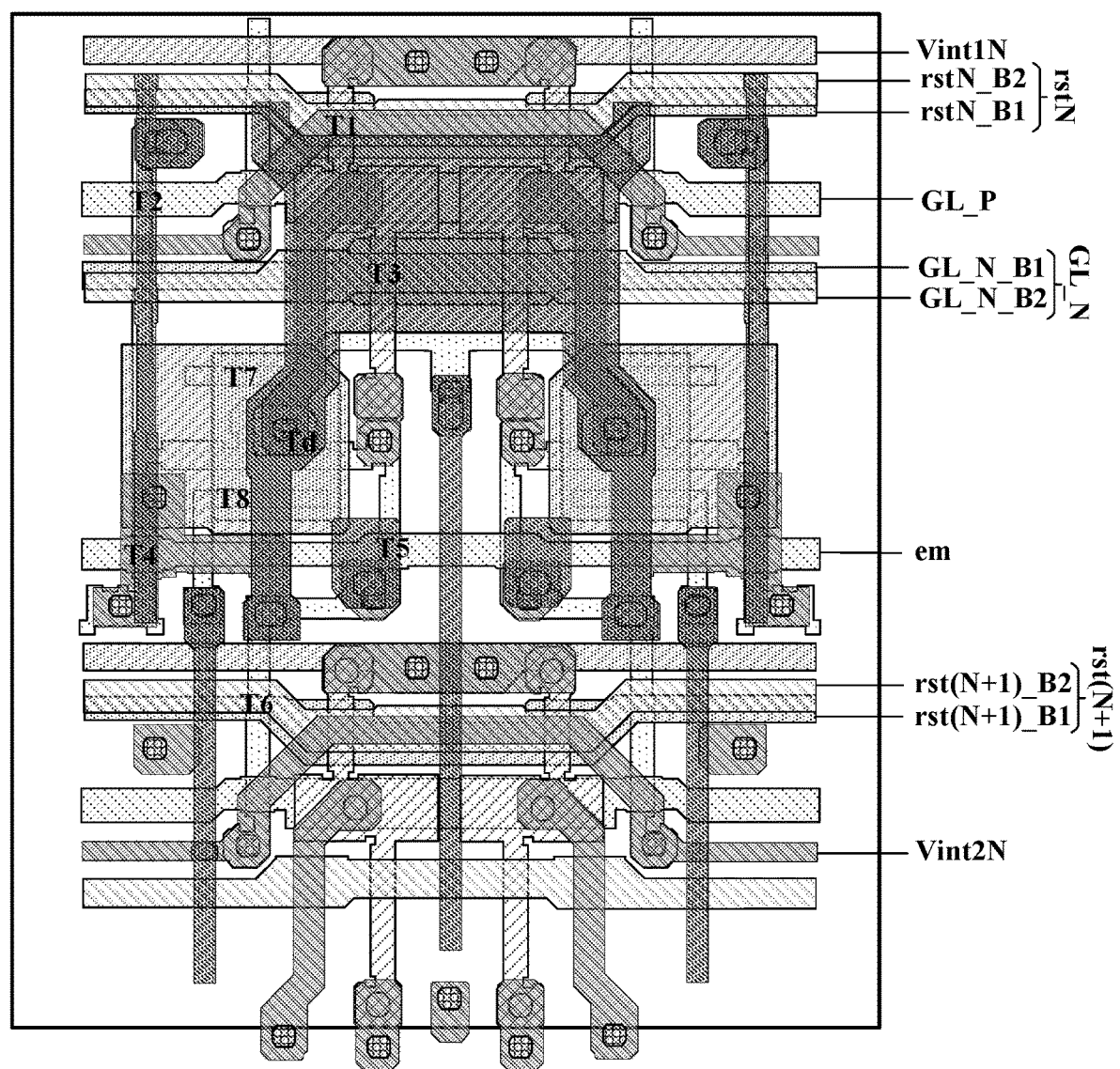
FIG. 16 is a diagram illustrating the structure of two adjacent pixel driving circuits in an array substrate in some embodiments according to the present disclosure.

FIG. 16 is a diagram illustrating the structure of two adjacent pixel driving circuits in an array substrate in some embodiments according to the present disclosure. Referring to FIG. 16, in some embodiments, the second voltage signal line V2 is electrically connected to a respective second reset signal line of a present stage Vint2N. The second voltage signal line V2 is configured to receive a reset signal from the respective second reset signal line of a present stage Vint2N as the second voltage signal.

Figure 17:
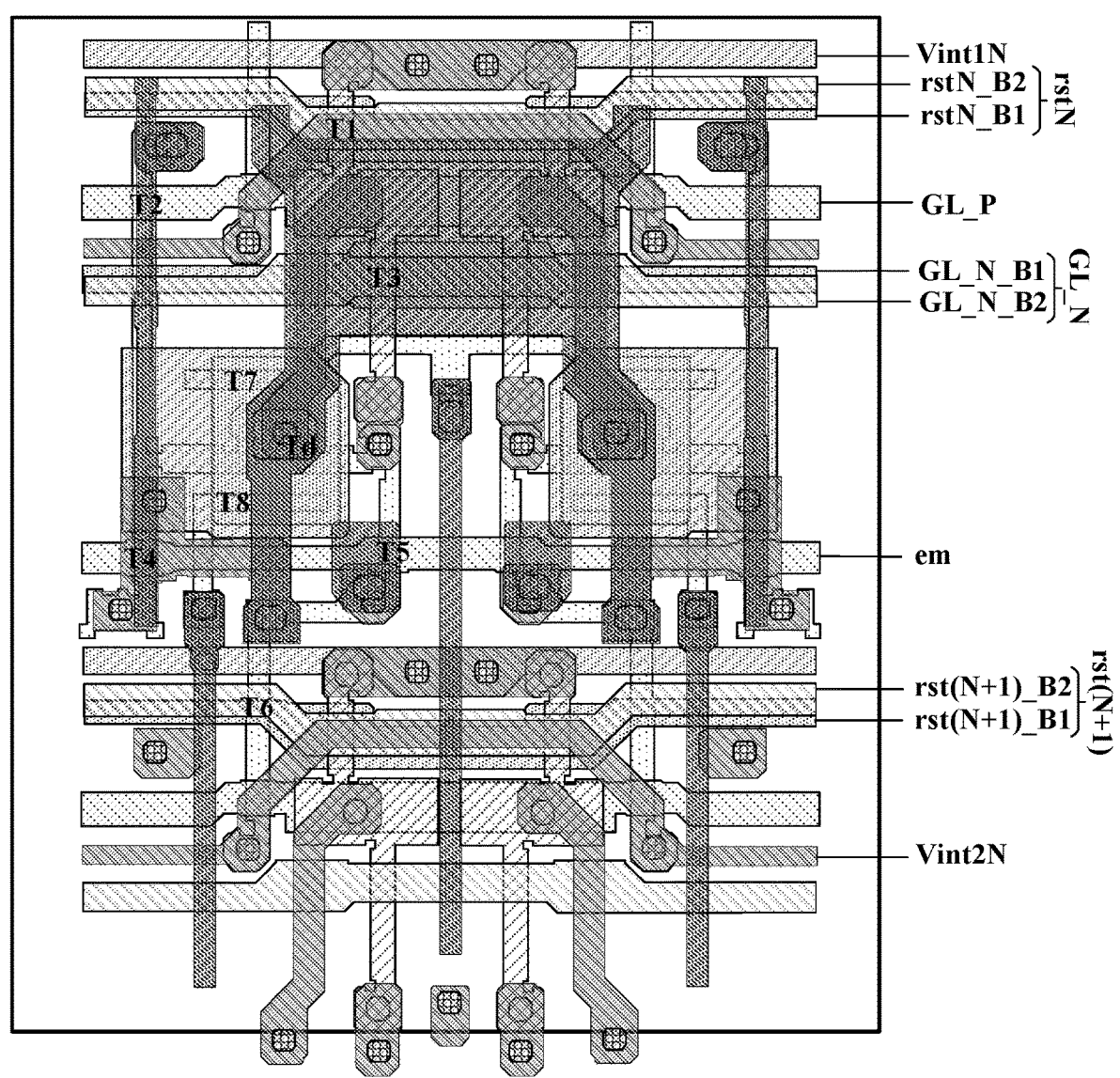
FIG. 17 is a diagram illustrating the structure of two adjacent pixel driving circuits in an array substrate in some embodiments according to the present disclosure.

FIG. 17 is a diagram illustrating the structure of two adjacent pixel driving circuits in an array substrate in some embodiments according to the present disclosure. Referring to FIG. 17, in some embodiments, the second voltage signal line V2 is electrically connected to a respective first reset signal line of a next adjacent stage (e.g., a next row). The second voltage signal line V2 is configured to receive a reset signal from the respective first reset signal line of the next adjacent stage as the second voltage signal.

In another aspect, the present disclosure further provides a display apparatus, including the array substrate described herein or fabricated by a method described herein, and one or more integrated circuits connected to the array substrate.

Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pixel driving circuit, comprising:
   a driving transistor;
   a storage capacitor; and
   at least one auxiliary transistor having a gate electrode, a first electrode, and a second electrode;
   wherein the gate electrode of the at least one auxiliary transistor is configured to receive a gate driving signal turning on the at least one auxiliary transistor during at least a light emitting sub-phase of a frame of image to allow a voltage signal to pass from the first electrode to the second electrode of the at least one auxiliary transistor; and
   the gate electrode of the at least one auxiliary transistor is coupled to a gate electrode of the driving transistor and a first capacitor electrode of the storage capacitor.

2. The pixel driving circuit of claim 1, wherein the at least one auxiliary transistor comprises a first auxiliary transistor having a first electrode configured to receive a first voltage signal during at least the light emitting sub-phase of the frame of image.

3. The pixel driving circuit of claim 2, wherein the first electrode of the first auxiliary transistor is coupled to a first voltage signal line configured to provide the first voltage signal during at least the light emitting sub-phase of the frame of image.

4. The pixel driving circuit of claim 2, wherein the first electrode of the first auxiliary transistor is coupled to a respective gate line of a plurality of gate lines.

5. The pixel driving circuit of claim 1, further comprising:
a first transistor having a gate electrode configured to receive a reset control signal, a first electrode configured to receive a reset signal, and a second electrode connected to a first capacitor electrode of the storage capacitor and a gate electrode of the driving transistor;
a second transistor having a gate electrode connected to a respective gate line of a plurality of gate lines, a first electrode connected to a respective data line of a plurality of data lines, and a second electrode connected to a first electrode of the driving transistor;
a third transistor having a gate electrode connected to the respective gate line, a first electrode connected to the first capacitor electrode of the storage capacitor and the gate electrode of the driving transistor, and a second electrode connected to a second electrode of the driving transistor;
a fourth transistor having a gate electrode connected to a respective light emitting control signal line of a plurality of light emitting control signal lines, a first electrode connected to a respective voltage supply line of a plurality of voltage supply lines, and a second electrode connected to the first electrode of the driving transistor and the second electrode of the second transistor;
a fifth transistor having a gate electrode connected to the respective light emitting control signal line, a first electrode connected to second electrodes of the driving transistor and the third transistor, and a second electrode connected to an anode of a light emitting element; and
a sixth transistor having a gate electrode configured to receive a reset control signal, a first electrode configured to receive a reset signal, and a second electrode connected to the second electrode of the fifth transistor and the anode of the light emitting element.

6. A pixel driving circuit, comprising:
a driving transistor;
a storage capacitor; and
at least one auxiliary transistor having a gate electrode, a first electrode, and a second electrode;
wherein the gate electrode of the at least one auxiliary transistor is configured to receive a gate driving signal turning on the at least one auxiliary transistor during at least a light emitting sub-phase of a frame of image to allow a voltage signal to pass from the first electrode to the second electrode of the at least one auxiliary transistor;
the at least one auxiliary transistor comprises a first auxiliary transistor having a first electrode configured to receive a first voltage signal during at least the light emitting sub-phase of the frame of image; and
the at least one auxiliary transistor further comprises a second auxiliary transistor having a first electrode configured to receive a second voltage signal during at least the light emitting sub-phase of the frame of image.

7. The pixel driving circuit of claim 6, wherein the first electrode of the second auxiliary transistor is coupled to a second voltage signal line configured to provide the second voltage signal during at least the light emitting sub-phase of the frame of image.

8. The pixel driving circuit of claim 6, wherein the first electrode of the second auxiliary transistor is coupled to a light emitting control signal line of a plurality of light emitting control signal lines.

9. The pixel driving circuit of claim 6, wherein one of the first voltage signal and the second voltage signal is a high voltage signal, and the other of the first voltage signal and the second voltage signal is a low voltage signal.

10. An array substrate, comprising a pixel driving circuit, and a light emitting element connected to the pixel driving circuit,
wherein the pixel driving circuit comprises:
a driving transistor;
a storage capacitor; and
at least one auxiliary transistor having a gate electrode, a first electrode, and a second electrode;
wherein the gate electrode of the at least one auxiliary transistor is configured to receive a gate driving signal turning on the at least one auxiliary transistor during at least a light emitting sub-phase of a frame of image to allow a voltage signal to pass from the first electrode to the second electrode of the at least one auxiliary transistor.

11. The array substrate of claim 10, wherein the at least one auxiliary transistor comprises a first auxiliary transistor;
wherein an orthographic projection of a first capacitor electrode of the storage capacitor on a base substrate at least partially overlaps with an orthographic projection of a second electrode of the first auxiliary transistor on the base substrate.

12. The array substrate of claim 10, wherein the at least one auxiliary transistor comprises a first auxiliary transistor; and
an orthographic projection of a first capacitor electrode of the storage capacitor on a base substrate at least partially overlaps with an orthographic projection of an active layer of the first auxiliary transistor on the base substrate.

13. The array substrate of claim 10, wherein the at least one auxiliary transistor comprises a first auxiliary transistor; and
an orthographic projection of a first capacitor electrode of the storage capacitor on a base substrate at least partially overlaps with an orthographic projection of an active layer of the driving transistor on the base substrate and at least partially overlaps with an orthographic projection of a second electrode of the first auxiliary transistor on the base substrate.

14. The array substrate of claim 10, wherein the at least one auxiliary transistor comprises a second auxiliary transistor; and
an orthographic projection of a first capacitor electrode of the storage capacitor on a base substrate at least partially overlaps with an orthographic projection of a second electrode of the second auxiliary transistor on the base substrate.

15. The array substrate of claim 10, wherein the at least one auxiliary transistor comprises a second auxiliary transistor; and
an orthographic projection of a first capacitor electrode of the storage capacitor on a base substrate at least partially overlaps with an orthographic projection of an active layer of the second auxiliary transistor on the base substrate.

16. The array substrate of claim 10, wherein the at least one auxiliary transistor comprises a second auxiliary transistor; and an orthographic projection of a first capacitor electrode of the storage capacitor on a base substrate at least partially overlaps with an orthographic projection of an active layer of the driving transistor on the base substrate and at least partially overlaps with an orthographic projection of a second electrode of the second auxiliary transistor on the base substrate.

17. The array substrate of claim 10, further comprising a plurality of gate lines and a first connecting line in a layer different from a layer comprising the plurality of gate lines;

wherein the at least one auxiliary transistor comprises a first auxiliary transistor;

a respective gate line of the plurality of gate lines comprises a first main portion extending along an extension direction of the respective gate line, and a first connecting pad protruding away from the first main portion; and the first connecting line is connected to the first connecting pad through a ninth via, and connected to a first electrode of the first auxiliary transistor through a tenth via.

18. The array substrate of claim 10, further comprising a plurality of light emitting control signal lines and a second connecting line in a layer different from a layer comprising the plurality of light emitting control signal lines;

wherein the at least one auxiliary transistor comprises a second auxiliary transistor;

a respective light emitting control signal line of the plurality of light emitting control signal lines comprises a second main portion extending along an extension direction of the respective light emitting control signal line, and a second connecting pad protruding away from the second main portion; and the second connecting line is connected to the second connecting pad through an eleventh via, and connected to a first electrode of the second auxiliary transistor through a twelfth via.

19. A display apparatus, comprising the array substrate of claim 10, and an integrated circuit connected to the array substrate.

\* \* \* \* \*